(12) United States Patent
Ema et al.

(10) Patent No.: US 10,354,953 B2
(45) Date of Patent: Jul. 16, 2019

(54) SEMICONDUCTOR DEVICE

(71) Applicant: MIE FUJITSU SEMICONDUCTOR LIMITED, Kuwana-shi, Mie (JP)

(72) Inventors: Taiji Ema, Inabe (JP); Makoto Yasuda, Kuwana (JP); Kazuhiro Mizutani, Kuwana (JP)

(73) Assignee: MIE FUJITSU SEMICONDUCTOR LIMITED, Kuwana (JP)

( * ) Notice: Subject to any disclaimer, the term of this patent is extended or adjusted under 35 U.S.C. 154(b) by 0 days.

(21) Appl. No.: 15/994,284

(22) Filed: May 31, 2018

(65) Prior Publication Data
US 2018/0277478 A1   Sep. 27, 2018

Related U.S. Application Data

(62) Division of application No. 15/647,946, filed on Jul. 12, 2017, now Pat. No. 10,014,254, which is a
(Continued)

(30) Foreign Application Priority Data

Mar. 26, 2015  (JP) ................. 2015-064027
Feb. 2, 2016   (JP) ................. 2016-017827

(51) Int. Cl.
*H01L 21/8238*   (2006.01)
*H01L 23/528*    (2006.01)
(Continued)

(52) U.S. Cl.
CPC ...... *H01L 23/528* (2013.01); *H01L 27/11573* (2013.01); *H01L 29/42348* (2013.01);
(Continued)

(58) Field of Classification Search
CPC ............. H01L 29/808; H01L 29/1066; H01L 29/7835; H01L 29/0847; H01L 27/10805; H01L 27/105; H01L 27/1203
(Continued)

(56) References Cited

U.S. PATENT DOCUMENTS 5,838,041 A   11/1998  Sakagami et al.
6,211,003 B1   4/2001  Taniguchi et al.
(Continued)

FOREIGN PATENT DOCUMENTS

JP   63-153865 A   6/1988
JP    9-97849 A    4/1997
(Continued)

OTHER PUBLICATIONS

Non-Final Office Action dated Aug. 3, 2017, issued in U.S. Appl. No. 15/647,946 (19 pages).
(Continued)

*Primary Examiner* — Hsien Ming Lee
(74) *Attorney, Agent, or Firm* — Westerman, Hattori, Daniels & Adrian, LLP

(57) ABSTRACT

There is provided a semiconductor device including a memory region and a logic region. The memory region includes a transistor (memory transistor) that stores information by accumulating charge in a sidewall insulating film. The width of the sidewall insulating film of the memory transistor included in the memory region is made larger than the width of a sidewall insulating film of a transistor (logic transistor) included in the logic region.

10 Claims, 72 Drawing Sheets

Related U.S. Application Data division of application No. 15/066,309, filed on Mar. 10, 2016, now Pat. No. 9,773,733.

(51) Int. Cl.
*H01L 27/11573* (2017.01)
*H01L 29/423* (2006.01)
*H01L 29/792* (2006.01)
*H01L 21/8234* (2006.01)
*H01L 27/088* (2006.01)

(52) U.S. Cl.
CPC .... *H01L 29/792* (2013.01); *H01L 21/823412* (2013.01); *H01L 21/823418* (2013.01); *H01L 21/823462* (2013.01); *H01L 21/823493* (2013.01); *H01L 27/088* (2013.01)

(58) Field of Classification Search
USPC ............... 438/199, 207, 218, 222, 223, 226, 438/230–232; 257/287, 297, 343, 349
See application file for complete search history.

(56) References Cited

U.S. PATENT DOCUMENTS

| | | | |
|---|---|---|---|
| 6,566,719 | B1 | 5/2003 | Asakura |
| 7,187,594 | B2 | 3/2007 | Shibata et al. |
| 7,915,686 | B2 * | 3/2011 | Shimamoto ....... H01L 21/28202 257/369 |
| 8,124,477 | B2 | 2/2012 | Orita et al. |
| 8,294,217 | B2 * | 10/2012 | Ema ..................... H01L 21/761 257/368 |
| 8,981,453 | B2 | 3/2015 | Cha |
| 9,196,727 | B2 | 11/2015 | Thompson et al. |
| 9,299,801 | B1 | 3/2016 | Bakhishev et al. |
| 2003/0222303 | A1 | 12/2003 | Fukuda et al. |
| 2008/0062745 | A1 | 3/2008 | Noda |
| 2008/0128791 | A1 | 6/2008 | Lee et al. |
| 2008/0237730 | A1 | 10/2008 | Saeki et al. |
| 2009/0027942 | A1 | 1/2009 | Chen et al. |
| 2009/0231921 | A1 | 9/2009 | Kimura et al. |
| 2010/0059812 | A1 | 3/2010 | Park |
| 2010/0202326 | A1 | 8/2010 | Rofougaran et al. |
| 2011/0292735 | A1 | 12/2011 | Oyama |
| 2012/0058613 | A1 | 3/2012 | Oh et al. |
| 2012/0083087 | A1 * | 4/2012 | Ema ................ H01L 21/823807 438/289 |
| 2012/0202326 | A1 | 8/2012 | Kronholz |
| 2013/0149854 | A1 | 6/2013 | Ishii et al. |
| 2014/0138758 | A1 | 5/2014 | Uozaki et al. |

FOREIGN PATENT DOCUMENTS

| | | |
|---|---|---|
| JP | 9-252059 A | 9/1997 |
| JP | 2000-4014 A | 1/2000 |
| JP | 2001-85533 A | 3/2001 |
| JP | 2004-342889 A | 12/2004 |
| JP | 2007-227585 A | 9/2007 |
| JP | 2008-244097 A | 10/2008 |
| JP | 2013-98192 A | 5/2013 |
| JP | 2014-7275 A | 1/2014 |
| JP | 2014-103204 A | 6/2014 |

OTHER PUBLICATIONS

Office Action dated Oct. 12, 2018, issued in counterpart German Application No. 10 2016 204 825.2, with English translation (18 pages).

Office Action dated May 31, 2018, issued in counterpart Chinese Application No. 201610182618.3, with English translation. (19 pages).

Office Action dated Jun. 4, 2019, issued in counterpart JP Application No. 2016-017827, with English machine translation. (18 pages).

* cited by examiner

SEMICONDUCTOR DEVICE

CROSS-REFERENCE TO RELATED APPLICATIONS

This application is a divisional of U.S. application Ser. No. 15/647,946 filed on Jul. 12, 2017, which is a divisional of U.S. application Ser. No. 15/066,309 filed on Mar. 10, 2016 and issued as U.S. Pat. No. 9,773,733 on Sep. 26, 2017, which is based upon and claims the benefit of priority of the prior Japanese Patent Application No. 2015-064027, filed on Mar. 26, 2015, and the Japanese Patent Application No. 2016-017827, filed on Feb. 2, 2016, the entire contents of which are incorporated herein by reference.

FIELD

The embodiments discussed herein relate to semiconductor devices.

BACKGROUND

One of the semiconductor devices is a nonvolatile memory. For example, there is known a nonvolatile memory that includes, as a memory transistor, a MOS (Metal Oxide Semiconductor) type field effect transistor storing information by accumulating charges (hot carriers) in the sidewall insulating film of a gate electrode sidewall.

For such a nonvolatile memory, there is known a technique of increasing the thickness of the sidewall insulating film of a transistor included in a circuit section in the periphery of a memory section including a memory transistor so as to reduce the injection efficiency of hot carriers of the former transistor.

See, for example, US Patent Application Publication No. 2008/0062745, Japanese Laid-open Patent Publication No. 2008-244097, and Japanese Laid-open Patent Publication No. 09-252059.

In a nonvolatile memory provided with a memory transistor group storing information by accumulating hot carriers in a sidewall insulating film, the programming speed of the entire nonvolatile memory depends on the programming speed of the individual memory transistor. If the programming speed of the individual memory transistor is not sufficient, then depending on the capacitance of a nonvolatile memory, a predetermined programming might not be able to be performed within a time period allowed on a system including the nonvolatile memory.

SUMMARY

According to an aspect, there is provided a semiconductor device including a memory region and a logic region, in which the memory region includes a first transistor including: a first gate insulating film provided above a semiconductor substrate; a first gate electrode provided above the first gate insulating film; a first sidewall insulating film provided on a sidewall of the first gate electrode and above the semiconductor substrate; and a first source region and a first drain region provided in the semiconductor substrate on both sides of the first gate electrode, respectively, the first transistor storing information by accumulating charge in the first sidewall insulating film, and in which the logic region includes a second transistor including: a second gate insulating film provided above the semiconductor substrate; a second gate electrode provided above the second gate insulating film; a second sidewall insulating film provided on a sidewall of the second gate electrode and above the semiconductor substrate; and a second source region and second drain region provided in the semiconductor substrate on both sides of the second gate electrode, respectively, and in which the width of the first sidewall insulating film is larger than the width of the second sidewall insulating film.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
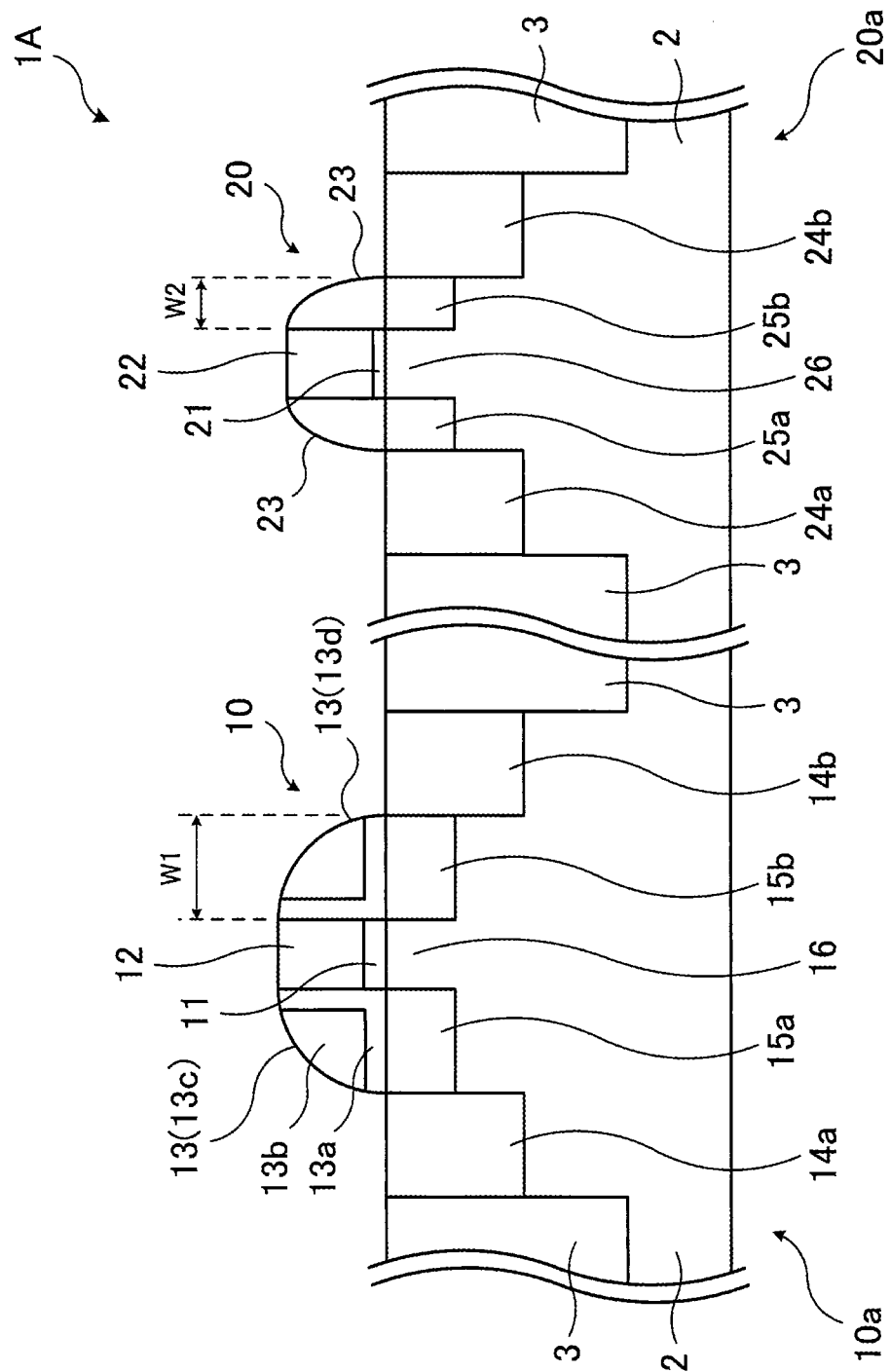
FIG. 1 illustrates an example of a semiconductor device according to a first embodiment.

Several embodiments will be described below with reference to the accompanying drawings, wherein like reference numerals refer to like elements throughout.

First, a first embodiment will be described.

FIG. 1 illustrates an example of a semiconductor device according to the first embodiment. FIG. 1 schematically illustrates an exemplary cross section of a main part of the semiconductor device according to the first embodiment.

A semiconductor device 1A illustrated in FIG. 1 is an example of the nonvolatile memory, and includes a transistor (memory transistor) 10 provided in a memory region 10a and a transistor (logic transistor) 20 provided in a logic region 20a. The memory transistor 10 and the logic transistor 20 are formed (mixedly mounted) on a p-type or n-type common semiconductor substrate 2. Various types of semiconductor substrates, such as a silicon (Si) substrate or a silicon germanium (SiGe) substrate, may be used for the semiconductor substrate 2. A region (element region) in which the memory transistor 10 is formed and a region (element region) in which the logic transistor 20 is formed are defined by an element isolating region 3 that is formed in the semiconductor substrate 2 using STI (Shallow Trench Isolation), thermal oxidation, or the like.

Note that, although one memory transistor 10 is illustrated in FIG. 1, the memory region 10a of the semiconductor device 1A may include a plurality of memory transistors 10, or include at least one memory transistor 10 and another memory transistor. Although one logic transistor 20 is illustrated in FIG. 1, the logic region 20a of the semiconductor device 1A may include a plurality of logic transistors 20, or at least one logic transistor 20 and another logic transistor.

As illustrated in FIG. 1, the memory transistor 10 includes a gate insulating film 11 provided above the semiconductor substrate 2, a gate electrode 12 provided above the gate insulating film 11, and a sidewall insulating film 13 provided on the sidewall of the gate electrode 12 and above the semiconductor substrate 2. The memory transistor 10 further includes an impurity region 14a and an impurity region 14b that are provided in the semiconductor substrate 2 on both sides (both sides in the gate length direction) of the gate electrode 12, respectively, and function as a source region or drain region. The memory transistor 10 may also include an LDD (Lightly Doped Drain) region 15a and an LDD region 15b on the inner side of the impurity region 14a and the impurity region 14b which function as the source region or drain region in the semiconductor substrate 2 below the sidewall insulating film 13.

Here, various types of insulating materials, such as silicon oxide ($SiO_2$), silicon nitride ($Si_3N_4$), and hafnium oxide ($HfO_2$), may be used for the gate insulating film 11. The film thickness of the gate insulating film 11 is set, for example, based on the threshold voltage set for the memory transistor 10.

Metals, such as titanium (Ti), tungsten (W), and the nitrides thereof, other than polysilicon, may be used for the gate electrode 12.

The sidewall insulating film 13 includes a stacked structure of an oxide film 13a and a nitride film 13b that are insulating films, for example. Silicon oxide is used for the oxide film 13a, for example. Silicon nitride is used for the nitride film 13b, for example. For example, the oxide film 13a is provided so as to have an L-shaped cross section, on the sidewall of the gate electrode 12 and on the semiconductor substrate 2, and the nitride film 13b is provided on the oxide film 13a. Although the sidewall insulating film 13 having a two-layer structure of the oxide film 13a and nitride film 13b is illustrated in FIG. 1, the sidewall insulating film 13 may be made to have a three-layer structure obtained by further providing an oxide film above the oxide film having an L-shaped cross section and the nitride film, or may be made to have a stacked structure of four or more layers of insulating films. Other than this, it is also possible to make the sidewall insulating film 43 have a single-layer structure of an oxide film or nitride film. The sidewall insulating film 13 is provided so that a width (thickness) W1 in the gate length direction of the gate electrode 12 (in the plane direction of the semiconductor substrate 2) is set to be larger than a width (thickness) W2 of a sidewall insulating film 23 (to be described later) of the logic transistor 20.

The impurity region 14a and impurity region 14b contain a predetermined concentration of the impurity of a predetermined conductivity type, i.e., an n-type impurity, such as phosphorus (P) or arsenic (As), or a P-type impurity, such as boron (B).

The LDD region 15a and LDD region 15b contain the impurity of the same conductivity type as the conductivity type of the impurity contained in the impurity region 14a and impurity region 14b, in a lower concentration than the impurity region 14a and impurity region 14b.

In the memory transistor 10, a region between the impurity region 14a and the impurity region 14b (or between the LDD region 15a and the LDD region 15b) below the gate electrode 12 functions as a channel region 16 in which a carrier (electron or hole) moves.

The memory transistor 10 is a nonvolatile memory transistor that stores information by accumulating charges (electrons or the holes) in the sidewall insulating film 13. In the memory transistor 10 with the sidewall insulating film 13 including a stacked structure of the oxide film 13a and nitride film 13b, the charge is accumulated mainly in the nitride film 13b. The nitride film 13b of silicon nitride or the like has a charge trap level, while the oxide film 13a of silicon oxide or the like suppresses the scattering of charges accumulated in the nitride film 13b.

As illustrated in FIG. 1, the logic transistor 20 includes a gate insulating film 21 provided above the semiconductor substrate 2, a gate electrode 22 provided above the gate insulating film 21, and a sidewall insulating film 23 provided on the sidewall of the gate electrode 22 and above the semiconductor substrate 2. The logic transistor 20 further includes an impurity region 24a and an impurity region 24b which are provided in the semiconductor substrate 2 on both sides (both sides in the gate length direction) of the gate electrode 22, respectively, and which function as a source region or drain region. The logic transistor 20 may also include an LDD region 25a and an LDD region 25b on the inner side of the impurity region 24a and impurity region 24b which function as the source region or drain region in the semiconductor substrate 2 below the sidewall insulating film 23.

Here, various types of insulating materials, such as silicon oxide, silicon nitride, and hafnium oxide, may be used for the gate insulating film 21. The film thickness of the gate insulating film 21 is set, for example, based on the threshold voltage set for the logic transistor 20.

Metals, such as titanium, and the nitrides thereof other than polysilicon, may be used for the gate electrode 22.

The sidewall insulating film 23 includes an oxide film of silicon oxide or the like, or a nitride film of silicon nitride or the like. The sidewall insulating film 23 does not necessarily need to include a stacked structure of an oxide film and a nitride film, and therefore may be made to have a single-layer structure of an insulating film, such as an oxide film or a nitride film. The sidewall insulating film 23 is provided so that the width (thickness) W2 in the gate length direction of the gate electrode 22 (in the plane direction of the semiconductor substrate 2) is set to be smaller than the width W1 of the sidewall insulating film 13 of the memory transistor 10.

The impurity region 24a and impurity region 24b contain an impurity of an n-type or p-type conductivity, in a predetermined concentration.

The LDD region 25a and LDD region 25b contain the impurity of the same conductivity type as the conductivity type of the impurity contained in the impurity region 24a and impurity region 24b, in a lower concentration than the impurity region 24a and impurity region 24b.

In the logic transistor 20, a region between the impurity region 24a and the impurity region 24b (or between the LDD region 25a and the LDD region 25b) below the gate electrode 22 functions as a channel region 26 in which a carrier (electron or hole) moves.

The logic transistor 20 of the logic region 20a is used, for example, in order to perform programming (write-in) and reading (read-out) operations on the memory transistor 10 of the memory region 10a.

Each of the programming and reading operations of the memory transistor 10 is performed as follows.

First, the programming operation is performed by setting each node of the gate electrode 12, impurity region 14a, impurity region 14b, and semiconductor substrate 2 to a predetermined potential to generate hot carriers, and injecting the generated hot carriers into the sidewall insulating film 13 for accumulation (retention).

Now, assume that the memory transistor 10 is of an n-channel type, the semiconductor substrate 2 (channel region 16 during non-operation) is of a p-type, and the impurity region 14a and impurity region 14b (the LDD region 15a and LDD region 15b) are of an n-type.

If electrons are injected into the sidewall insulating film 13 (13d) on the impurity region 14b side, the impurity region 14a (source) and the semiconductor substrate 2 are grounded and a positive voltage is applied to the gate electrode 12 and the impurity region 14b (drain), for example. Alternatively, a negative voltage may be applied to the semiconductor substrate 2. If these potentials are adjusted in this manner, then in the n-channel memory transistor 10, an inversion layer (not illustrated) is formed in the channel region 16 and thus electrons flow through the channel region 16 from the impurity region 14a toward the impurity region 14b. The electrons flowing through the channel region 16 toward the impurity region 14b become in a high energy state in a vicinity of the impurity region 14b due to the electric field caused by the positive voltage applied to the impurity region 14b, thereby generating hot electrons. The hot electrons generated in the vicinity of the impurity region 14b are injected and accumulated into the sidewall insulating film 13d on the impurity region 14b side by the electric field caused by the positive voltage applied to the gate electrode 12.

The reading operation in the n-channel memory transistor 10 is performed by grounding the impurity region 14b (source) and semiconductor substrate 2 and applying a positive voltage to the gate electrode 12 and the impurity region 14a (drain), for example. If electrons are already injected and accumulated into the sidewall insulating film 13d on the impurity region 14b side, positive charges are induced to a region, e.g., the LDD region 15b, below the sidewall insulating film 13 to increase the resistance of the LDD region 15b. Therefore, the electric current flowing from the impurity region 14a to the impurity region 14b will decrease. If electrons are not yet injected and accumulated into the sidewall insulating film 13d on the impurity region 14b side, the resistance of a region, e.g., the LDD region 15b, below the sidewall insulating film 13 will not increase and thus the electric current flowing from the impurity region 14a to the impurity region 14b will not decrease either. As described above, depending on the electric current flowing from the impurity region 14a to the impurity region 14b, the presence or absence (information of "0" or "1") of electrons of the sidewall insulating film 13d is read out.

When the programming operation is performed for injecting electrons into the sidewall insulating film 13 (13c) on the impurity region 14a side, the voltages (source and drain voltages) applied to the impurity region 14a and impurity region 14b may be switched from the voltages applied during the above-described programming operation. Moreover, similarly when the reading operation is performed for reading out the presence or absence of electrons of the sidewall insulating film 13c, the voltages (source and drain voltages) applied to the impurity region 14a and impurity region 14b may be switched from the voltages applied during the above-described reading operation.

The memory transistor 10 is used as a memory cell for storing 2-bit information depending on the presence or absence of injected electrons of each of the sidewall insulating film 13c and the sidewall insulating film 13d.

When the memory transistor 10 is set to a p-channel type, the semiconductor substrate 2 (channel region 16 during non-operation) is set to an n-type and the impurity region 14a and impurity region 14b (the LDD region 15a and LDD region 15b) are set to p-types.

In the p-channel memory transistor 10, holes are injected and accumulated into the sidewall insulating film 13, for example, by applying to each node a voltage having the opposite sign of the voltage that is applied during the above-described programming operation. In the p-channel memory transistor 10, the presence or absence of holes in the sidewall insulating film 13 is read out by applying to each node a voltage having the opposite sign of the voltage that is applied during the above-described reading operation, for example.

Next, the sidewall insulating film 13 and sidewall insulating film 23 of the above-described memory transistor 10 and logic transistor 20 are described.

Figure 2:
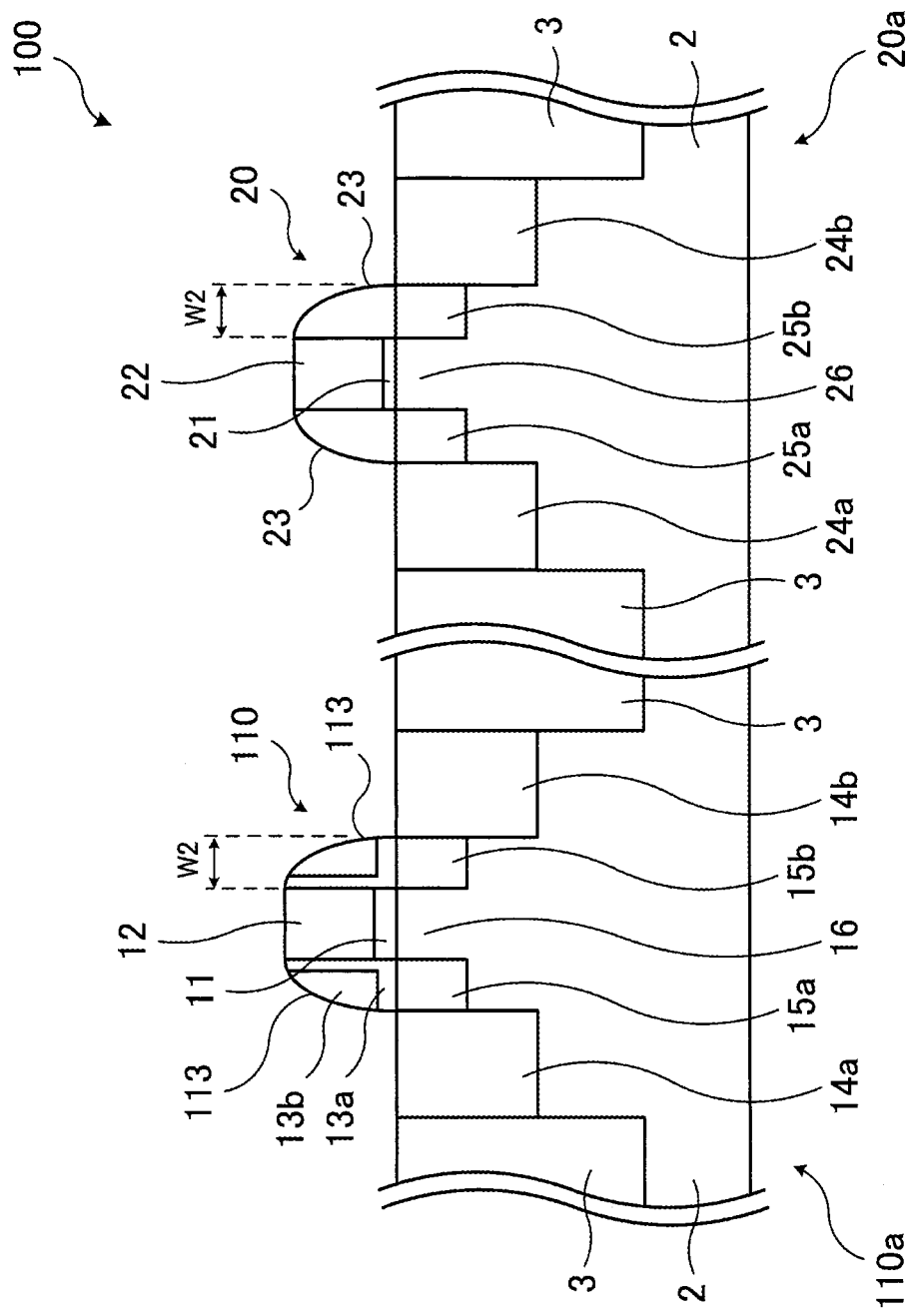
FIG. 2 illustrates an example of a semiconductor device according to another embodiment.

First, for comparison, an example of a semiconductor device according to another embodiment is illustrated in FIG. 2, in which the width of the sidewall insulating film of the memory transistor is made equal to the width of the sidewall insulating film of the logic transistor.

A semiconductor device 100 illustrated in FIG. 2 differs from the semiconductor device 1A according to the first embodiment illustrated in the above FIG. 1, in that the semiconductor device 100 includes a memory transistor 110 provided with a sidewall insulating film 113 having the same width W2 as the sidewall insulating film 23 of the logic transistor 20.

The LDD region 15a and LDD region 15b have an effect of suppressing a variation in the generation of hot carriers and the injection of hot carriers into sidewall insulating film 13 (13c, 13d) during the programming operation, thereby achieving a small variation in the programming speed. Also in the semiconductor device 100 illustrated in FIG. 2, the provision of the LDD region 15a and LDD region 15b achieves a small variation in the programming speed as compared with the case where these LDD region 15a and LDD region 15b are not provided. However, even if such LDD region 15a and LDD region 15b are provided, a sufficient programming speed needed for the semiconductor device 100 is sometimes not obtained. When the memory capacity in a memory region 110a (nonvolatile memory) including a plurality of memory transistors 110 is relatively small, the programming time as a whole falls within an acceptable level even if the programming speed of the individual memory transistor 110 (memory cell) is relatively slow. However, when the memory capacity becomes relatively large, the programming time as a whole sometimes does not fall within the acceptable level.

One of the techniques for increasing the programming speed is a technique for generating more hot carriers. To this end, the electric field below the sidewall insulating film 13 may be increased and the impurity concentration of the channel region 16 may be increased. However, if the impurity concentration of the channel region 16 is increased in this manner, inconveniently the threshold voltage of the memory transistor 110 will increase and the read current will decrease.

On the other hand, in the semiconductor device 1A illustrated in the above FIG. 1, the width W1 of the sidewall insulating film 13 of the memory transistor 10 is set to be larger than the width W2 of the sidewall insulating film 23 of the logic transistor 20. Accordingly, a variation of the resistance in the region below the sidewall insulating film 13 when hot carriers are injected into the sidewall insulating film 13 will easily occur, so that an improvement in the programming speed will be achieved.

Figure 3A:
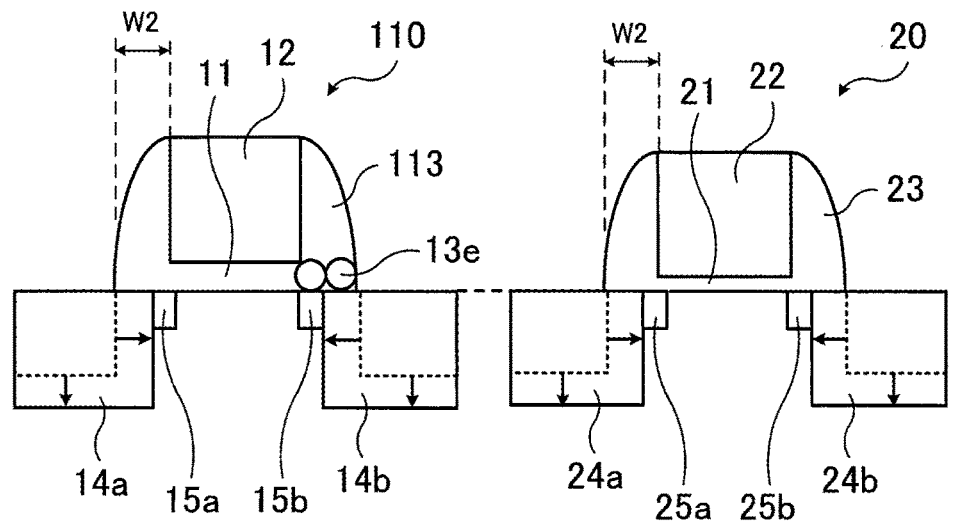
FIGS. 3A and 3B are explanatory views of charge injection into a sidewall insulating film of a memory transistor.
Figure 3B:
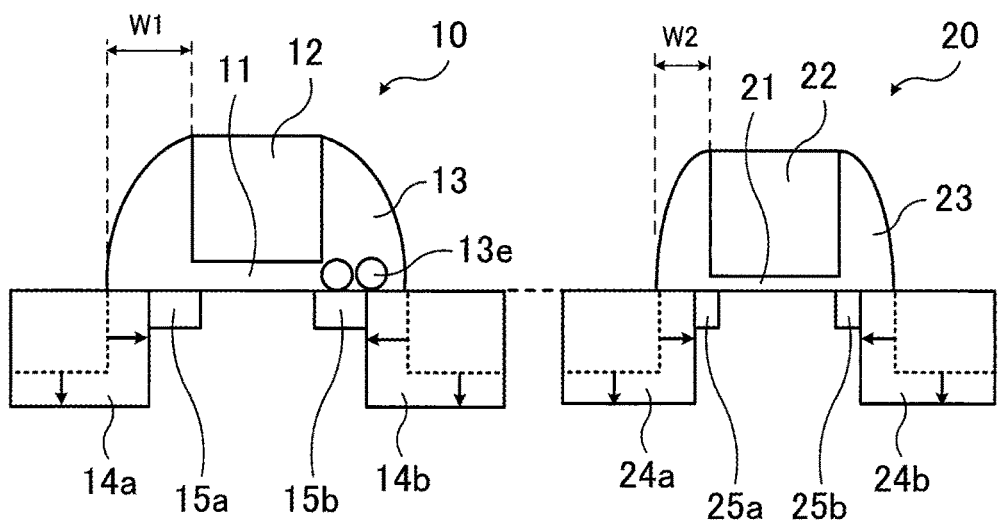

FIGS. 3A and 3B are explanatory views of charge injection into the sidewall insulating film of the memory transistor. FIG. 3A illustrates an example of the charge injection into the relatively narrow sidewall insulating film, while FIG. 3B illustrates an example of the charge injection into the relatively wide sidewall insulating film. That is, FIG. 3A corresponds to an example of the charge injection into the sidewall insulating film 113 of the memory transistor 110 illustrated in the above FIG. 2. FIG. 3B corresponds to an example of the charge injection into the sidewall insulating film 13 of the memory transistor 10 illustrated in the above FIG. 1.

In FIG. 3A, the impurity regions 14a, 14b and impurity regions 24a, 24b which are high-concentration source/drain diffusion layers are formed by impurity ion implantation after formation of the sidewall insulating film 113 and sidewall insulating film 23. Subsequent activation annealing laterally diffuses the impurities to below the sidewall insulating film 113 and sidewall insulating film 23. The width W2 of the sidewall insulating film 23 of the logic transistor 20 is set so that the impurity regions 24a, 24b will laterally diffuse but not to reach below the gate electrode 22. If the width W2 of the sidewall insulating film 23 is larger than needed, a parasitic resistance will increase and the performance will degrade. On the other hand, if the width of the sidewall insulating film 113 of the memory transistor 110 is set to the same as the width W2 of the sidewall insulating film 23 of the logic transistor 20, the impurity concentration below the sidewall insulating film 113 will become higher than needed due to the lateral diffusion of the impurity regions 14a, 14b and thus will be hardly affected by charges 13e accumulated in the sidewall insulating film 113. As a result, more charges 13e need to be injected into the sidewall insulating film 113 and thus it will take a longer time to program.

In contrast, in FIG. 3B, the width of the sidewall insulating film 13 of the memory transistor 10 is set to the width W1 larger than the width W2 of the sidewall insulating film 23 of the logic transistor 20. Accordingly, even if impurities of the impurity regions 14a, 14b that are formed by ion implantation after formation of the sidewall insulating film 13 laterally diffuse, the LDD regions 15a, 15b will be present having a sufficiently large width below the sidewall insulating film 13. As a result, a change in resistance when the charge 13e is injected into the sidewall insulating film 13 will increase even if the charge amount is the same, so that the programming time will be reduced.

The same is true of both the injection of electrons and the injection of holes into the sidewall insulating film 113 and the sidewall insulating film 13.

The width W1 of the sidewall insulating film 13 of the memory transistor 10 is set to be larger than the width W2 of the sidewall insulating film 23 of the logic transistor 20 that is mixedly mounted in the semiconductor substrate 2 together with the memory transistor 10.

A wider width of the sidewall insulating film 13 is better from the above-described viewpoint, but actually the width of the sidewall insulating film 13 is limited to the width from the sidewall of the gate electrode 12 to a plug (not illustrated) connected to the impurity region 14a and impurity region 14b. Note that, by the amount of an increase in the width of the sidewall insulating film 13, the element region of the memory transistor 10 may be expanded and the impurity region 14a and impurity region 14b may be shifted in the direction away from the gate electrode 12. However, in this case, an increase in the size of the memory region 10a including a group of memory transistors 10 and an increase in the size of the semiconductor device 1A including the memory region 10a need to be taken into consideration.

For the purpose of increasing the programming speed of the memory transistor 10, the film thickness of the oxide film 13a may be thinned in addition to setting the width W1 of the sidewall insulating film 13 to be larger than the width W2 of the sidewall insulating film of the logic transistor 20. By thinning the film thickness of the oxide film 13a provided mainly between the nitride film 13b, into which charges are injected, and the semiconductor substrate 2 in this manner, the injection probability of hot carriers will increase and therefore an improvement in the programming speed is achieved. However, note that, the thinner the film thickness of the oxide film 13a, the more easily the injected charges will dissipate and data retention characteristic may degrade.

Note that, if the width W2 of the sidewall insulating film 23 is increased on the logic transistor 20 side, the injection probability of hot carriers into the sidewall insulating film 23 of the logic transistor 20 may be reduced. However, because an increase of the width W2 of the sidewall insulating film 23 increases the length of the LDD region 25a and LDD region 25b and increases the parasitic resistance, the transistor performance will degrade.

Next, a second embodiment will be described.

Figure 4:
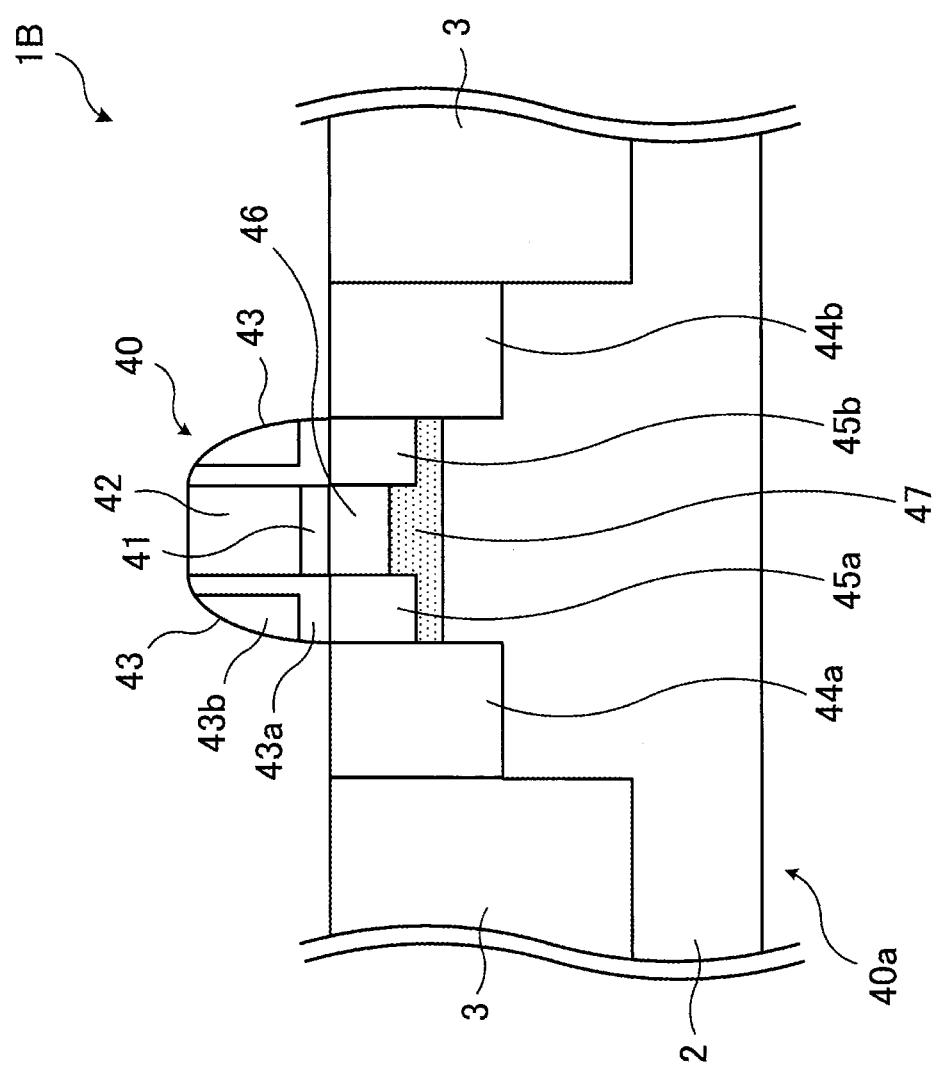
FIG. 4 illustrates an example of a semiconductor device according to a second embodiment.

FIG. 4 illustrates an example of a semiconductor device according to the second embodiment. FIG. 4 schematically illustrates an exemplary cross section of a main part of the semiconductor device according to the second embodiment.

A semiconductor device 1B illustrated in FIG. 4 is an example of the nonvolatile memory, and includes a transistor (memory transistor) 40 provided in a memory region 40a. The memory transistor 40 is formed on the semiconductor substrate 2 of a p-type or n-type. Various types of semiconductor substrates, such as a silicon substrate, may be used for the semiconductor substrate 2. The region (element region) in which the memory transistor 40 is formed is defined by the element isolating region 3 that is formed in the semiconductor substrate 2 using STI or the like.

Note that, although one memory transistor 40 is illustrated in FIG. 4, the memory region 40a of the semiconductor device 1B may include a plurality of memory transistors 40, or at least one memory transistor 40 and another memory transistor.

As illustrated in FIG. 4, the memory transistor 40 includes a gate insulating film 41 provided above the semiconductor substrate 2, a gate electrode 42 provided above the gate insulating film 41, and a sidewall insulating film 43 provided on the sidewall of the gate electrode 42 and above the semiconductor substrate 2. The memory transistor 40 further includes an impurity region 44a and an impurity region 44b which are provided in the semiconductor substrate 2 on both sides (both sides in the gate length direction) of the gate electrode 42, respectively, and function as a source region or drain region. The memory transistor 40 may include an LDD region 45a and an LDD region 45b on the inner side of the impurity region 44a and impurity region 44b in the semiconductor substrate 2 below the sidewall insulating film 43. The memory transistor 40 further includes a channel region 46 provided in a region between the impurity region 44a and the impurity region 44b (or between the LDD region 45a and the LDD region 45b) below the gate electrode 42 and an impurity region 47 provided below the channel region 46.

Here, various types of insulating materials, such as a silicon oxide, may be used for the gate insulating film 41. The film thickness of the gate insulating film 41 is set, for example, based on the threshold voltage, programming voltage, and erasing voltage set for the memory transistor 40.

Various types of conductive materials, such as polysilicon, may be used for the gate electrode 42.

The sidewall insulating film 43 includes a stacked structure of an oxide film 43a of silicon oxide or the like and a nitride film 43b of silicon nitride or the like. For example, the oxide film 43a is provided so as to have an L-shaped cross section, on the sidewall of the gate electrode 42 and on the semiconductor substrate 2, and the nitride film 43b is provided on the oxide film 43a. The sidewall insulating film 43 may have a three-layer structure obtained by further providing an oxide film on the oxide film having an L-shaped cross section and the nitride film, or may have a stacked structure of four or more layers of insulating films. Other than this, the sidewall insulating film 43 may have a single-layer structure of an oxide film or nitride film.

The impurity region 44a and impurity region 44b contain an impurity of an n-type or p-type conductivity, in a predetermined concentration.

The LDD region 45a and LDD region 45b contain the impurity of the same conductivity type as the conductivity type of the impurity contained in the impurity region 44a and impurity region 44b, in a concentration lower than the concentration of the impurity region 44a and impurity region 44b.

The channel region 46 is a non-doped region where no impurity is intentionally added, or a region where an extremely low concentration of impurity is contained. The impurity concentration of the channel region 46 is set to be equal to or less than $1 \times 10^{17}$ $cm^{-3}$, for example.

The impurity region 47 is a region that is provided below the channel region 46 and contains a higher concentration of impurity than the channel region 46. The impurity region 47 is also referred to as a screen layer. The impurity region 47 contains, in a predetermined concentration, an impurity of a conductivity type different from the conductivity type of the impurity contained in the impurity region 44a and impurity region 44b which function as the source region or drain region. The threshold voltage of the memory transistor 40 is controlled by the impurity concentration of the impurity region 47. Moreover, the impurity region 47 suppresses the punch through between the impurity region 44a and impurity region 44b which function as the source region or drain region. Because the impurity region 47 is embedded into the semiconductor substrate 2 by the amount of the thickness of the channel region 46 from the interface between the semiconductor substrate 2 and the gate insulating film 41 and the impurity concentration of the impurity region 47 adjusts the threshold voltage, the impurity concentration of the impurity region 47 is set to be relatively high, on the order of $1 \times 10^{19}$ $cm^{-3}$, for example.

The memory transistor 40 is a nonvolatile memory transistor that stores information by accumulating charges (electrons or holes) into the sidewall insulating film 43.

Each of the programming operation and reading operation of the memory transistor 40 may be performed as with the memory transistor 10 described in the first embodiment. That is, the each operation is performed by setting each node of the gate electrode 42, impurity region 44a, impurity region 44b, and semiconductor substrate 2 to a predetermined potential to generate hot carriers, and injecting and accumulating the generated hot carriers in the sidewall insulating film 43.

In the memory transistor 40, the threshold voltage is controlled by the impurity concentration of the impurity region 47 embedded into the semiconductor substrate 2, and the impurity concentration of the channel region 46 above the impurity region 47 is set to be lower. In the memory transistor 40, the impurity concentration of the channel region 46 is not increased but the impurity concentration of the impurity region 47 below the channel region 46 is increased so as to increase the generation of hot carriers during the programming operation. Because the impurity region 47 is located away from the interface between the semiconductor substrate 2 and the gate insulating film 41, the threshold voltage of the memory transistor 40 will not significantly increase even if the impurity concentration of the impurity region 47 is increased.

That is, in a memory transistor not provided with such an impurity region 47, if the impurity concentration of the channel region is increased in order to increase the generation of hot carriers, inconveniently the threshold voltage may increase and the read current may decrease. In contrast, in the memory transistor 40 having the relatively high-concentration impurity region 47 provided below the channel region 46 as described above, it is possible to increase the generation of hot carriers and control the threshold voltage without causing such inconvenience.

In order to effectively realize the functions, such as increasing the generation of hot carriers, controlling the threshold voltage, and suppressing the punch-through, the impurity region 47 is provided so as to contact the impurity region 44a and impurity region 44b which function as the source region or drain region.

In the memory transistor 40, an improvement in the programming speed is achieved by adopting the impurity region 47 as described above.

Figure 5A:
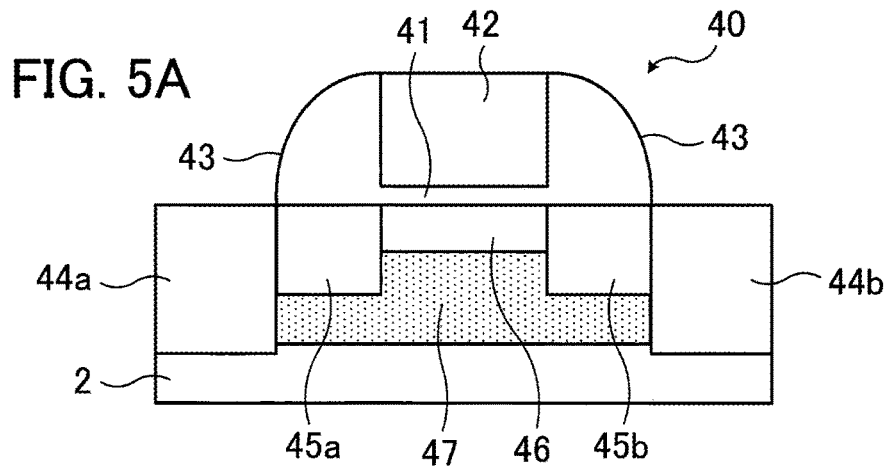
FIGS. 5A to 5C illustrate the program characteristics of a memory transistor according to the second embodiment.
Figure 5B:
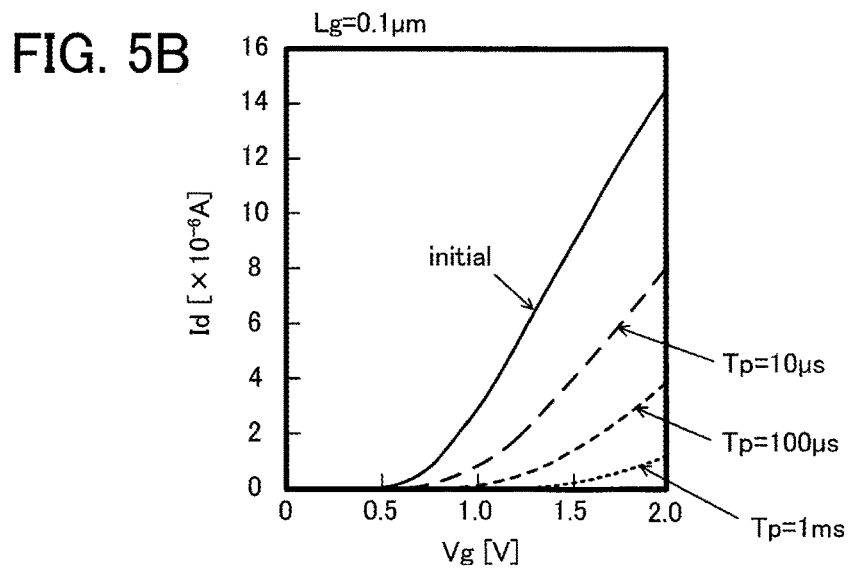
Figure 5C:
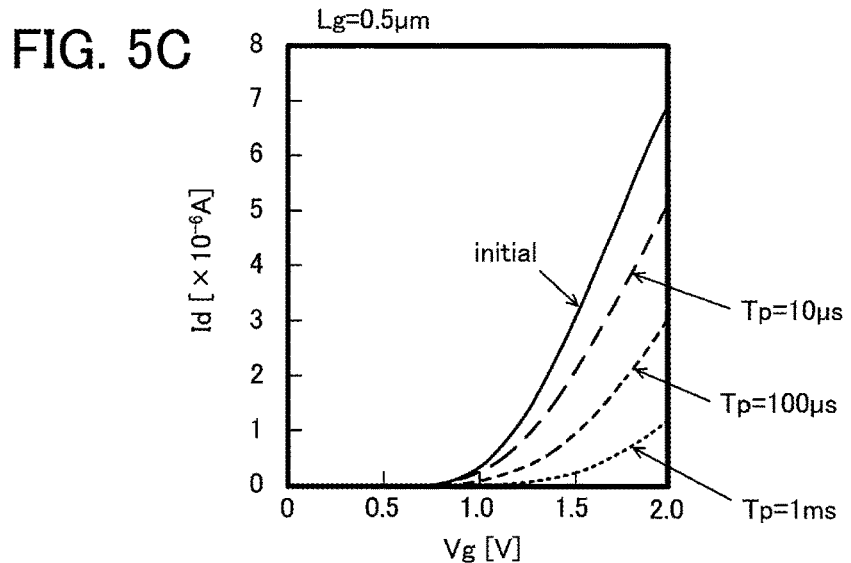

FIGS. 5A to 5C illustrate the program characteristics of the memory transistor according to the second embodiment.

Figure 6A:
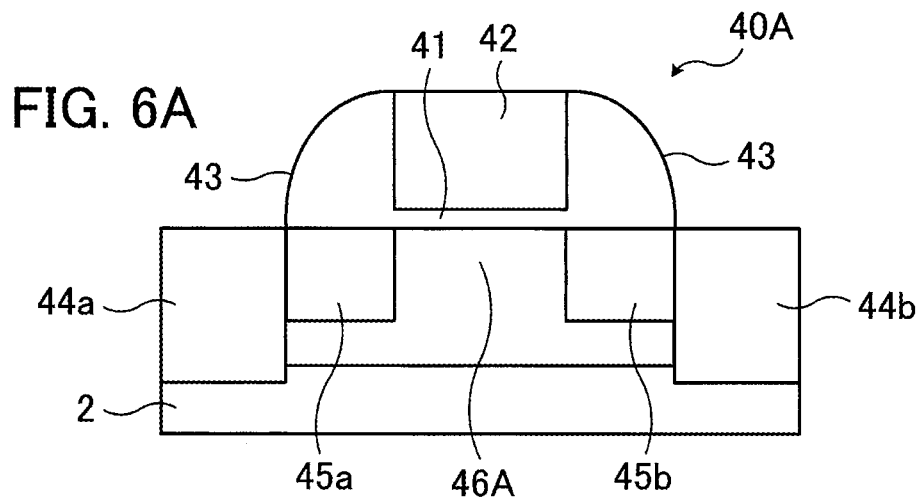
FIGS. 6A and 6B illustrate the program characteristics of a memory transistor according to a comparative example.
Figure 6B:
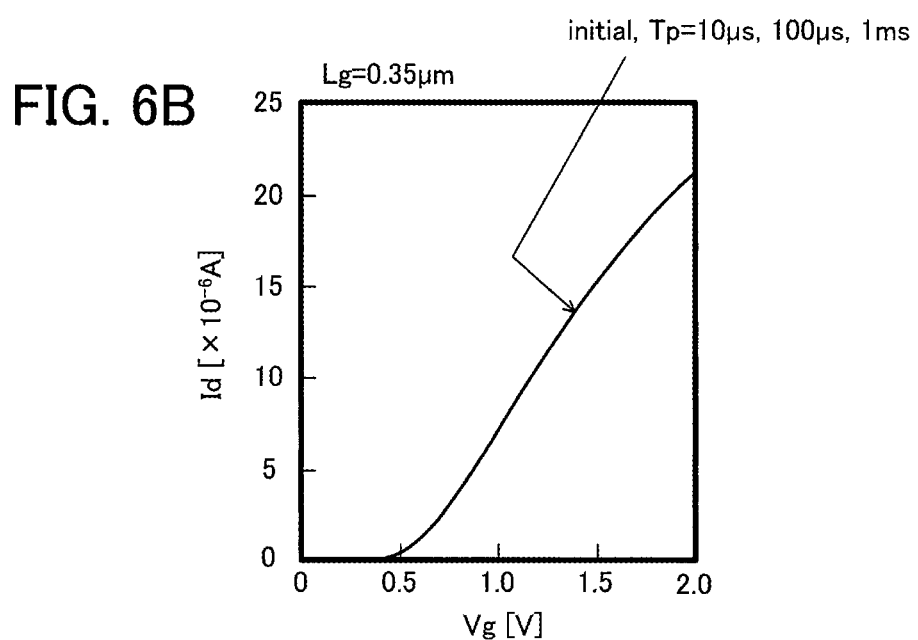

FIG. 5A schematically illustrates a configuration example of the memory transistor according to the second embodiment, while FIGS. 5B and 5C illustrate an example of the relationship between the gate voltage Vg[V] and the read current (drain current) Id[A], respectively. FIGS. 6A and 6B illustrate the program characteristics of a memory transistor according to a comparative example. FIG. 6A schematically illustrates a configuration example of the memory transistor according to the comparative example, while FIG. 6B illustrates an example of the relationship between the gate voltage Vg[V] and the read current (drain current) Id[A].

In the memory transistor 40 illustrated in FIG. 5A, the film thickness of the gate insulating film 41 is set to 7 nm, the gate length Lg of the gate electrode 42 to 0.1 µm or 0.5 µm, and the width of the sidewall insulating film 43 to 74 nm. The LDD region 45a and LDD region 45b are formed by implanting phosphorus from four directions under the conditions: the accelerating energy of 35 keV and the dose amount of $2.5 \times 10^{11}$ cm$^{-2}$, while the impurity region 44a and impurity region 44b are formed so as to have a concentration sufficiently higher than $2.5 \times 10^{12}$ cm$^{-2}$. The channel region 46 is formed as a non-doped layer, while the impurity region 47 provided in the semiconductor substrate 2 below the channel region 46 is formed by implanting boron under the conditions: the accelerating energy of 20 keV and the dose amount of $2.4 \times 10^{13}$ cm$^{-2}$.

The programming operation with respect to the memory transistor 40 is performed under the voltage conditions where both the impurity region 44a (source) and the semiconductor substrate 2 are set to 0 V and both the gate electrode 42 and the impurity region 44b (drain) are set to 4.5 V. After the programming operation is performed with a programming time Tp set to 1 ms, 100 µs, and 10 µs under these voltage conditions, the reading operation is performed by setting the impurity region 44b (source) and the semiconductor substrate 2 to 0 V and applying a positive voltage to the gate electrode 42 and impurity region 44a (drain). Here, the voltage of the impurity region 44a is 0.5 V, for example. The relationship between the gate voltage Vg and the read current Id flowing from the drain to the source during the reading operation is illustrated in FIG. 5B (in the case of the gate length of 0.1 µm) and in FIG. 5C (in the case of the gate length of 0.5 µm). The read current Id (initial) before programming is also illustrated in FIGS. 5B and 5C.

In a memory transistor 40A illustrated in FIG. 6A, the gate length Lg of the gate electrode 42 is set to 0.35 µm, and a channel region (referred to as a "flat channel region" for convenience) 46A with a predetermined depth from the surface of the semiconductor substrate 2 is provided. The flat channel region 46A is formed by implanting boron under the condition of a relatively-low dose amount of $3.2 \times 10^{12}$ cm$^{-2}$. The other configurations are the same as the memory transistor 40 of FIG. 5A.

The programming operation with respect to the memory transistor 40A is also performed under the same voltage and programming time conditions as the programming operation of the memory transistor 40 of FIG. 5A, and subsequently the reading operation is performed. The relationship between the gate voltage Vg and the read current Id flowing from the drain to the source during the reading operation is illustrated in FIG. 6B. The read current (initial) before programming is also illustrated in FIG. 6B.

In the memory transistor 40 of FIG. 5A having the relatively-high concentration impurity region 47 provided below the channel region 46, the programming is performed even if the programming time Tp decreases by one digit or more, such as from 1 ms to 100 µs and 10 µs, as illustrated in FIGS. 5B and 5C.

On the other hand, in the memory transistor 40A of FIG. 6A provided with the flat channel region 46A, the IV characteristic does not change at all even with the programming time Tp of 1 ms as illustrated in FIG. 6B and thus the programming is not performed. FIG. 6B indicates that all the IV characteristics, initial, after 10 µs, after 100 µs, and after 1 ms overlap with each other and do not vary, i.e., the programming is not performed at all. In the memory transistor 40A provided with the flat channel region 46A, a higher voltage needs to be applied in order to program, and even if such a higher voltage is applied, the programming speed is slow as compared with the memory transistor 40.

Figure 7:
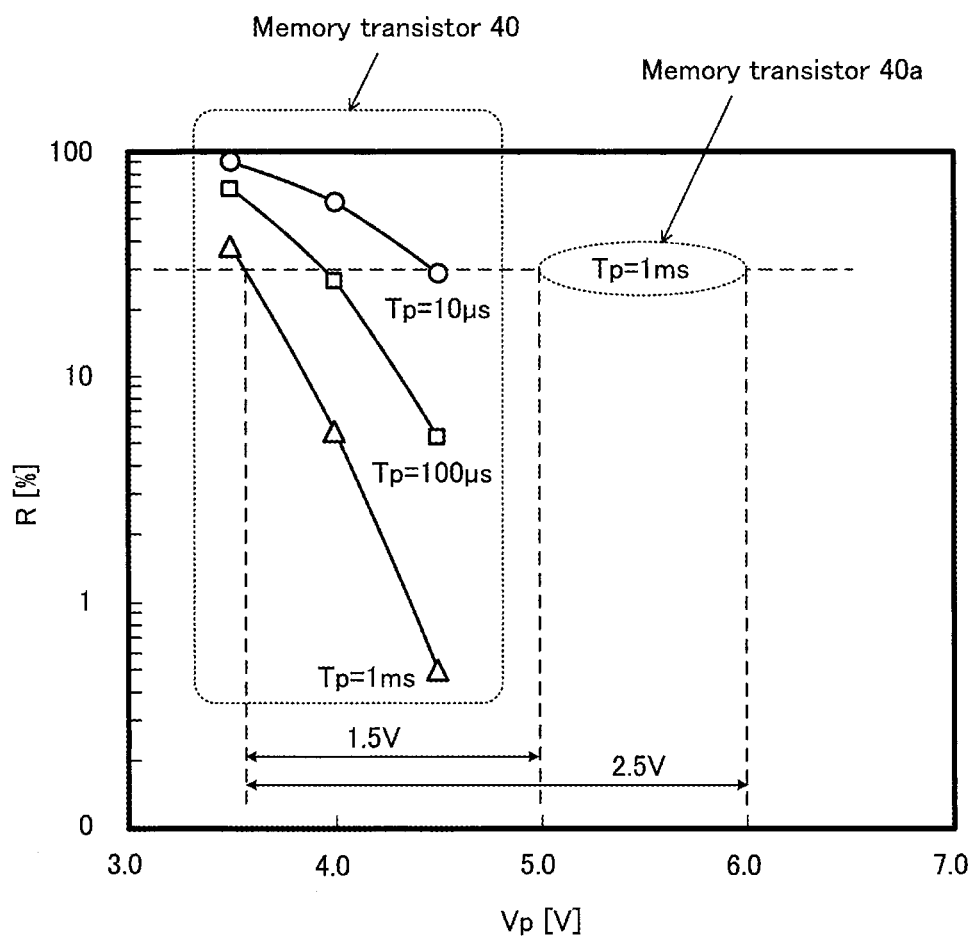
FIG. 7 is an explanatory view of the evaluation of the program characteristics of the memory transistor according to the second embodiment.

FIG. 7 is an explanatory view of the evaluation of the program characteristics of the memory transistor according to the second embodiment. The horizontal axis of FIG. 7 represents a programming voltage Vp[V], while the vertical axis of FIG. 7 represents a ratio (current ratio) R[%] between a read current detected after performing the programming operation for a certain period of time and a read current before programming.

According to FIG. 7, in the memory transistor 40 (FIG. 5A) provided with the impurity region 47, the current ratios R after performing the programming operation under the conditions; the programming voltage Vp=3.5 V and the programming time Tp=1 ms, Vp=4.0 V and Tp=100 µs, and Vp=4.5 V and Tp=10 µs, respectively, are on the order of 30% and substantially equal. That is, in the memory transistor 40, as the programming voltage Vp increases by 0.5 V, the programming speed increases by one digit.

In such a memory transistor 40 provided with the relatively-high concentration impurity region 47 below the channel region 46, a significant improvement in the programming speed may be achieved.

Next, a third embodiment will be described.

Here, as the third embodiment, a semiconductor device including the memory transistor 10 and logic transistor 20 described in the above first embodiment and an I/O transistor will be described.

Figure 8:
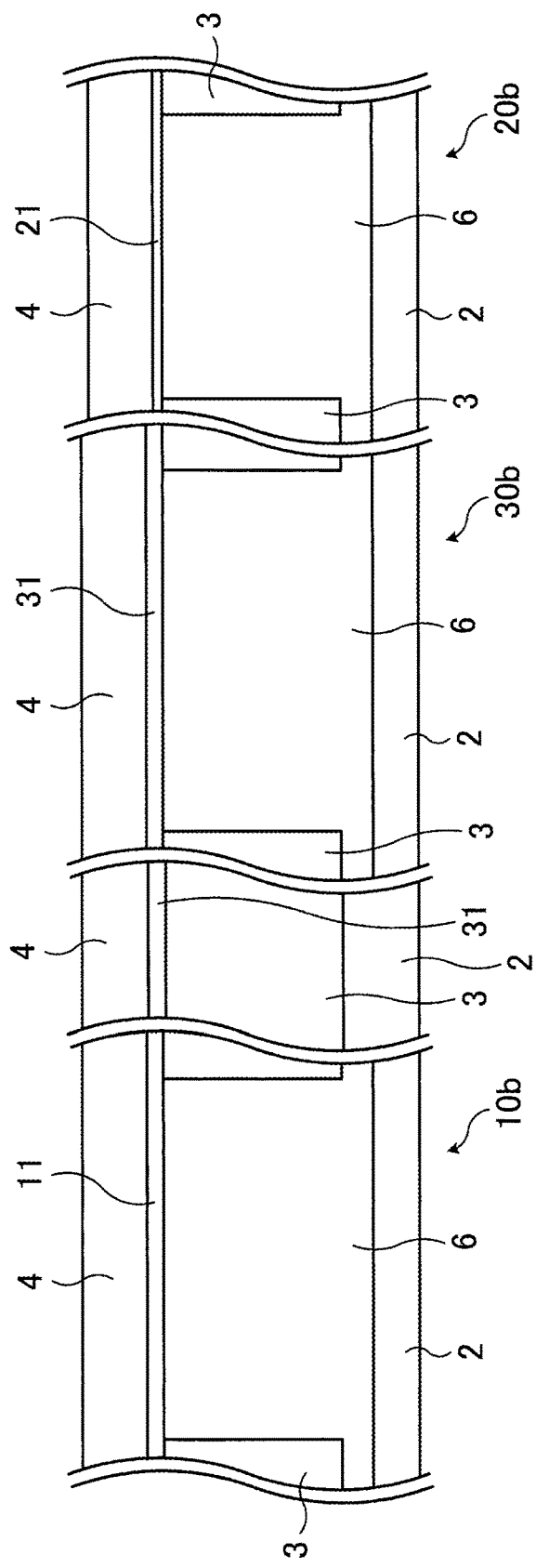
FIG. 8 is a view (part 1) illustrating an example of the method for manufacturing a semiconductor device according to a third embodiment.
Figure 9:
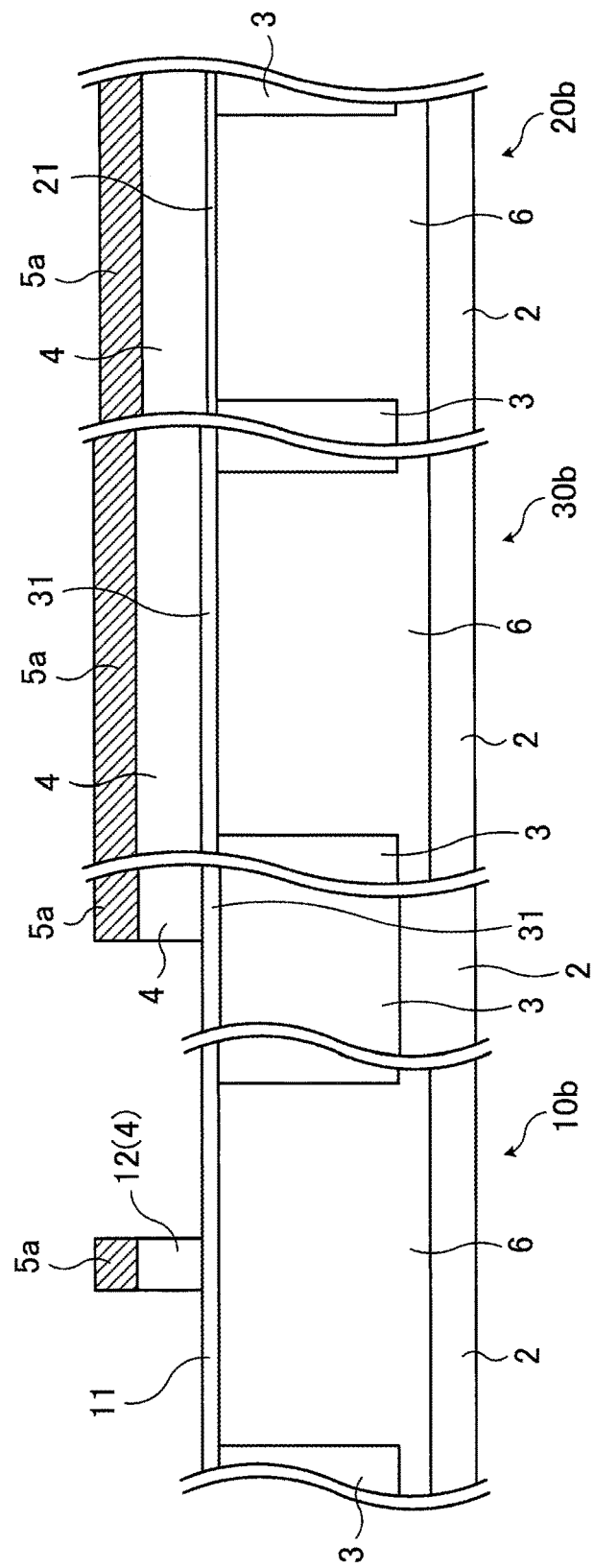
FIG. 9 is a view (part 2) illustrating an example of a method for manufacturing the semiconductor device according to the third embodiment.
Figure 10:
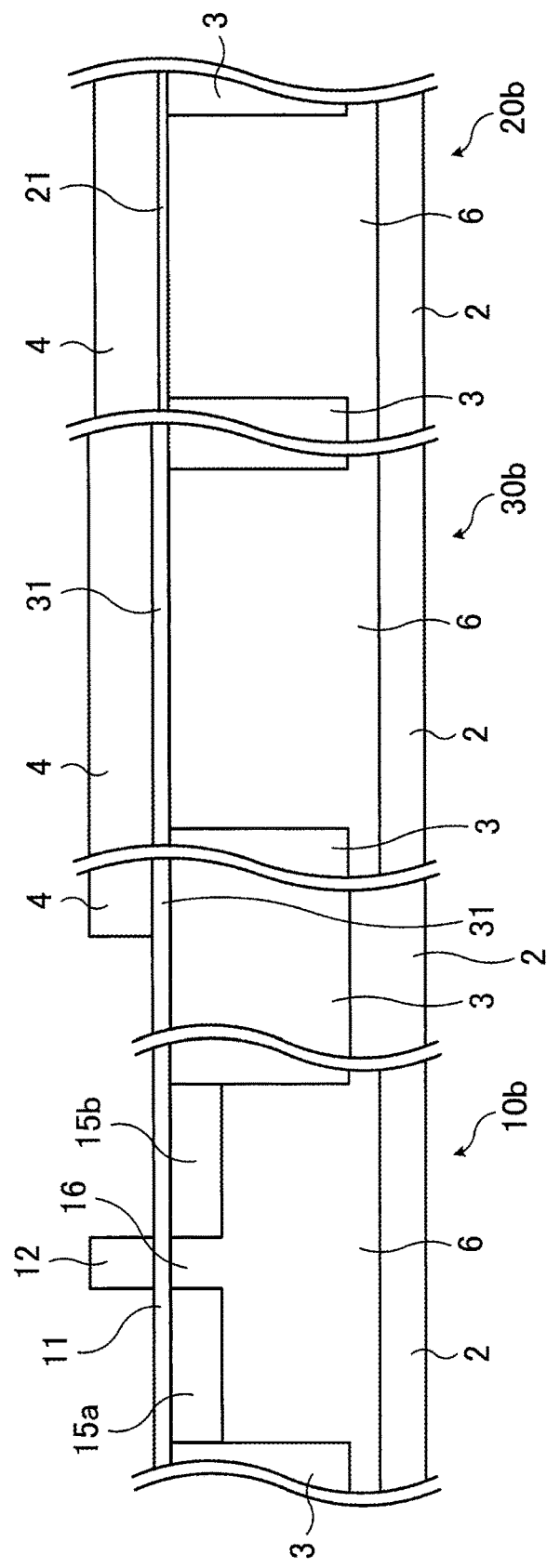
FIG. 10 is a view (part 3) illustrating an example of the method for manufacturing the semiconductor device according to the third embodiment.
Figure 11:
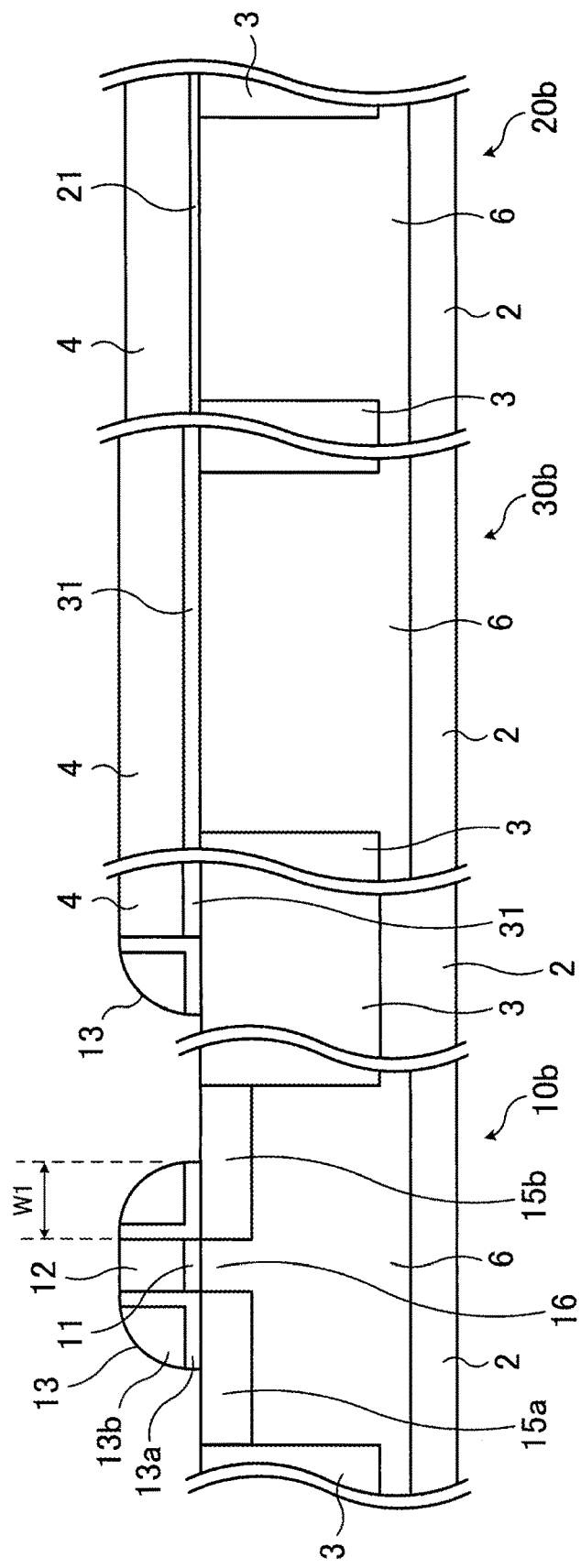
FIG. 11 is a view (part 4) illustrating an example of the method for manufacturing the semiconductor device according to the third embodiment.
Figure 12:
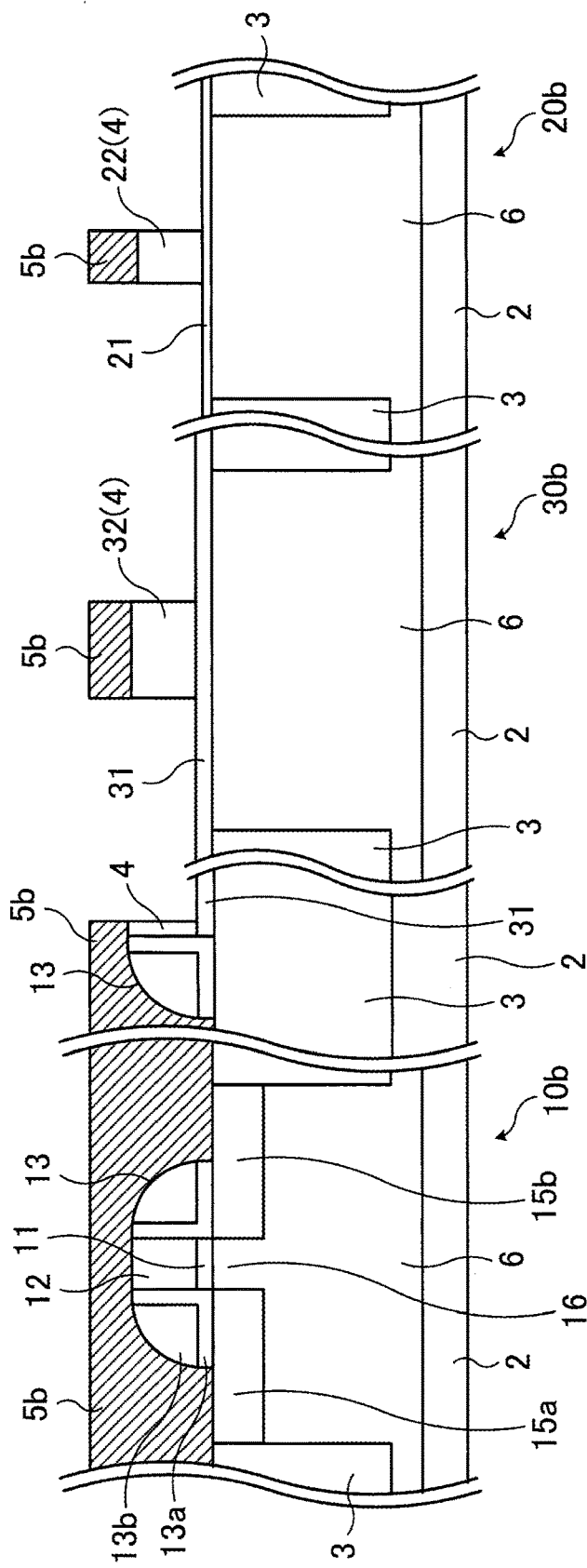
FIG. 12 is a view (part 5) illustrating an example of the method for manufacturing the semiconductor device according to the third embodiment.
Figure 13:
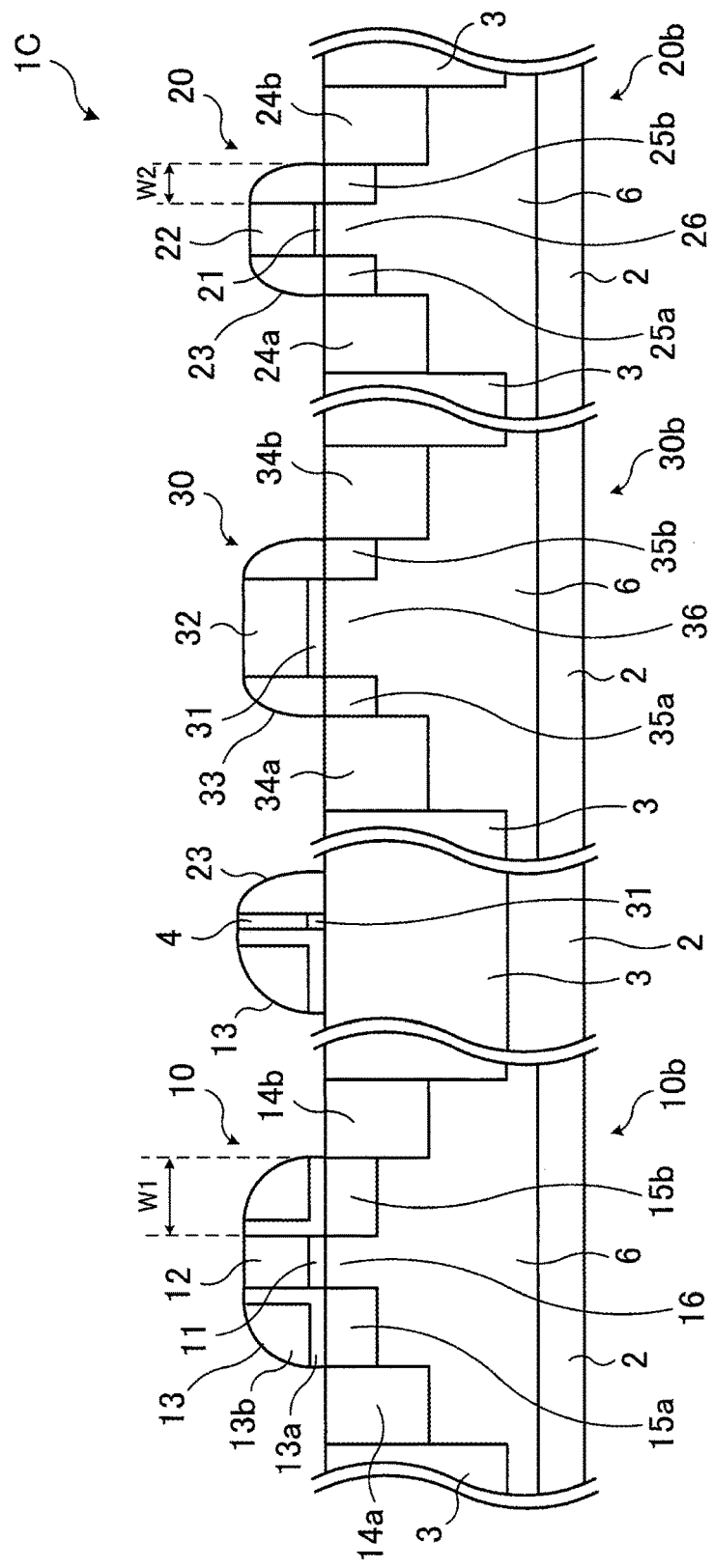
FIG. 13 is a view (part 6) illustrating an example of the method for manufacturing the semiconductor device according to the third embodiment.

FIGS. 8 to 13 illustrate an example of the method for manufacturing the semiconductor device according to the third embodiment. Here, FIG. 8 is an exemplary cross sectional schematic view of a main portion of the first manufacturing step, FIG. 9 is an exemplary cross sectional schematic view of the main portion of the second manufacturing step, FIG. 10 is an exemplary cross sectional schematic view of the main portion of the third manufacturing step, FIG. 11 is an exemplary cross sectional schematic view of the main portion of the fourth manufacturing step, FIG. 12 is an exemplary cross sectional schematic view of the main portion of the fifth manufacturing step, and FIG. 13 is an exemplary cross sectional schematic view of the main portion of the sixth manufacturing step. Hereinafter, an example of the manufacturing steps of the semiconductor device according to the third embodiment will be sequentially described with reference to FIGS. 8 to 13.

First, as illustrated in FIG. 8, the element isolating region 3 that defines an element region 10b of the memory transistor 10 (FIG. 13), an element region 20b of the logic transistor 20 (FIG. 13), and an element region 30b of an I/O transistor 30 (FIG. 13) is formed in the semiconductor substrate 2 using STI. A well region 6 is formed in the semiconductor substrate 2 before or after formation of the element isolating region 3. The well region 6 is of a p-type, for example. After formation of the well region 6 and element isolating region 3, impurity implantationation (channel-impurity implantationation) for adjusting each threshold voltage of the memory transistor 10, the logic transistor 20, and the I/O transistor 30 is performed.

Subsequently, an oxide film is formed, for example, with a film thickness of 7 nm on the semiconductor substrate 2 using thermal oxidation, the oxide film formed in the element region 20b of the logic transistor 20 is removed, and an oxide film is formed, for example, with a film thickness of 1.8 nm on the semiconductor substrate 2 using thermal oxidation again. Accordingly, as illustrated in FIG. 8, the gate insulating film 11, the gate insulating film 21, and a gate insulating film 31 each having a predetermined film thickness are formed in the element region 10b of the memory transistor 10, in the element region 20b of the logic transistor 20, and in the element region 30b of the I/O transistor 30, respectively.

After formation of the gate insulating film 11, gate insulating film 21, and gate insulating film 31, a polysilicon 4 that is a gate electrode material is formed, for example, with a film thickness of 100 nm as illustrated in FIG. 8.

Next, as illustrated in FIG. 9, a resist material is formed on the polysilicon 4, and then a region, in which the gate electrode 12 of the memory transistor 10 is formed, and a resist pattern 5a that covers the element region 20b and element region 30b are formed by performing exposure and development. With the resist pattern 5a used as a mask, the polysilicon 4 is etched to form the gate electrode 12 of the memory transistor 10.

After formation of the gate electrode 12, the resist pattern 5a is removed, and then with the gate electrode 12 and polysilicon 4 remaining on the semiconductor substrate 2 used as a mask, impurity implantation is performed on the semiconductor substrate 2 of the element region 10b. With this impurity implantation, the LDD region 15a and LDD region 15b are formed in the semiconductor substrate 2 on both sides of the gate electrode 12 as illustrated in FIG. 10. The LDD region 15a and LDD region 15b are formed by implanting, for example, arsenic that is an n-type impurity under the conditions: the accelerating energy of 10 keV and the dose amount of $1 \times 10^{13}$ cm$^{-2}$. The channel region 16 of the memory transistor 10 is formed between the LDD region 15a and the LDD region 15b.

After formation of the LDD region 15a and LDD region 15b, the oxide film 13a is first formed so as to cover the exposed gate electrode 12, polysilicon 4, and gate insulating film 11, and then the nitride film 13b is formed on the oxide film 13a. For example, the oxide film 13a is formed with a film thickness of 10 nm, and the nitride film 13b is formed with a film thickness of 150 nm on the oxide film 13a. Then, the formed oxide film 13a and nitride film 13b are etched back so as to form the sidewall insulating film 13 of the memory transistor 10 having the predetermined width W1 on the sidewall of the gate electrode 12 of the element region 10b and above the semiconductor substrate 2 as illustrated in FIG. 11. Note that the sidewall insulating film 13 is similarly formed also on the sidewall of the polysilicon 4 except the gate electrode 12 and above the semiconductor substrate 2 (on the element isolating region 3).

After formation of the sidewall insulating film 13, a resist material is formed across the surface, and then exposure and development are performed. Accordingly, as illustrated in FIG. 12, a resist pattern 5b is formed which covers the element region 10b, a region where the gate electrode 22 of the logic transistor 20 is formed, and a region where the gate electrode 32 of the I/O transistor 30 is formed. With the resist pattern 5b used as a mask, the polysilicon 4 is etched to form the gate electrode 22 of the logic transistor 20 and the gate electrode 32 of the I/O transistor 30. Note that FIG. 12 illustrates a form in which a part (edge) of the polysilicon 4 also remains on the element isolating region 3.

After formation of the gate electrode 22 and gate electrode 32, the resist pattern 5b is removed, and then impurity implantation is performed on the semiconductor substrate 2 of the element region 20b and element region 30b, respectively. By the above impurity implantation, respectively, the LDD region 25a and LDD region 25b are formed in the semiconductor substrate 2 on both sides of the gate electrode 22, and the LDD region 35a and LDD region 35b are formed in the semiconductor substrate 2 on both sides of the gate electrode 32, as illustrated in FIG. 13. The LDD region 25a and LDD region 25b are formed by implanting, for example, arsenic that is an n-type impurity under the conditions: the accelerating energy of 1.5 keV and the dose amount of $1 \times 10^{15}$ cm$^{-2}$. The LDD region 35a and LDD region 35b are formed by implanting, for example, phosphorus that is an n-type impurity under the conditions: the accelerating energy of 35 keV and the dose amount of $1 \times 10^{13}$ cm$^{-2}$. The channel region 26 of the logic transistor 20 is formed between the LDD region 25a and the LDD region 25b, and the channel region 36 of the I/O transistor 30 is formed between the LDD region 35a and LDD region 35b.

Next, an insulating film, e.g., a silicon oxide film, is formed with a film thickness of 80 nm, which is then etched back. Accordingly, as illustrated in FIG. 13, the sidewall insulating film 23 of the logic transistor 20 having the predetermined width W2 is formed on the sidewall of the gate electrode 22 of the element region 20b and above the semiconductor substrate 2. At the same time, the sidewall insulating film 33 of the I/O transistor 30 is formed on the sidewall of the gate electrode 32 of the element region 30b and above the semiconductor substrate 2. The sidewall insulating film 23 of the logic transistor 20 and the sidewall insulating film 33 of the I/O transistor 30 are formed so as to have the predetermined width W2 that is smaller than the width W1 of the sidewall insulating film 13 of the memory transistor 10. Note that the sidewall insulating film 23 (or 33) is similarly formed also on the sidewall of the polysilicon 4 remaining on the element isolating region 3.

Subsequently, with the gate electrode 12 and the sidewall insulating film 13 of the sidewall thereof, the gate electrode 22 and the sidewall insulating film 23 of the sidewall thereof, and the gate electrode 32 and the sidewall insulating film 33 of the sidewall thereof used as a mask, an n-type impurity, such as phosphorus, is implanted on the semiconductor substrate 2. The above-described impurity implantation may be performed collectively on the element region 10b, the element region 20b, and the element region 30b, or may be performed separately on the element region 10b, the element region 20b, and the element region 30b.

At this time, the impurity implantation with respect to the semiconductor substrate 2 of the element region 10b is performed under the conditions that the concentration of the element region 10b becomes higher than the LDD region 15a and LDD region 15b and that the impurity is implanted into a deeper region than the LDD region 15a and LDD region 15b. Similarly, the impurity implantation with respect to the semiconductor substrate 2 of the element region 20b is performed under the conditions that the concentration of the element region 20b becomes higher than the concentration of the LDD region 25a and LDD region 25b and that the impurity is implanted into a deeper region than the LDD region 25a and LDD region 25b, and the impurity implantation with respect to the semiconductor substrate 2 of the element region 30b is performed under the conditions that the concentration of the element region 30b becomes higher than the concentration of the LDD region 35a and LDD region 35b and that the impurity is implanted into a deeper region than the LDD region 35a and LDD region 35b. For example, phosphorus is implanted under the conditions: the accelerating energy of 8 keV and the dose amount of $1 \times 10^{16}$ cm$^{-2}$. Accordingly, the n-type impurity region 14a and impurity region 14b which function as the source region or drain region of the memory transistor 10 are formed on the outside of the n-type LDD region 15a and LDD region 15b in the semiconductor substrate 2 of the element region 10b. Similarly, the n-type impurity region 24a and impurity region 24b that function as the source region or drain region of the logic transistor 20 are formed on the outside of the n-type LDD region 25a and LDD region 25b in the semiconductor substrate 2 of the element region 20b, and the n-type impurity region 34a and impurity region 34b that function as the source region or drain region of the I/O transistor 30 are formed on the outside of the n-type LDD region 35a and LDD region 35b in the semiconductor substrate 2 of the element region 30b.

With the above-described manufacturing steps, a semiconductor device 1C (nonvolatile memory), as illustrated in FIG. 13, having the memory transistor 10, logic transistor 20, and I/O transistor 30 mixedly mounted on the common semiconductor substrate 2 is obtained. Thereafter the formation of an interlayer insulating film, the formation of a plug, and the formation of an upper wiring layer including the conductors, such as a wiring and a via, and the like are performed.

In the semiconductor device 1C according to the third embodiment, the width W1 of the sidewall insulating film 13 of the memory transistor 10 is set to be larger than the width W2 of the sidewall insulating film 23 of the logic transistor 20 (and the sidewall insulating film 33 of the I/O transistor 30). Accordingly, as described in the above first embodiment, an improvement in the programming speed of the memory transistor 10 is achieved. The above-described manufacturing steps make it possible to manufacture the semiconductor device 1C provided with the memory transistor 10 that exhibits an excellent programming speed.

Note that, although one memory transistor 10 is illustrated here, the semiconductor device 1C may include a plurality of memory transistors 10, or at least one memory transistor 10 and another memory transistor. Moreover, although one logic transistor 20 is illustrated here, the semiconductor device 1C may include a plurality of logic transistors 20, or at least one logic transistor 20 and another logic transistor. Moreover, although one I/O transistor 30 is illustrated here, the semiconductor device 1C may include a plurality of I/O transistors 30, or at least one I/O transistor 30 and another I/O transistor.

Next, a fourth embodiment will be described.

Here, as the fourth embodiment, a semiconductor device including the memory transistor 40 described in the above second embodiment and further a logic transistor and an I/O transistor will be described.

Figure 14:
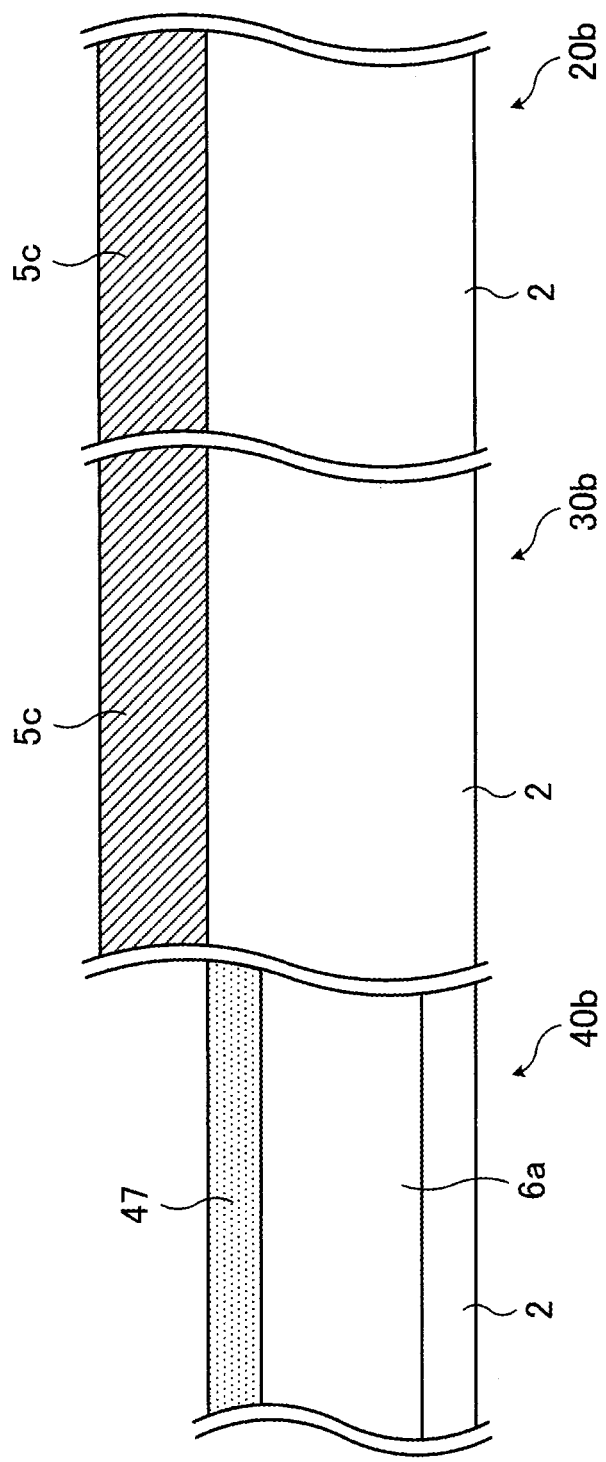
FIG. 14 is a view (part 1) illustrating an example of a method for manufacturing a semiconductor device according to a fourth embodiment.
Figure 15:
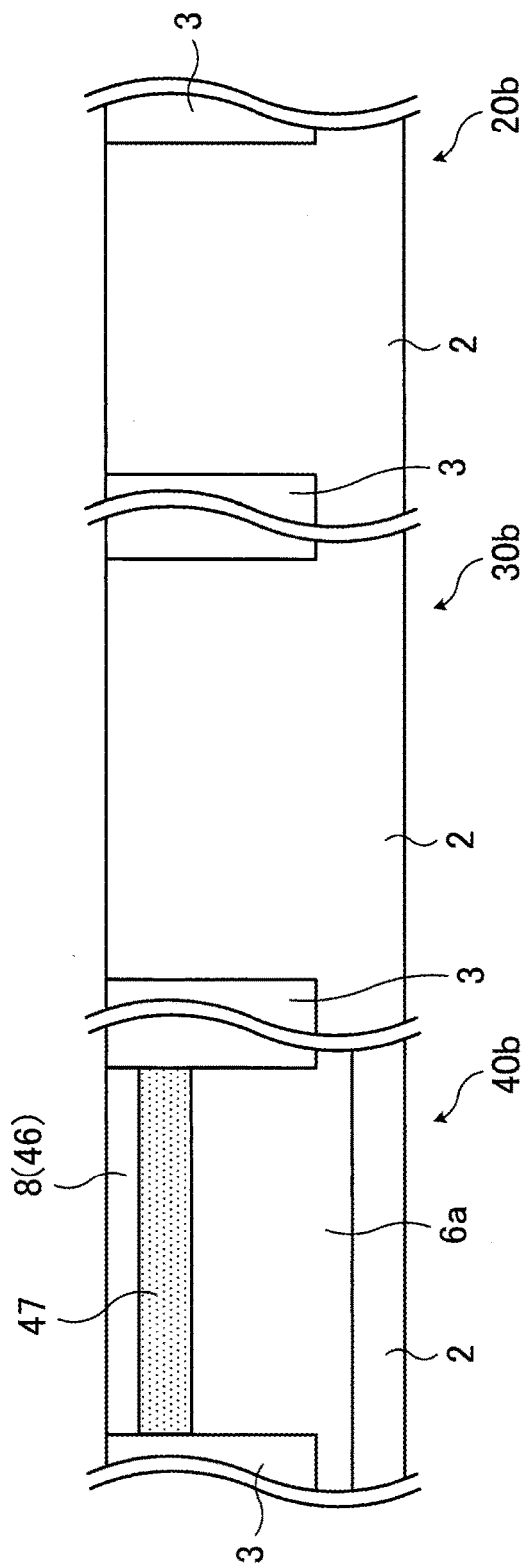
FIG. 15 is a view (part 2) illustrating an example of the method for manufacturing the semiconductor device according to the fourth embodiment.
Figure 16:
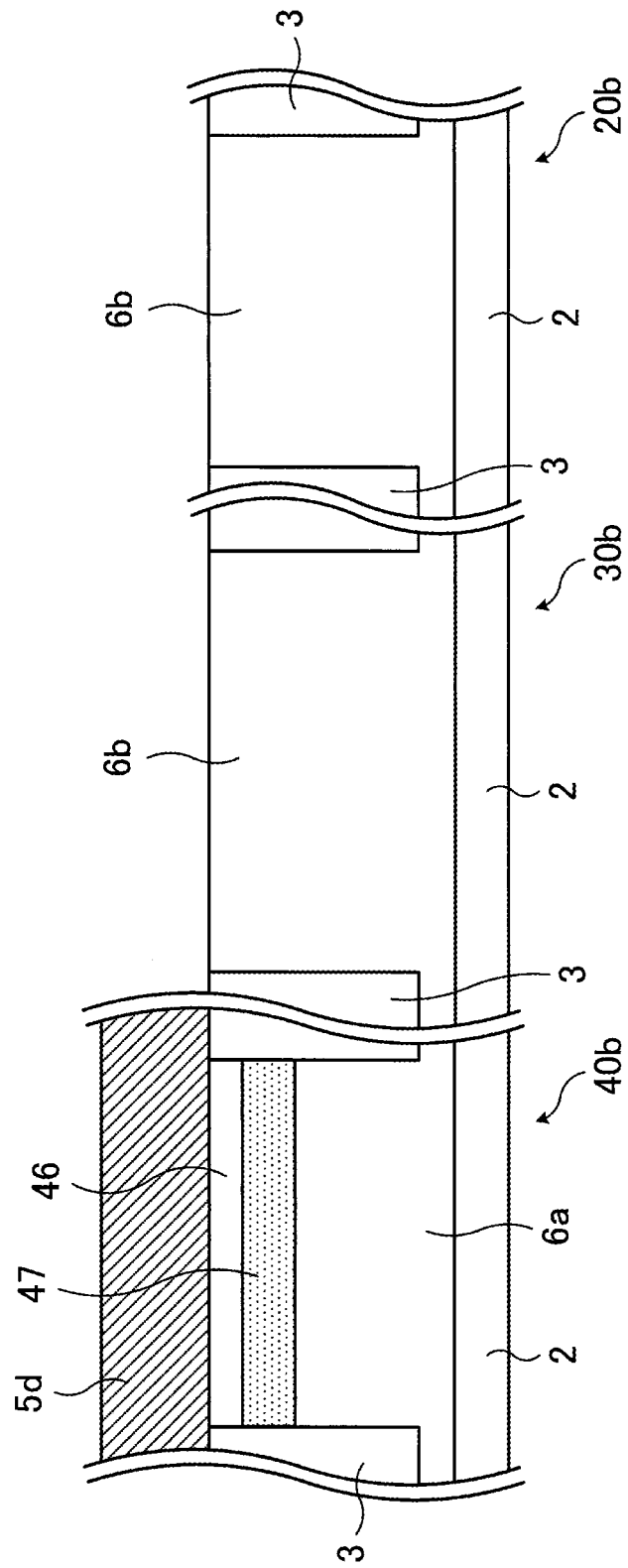
FIG. 16 is a view (part 3) illustrating an example of the method for manufacturing the semiconductor device according to the fourth embodiment.
Figure 17:
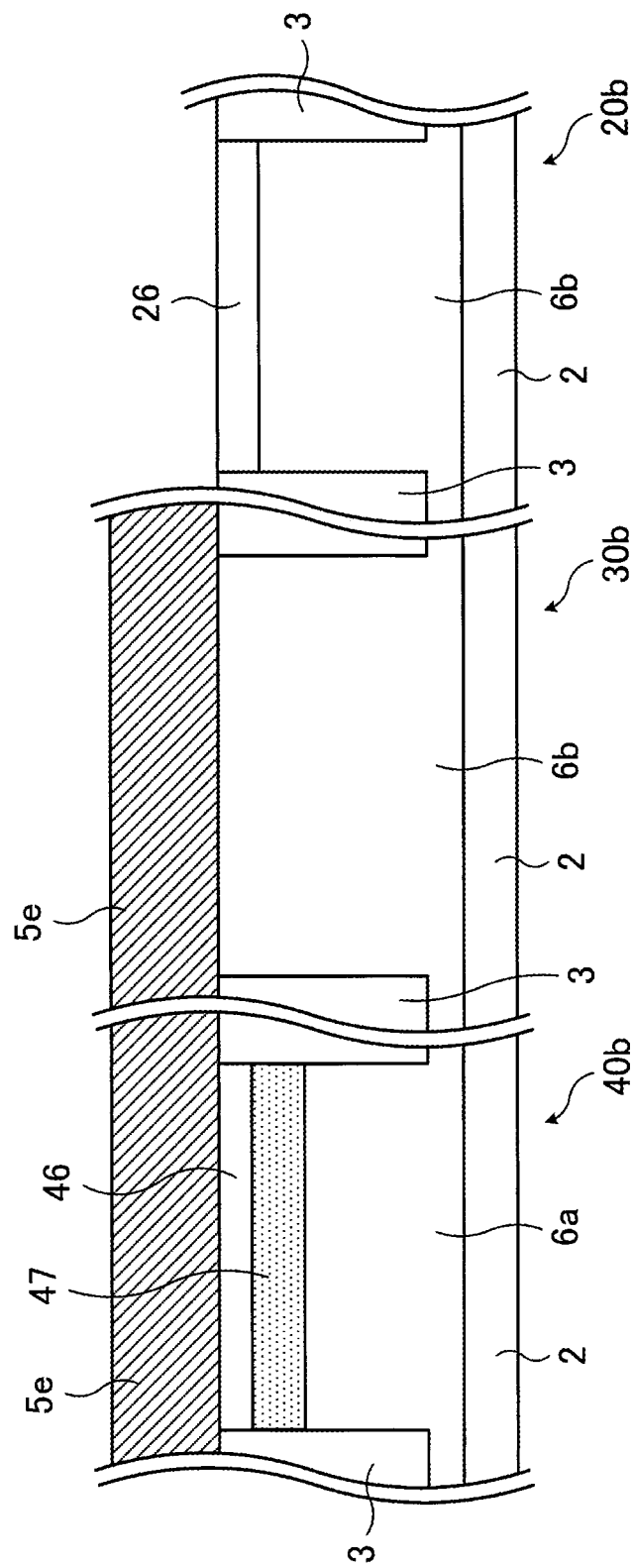
FIG. 17 is a view (part 4) illustrating an example of the method for manufacturing the semiconductor device according to the fourth embodiment.
Figure 18:
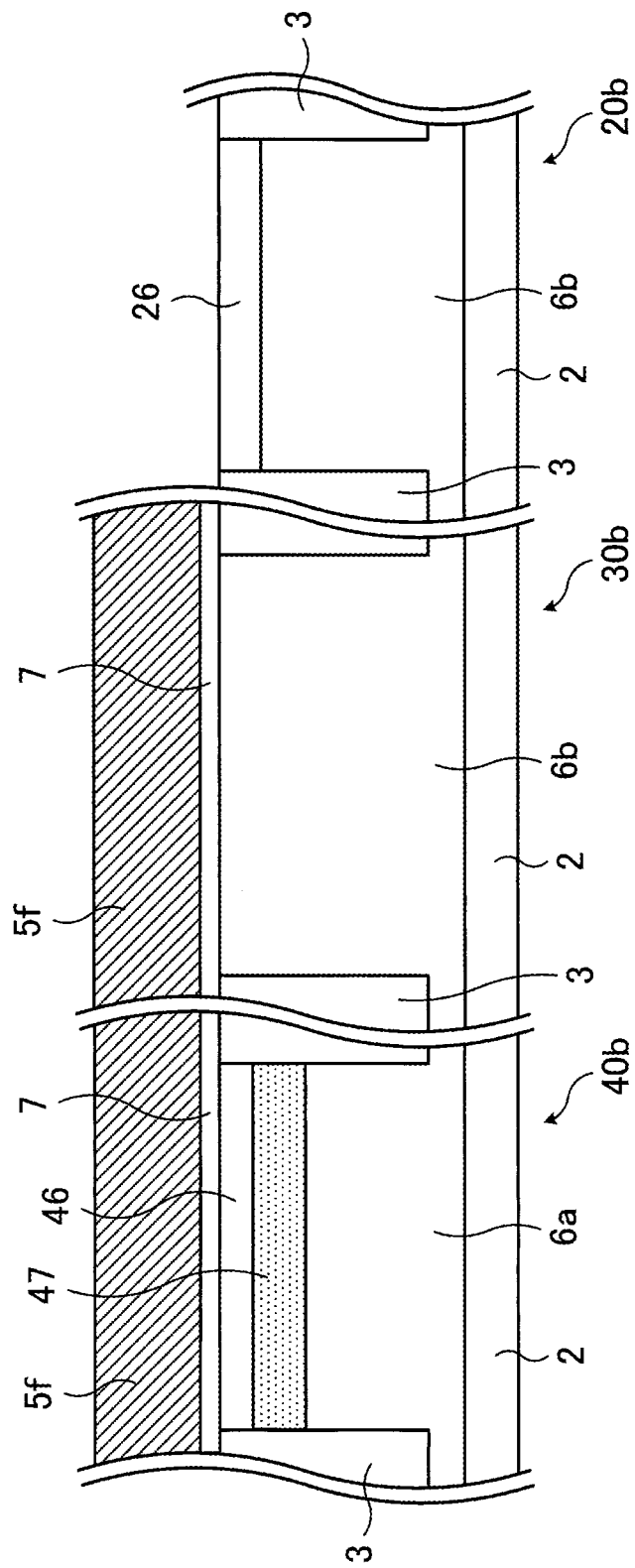
FIG. 18 is a view (part 5) illustrating an example of the method for manufacturing the semiconductor device according to the fourth embodiment.
Figure 19:
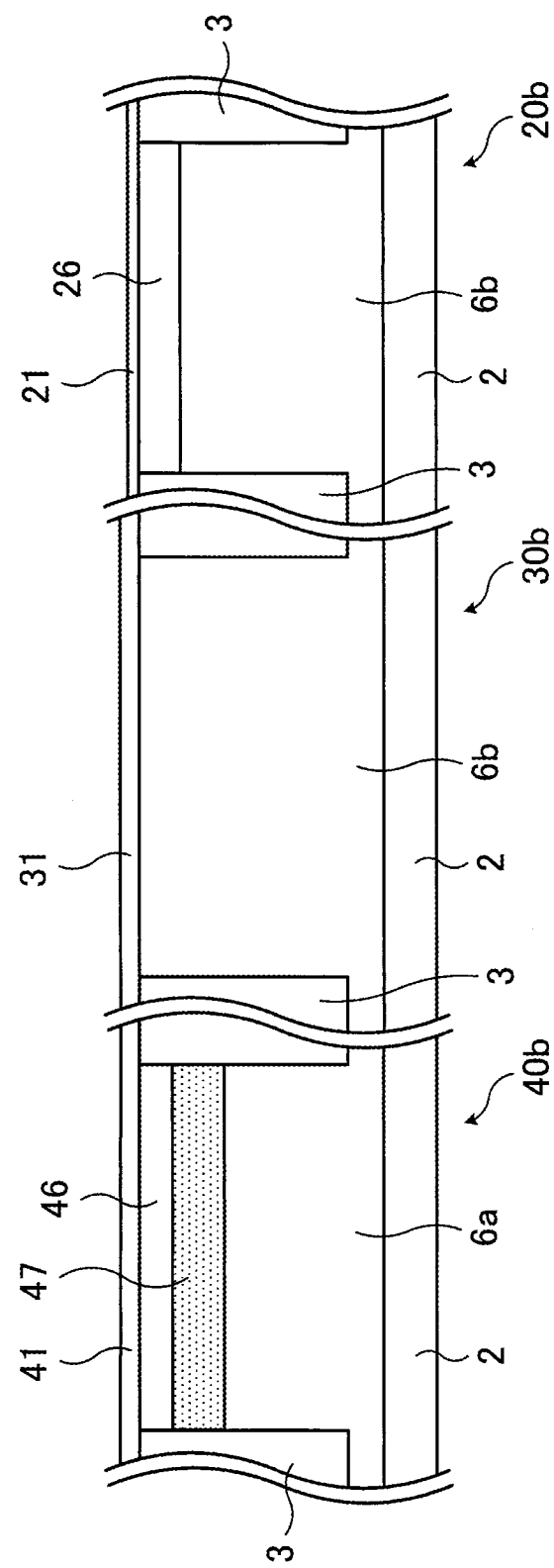
FIG. 19 is a view (part 6) illustrating an example of the method for manufacturing the semiconductor device according to the fourth embodiment.
Figure 20:
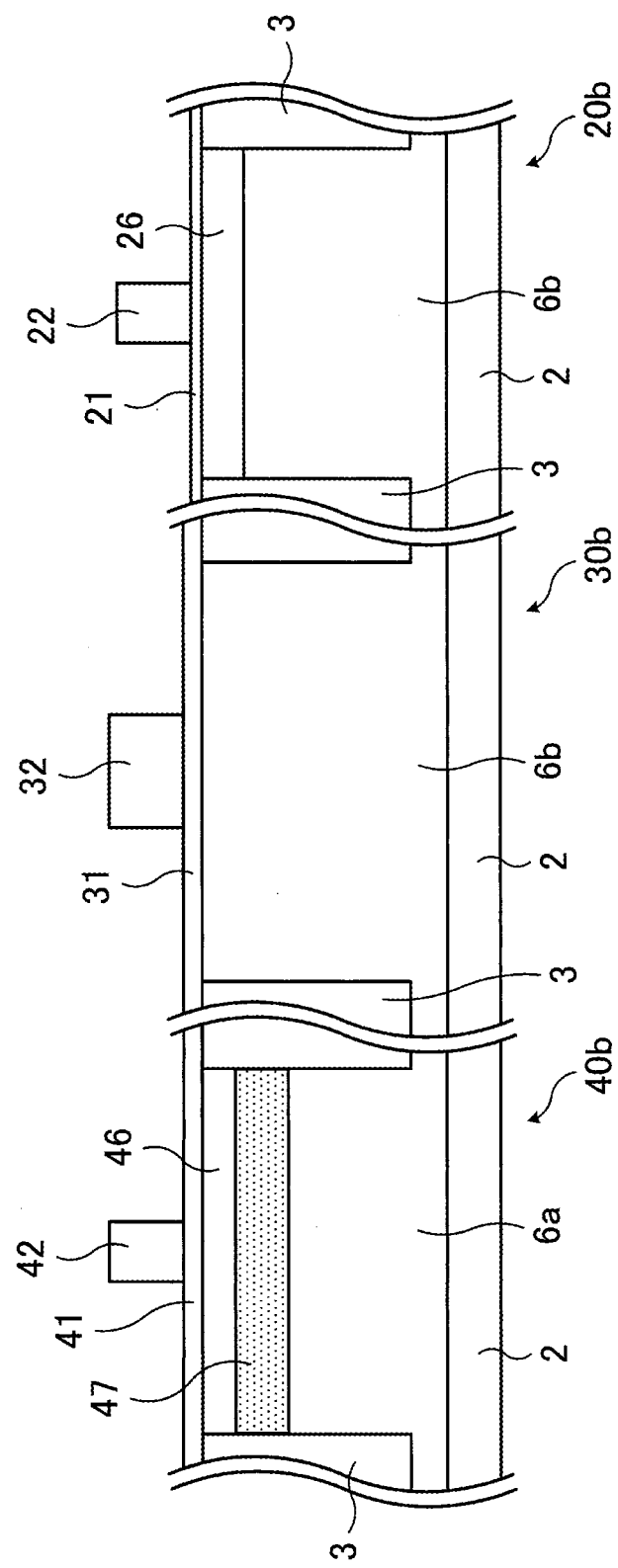
FIG. 20 is a view (part 7) illustrating an example of the method for manufacturing the semiconductor device according to the fourth embodiment.
Figure 21:
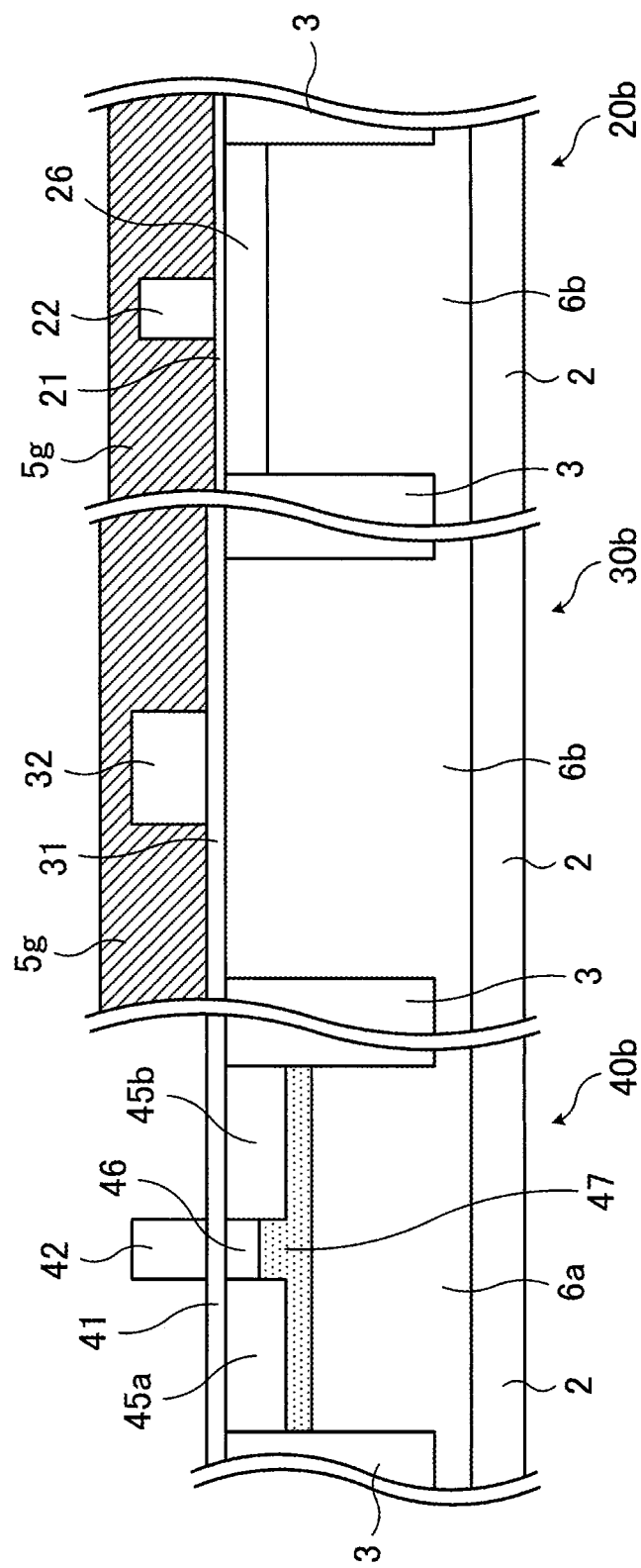
FIG. 21 is a view (part 8) illustrating an example of the method for manufacturing the semiconductor device according to the fourth embodiment.
Figure 22:
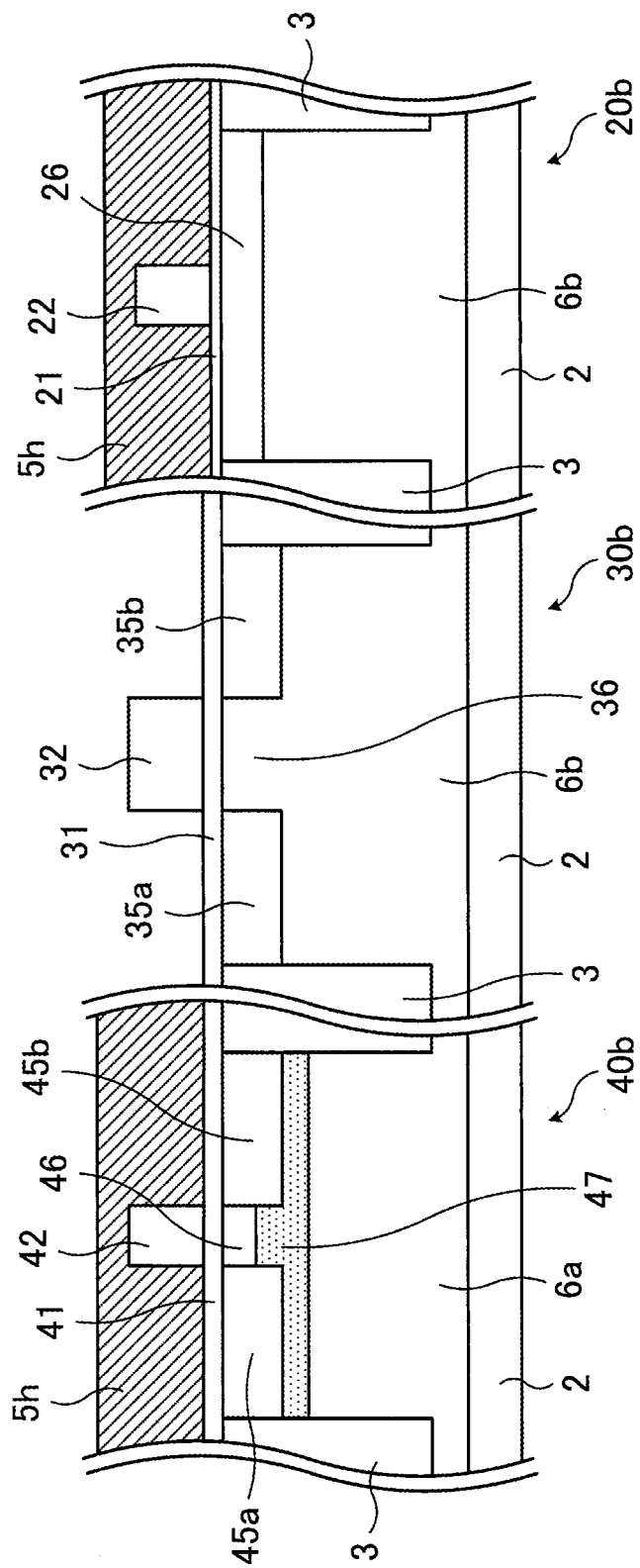
FIG. 22 is a view (part 9) illustrating an example of the method for manufacturing the semiconductor device according to the fourth embodiment.
Figure 23:
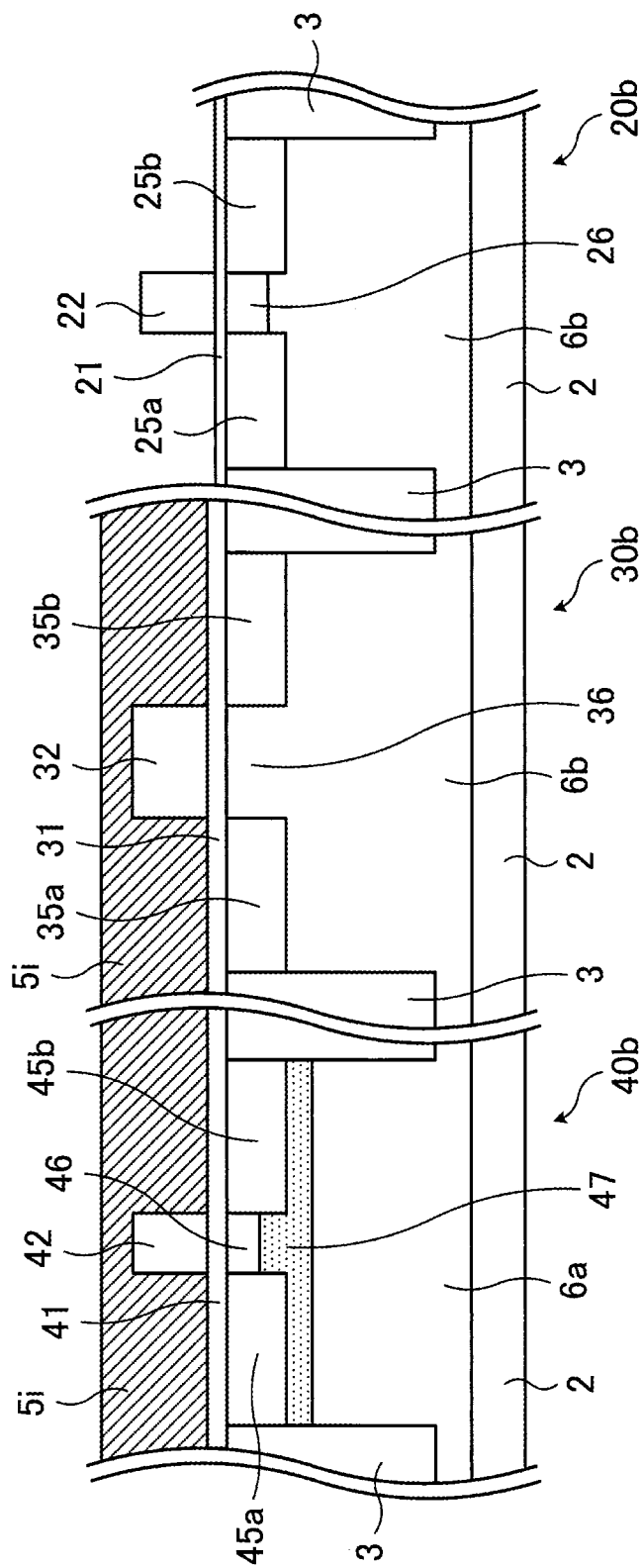
FIG. 23 is a view (part 10) illustrating an example of the method for manufacturing the semiconductor device according to the fourth embodiment.
Figure 24:
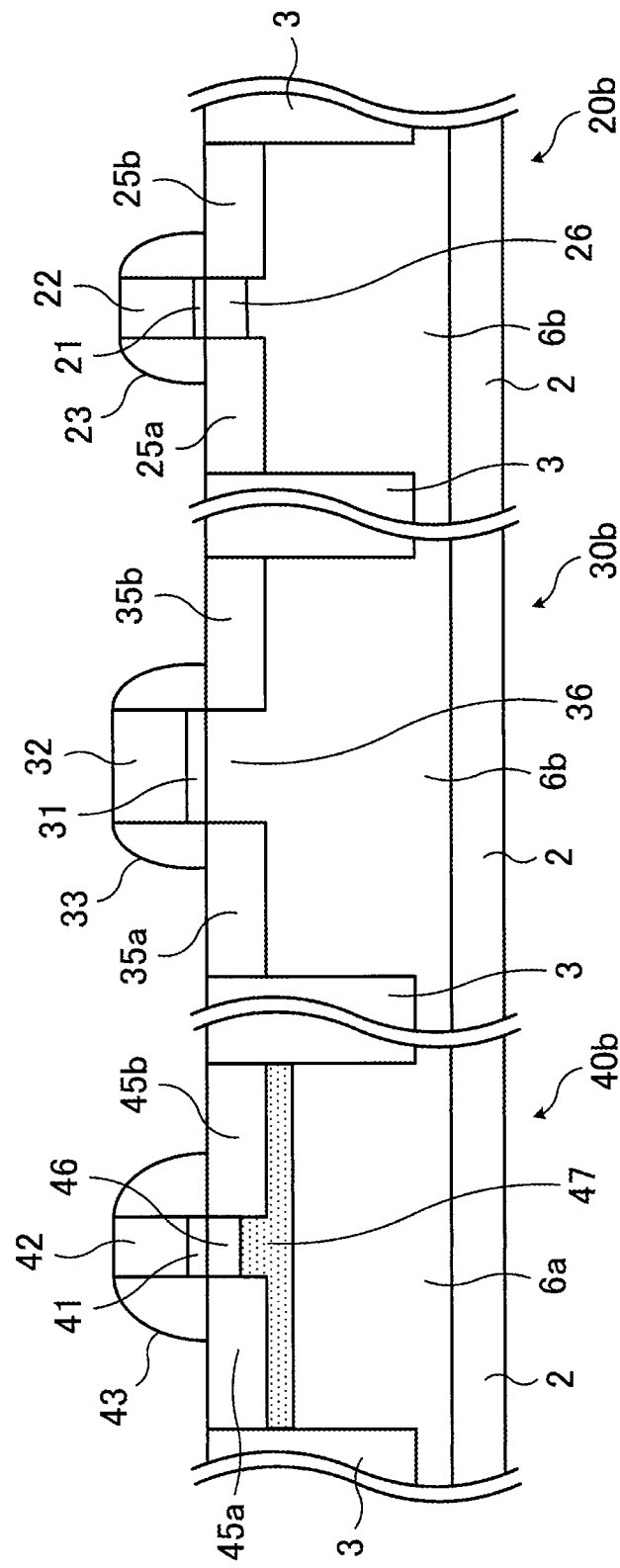
FIG. 24 is a view (part 11) illustrating an example of the method for manufacturing the semiconductor device according to the fourth embodiment.
Figure 25:
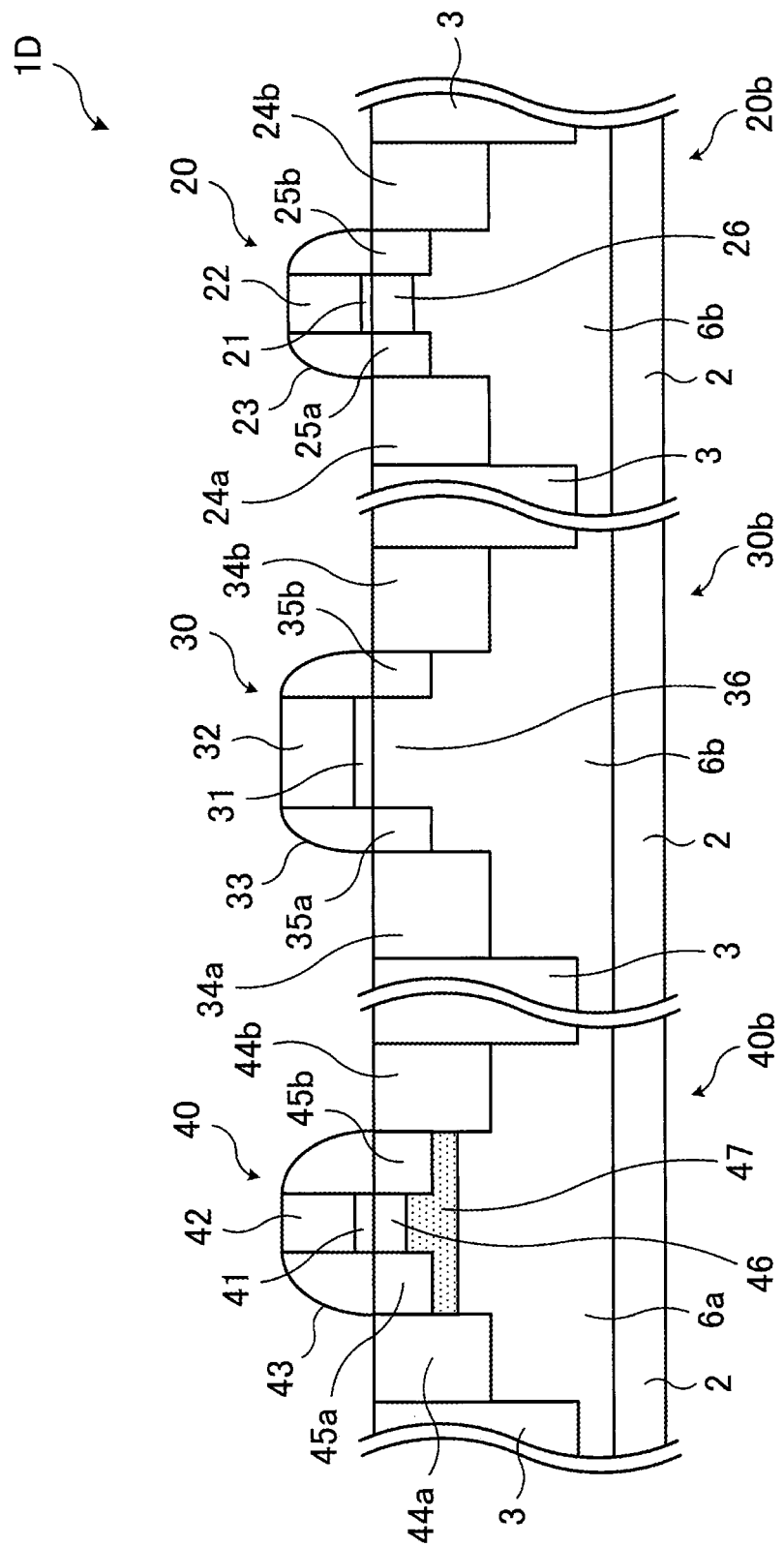
FIG. 25 is a view (part 12) illustrating an example of the method for manufacturing the semiconductor device according to the fourth embodiment.

FIGS. 14 to 25 illustrate an example of the method for manufacturing the semiconductor device according to the fourth embodiment. Here, FIG. 14 is an exemplary cross sectional schematic view of a main portion of the first manufacturing step, FIG. 15 is an exemplary cross sectional schematic view of the main portion of the second manufacturing step, FIG. 16 is an exemplary cross sectional schematic view of the main portion of the third manufacturing step, FIG. 17 is an exemplary cross sectional schematic view of the main portion of the fourth manufacturing step, FIG. 18 is an exemplary cross sectional schematic view of the main portion of the fifth manufacturing step, FIG. 19 is an exemplary cross sectional schematic view of the main portion of the sixth manufacturing step, FIG. 20 is an exemplary cross sectional schematic view of the main portion of the seventh manufacturing step, FIG. 21 is an exemplary cross sectional schematic view of the main portion of the eighth manufacturing step, FIG. 22 is an exemplary cross sectional schematic view of the main portion of the ninth manufacturing step, FIG. 23 is an exemplary cross sectional schematic view of the main portion of the tenth manufacturing step, FIG. 24 is an exemplary cross sectional schematic view of the main portion of the eleventh manufacturing step, and FIG. 25 is an exemplary cross sectional schematic view of the main portion of the twelfth manufacturing step. Hereinafter, an example of the manufacturing steps of the semiconductor device according to the fourth embodiment will be sequentially described with reference to FIGS. 14 to 25.

First, as illustrated in FIG. 14, a resist pattern 5c, in which an element region 40b of the memory transistor 40 (FIG. 25) is opened and the element region 20b of the logic transistor 20 (FIG. 25) and the element region 30b of the I/O transistor 30 (FIG. 25) are covered, is formed on the semiconductor substrate 2. With the resist pattern 5c used as a mask, a predetermined impurity implantation is performed on the semiconductor substrate 2 of the element region 40b. With this impurity implantation, a well region 6a and the impurity region 47 having a relatively-high concentration to be provided below the channel region 46 (FIG. 25) of the memory transistor 40 are formed in the semiconductor substrate 2 of the element region 40b. The well region 6a and the impurity region 47 are of a p-type, for example, respectively.

This impurity implantation is performed under the following conditions, for example. Boron is implanted under the conditions: the accelerating energy of 135 keV or 185 keV and the dose amount of $4 \times 10^{13}$ cm$^{-2}$. Germanium (Ge) is implanted under the conditions: the accelerating energy of 30 keV and the dose amount of $5 \times 10^{14}$ cm$^{-2}$. Carbon (C) is implanted under the conditions: the accelerating energy of 5 keV and the dose amount of $5 \times 10^{14}$ cm$^{-2}$. Boron is implanted under the conditions: the accelerating energy of 20 keV and the dose amount of $3 \times 10^{13}$ cm$^{-2}$. By implanting each of these impurities under predetermined conditions, respectively, the p-type well region 6a and the impurity region 47 are formed in the semiconductor substrate 2 of the element region 40b. Note that implanting germanium and carbon suppresses the diffusion of the p-type impurity contained in the impurity region 47 into lower and/or upper regions.

After formation of the well region 6a and the impurity region 47, the resist pattern 5c is removed, and then a semiconductor material is epitaxially grown on the semiconductor substrate 2. For example, when a silicon substrate is used as the semiconductor substrate 2, silicon that is the same type of semiconductor material as the semiconductor substrate 2 is epitaxially grown with a film thickness of 25 nm on the semiconductor substrate 2. With the epitaxial growth of the semiconductor material, a semiconductor layer 8 (non-doped layer) is formed on the impurity region 47 of the element region 40b as illustrated in FIG. 15. The channel region 46 of the memory transistor 40 is formed in the semiconductor layer 8. Note that, although a semiconductor layer similar to the semiconductor layer 8 of the element region 40b is formed also in the element region 20b and in the element region 30b due to the epitaxial growth, the semiconductor layer is described as the layer integrated into the semiconductor substrate 2 for convenience here. After formation of the semiconductor layer 8, the element isolating region 3 is formed which defines the element region 40b, the element region 30b, and the element region 20b, as illustrated in FIG. 15.

Next, as illustrated in FIG. 16, a resist pattern 5d is formed, in which the element region 40b is covered and the element region 20b and element region 30b are opened. With the resist pattern 5d used as a mask, a predetermined impurity implantation is performed on the semiconductor substrate 2 of the element region 20b and element region 30b. With this impurity implantation, the well region 6b is formed in the semiconductor substrate 2 of the element region 20b and element region 30b as illustrated in FIG. 16. The well region 6b is of a p-type, for example. The formation of the well region 6b is performed, for example, by implanting boron under the conditions: the accelerating energy of 135 keV or 185 keV and the dose amount of $4\times10^{13}$ cm$^{-2}$ and by implanting boron fluoride (BF, BF2) under the conditions: the accelerating energy of 15 keV and the dose amount of $3\times10^{12}$ cm$^{-2}$.

After formation of the well region 6b, the resist pattern 5d is removed, and as illustrated in FIG. 17, a resist pattern 5e is newly formed, in which the element region 30b and element region 40b are covered and the element region 20b is opened. With the resist pattern 5e used as a mask, impurity implantation for adjusting the threshold voltage of the logic transistor 20 is performed on the semiconductor substrate 2 of the element region 20b. This impurity implantation is performed, for example, by implanting boron fluoride under the conditions: the accelerating energy of 15 keV and the dose amount of $1\times10^{13}$ cm$^{-2}$. Accordingly, the channel region 26 of the logic transistor 20 is formed as illustrated in FIG. 17.

Subsequently, the resist pattern 5e is removed, and an oxide film 7 is formed, for example, with a film thickness of 7 nm using thermal oxidation on the semiconductor substrate 2 of the element region 20b, element region 30b, and element region 40b, respectively, as illustrated in FIG. 18. Then, a resist pattern 5f is newly formed, in which the element region 20b is opened, and then the oxide film 7 formed on the semiconductor substrate 2 of the element region 20b is removed.

Next, the resist pattern 5f is removed, and an oxide film is formed, for example, with a film thickness of 1.8 nm on the semiconductor substrate 2 using thermal oxidation again. Accordingly, the gate insulating film 21, gate insulating film 31, and gate insulating film 41 each having a predetermined film thickness are formed in the element region 20b of the logic transistor 20, in the element region 30b of the I/O transistor 30, and in the element region 40b of the memory transistor 40, respectively, as illustrated in FIG. 19.

After formation of the gate insulating film 21, gate insulating film 31, and gate insulating film 41, the polysilicon 4 that is a gate electrode material is formed, for example, with a film thickness of 100 nm as illustrated in FIG. 20, and then the patterning of the polysilicon 4 is performed. Thus, the gate electrode 22 of the logic transistor 20, the gate electrode 32 of the I/O transistor 30, and the gate electrode 42 of the memory transistor 40 are formed.

After formation of the gate electrode 22, gate electrode 32, and gate electrode 42, a resist pattern 5g is formed, in which the element region 40b is opened, as illustrated in FIG. 21, and then with the resist pattern 5g used as a mask, impurity implantation is performed on the semiconductor substrate 2 of the element region 40b. With this impurity implantation, the LDD region 45a and LDD region 45b are formed in the semiconductor substrate 2 on both sides of the gate electrode 42, as illustrated in FIG. 21. The LDD region 45a and LDD region 45b are formed, for example, by implanting arsenic that is an n-type impurity under the conditions: the accelerating energy of 10 keV and the dose amount of $1\times10^{13}$ cm$^{-2}$. The channel region 46 of the memory transistor 40 is formed between the LDD region 45a and LDD region 45b above the previously formed relatively-high concentration impurity region 47.

Similarly, a resist pattern 5h is formed, in which the element region 30b is opened, as illustrated in FIG. 22, and then with the resist pattern 5h used as a mask, impurity implantation is performed on the semiconductor substrate 2 of the element region 30b to form the LDD region 35a and LDD region 35b of the I/O transistor 30. Moreover, as illustrated in FIG. 23, a resist pattern 5i is formed, in which the element region 20b is opened, and then with the resist pattern 5i used as a mask, impurity implantation is performed on the semiconductor substrate 2 of the element region 20b to form the LDD region 25a and LDD region 25b of the logic transistor 20. The LDD region 35a and LDD region 35b of the I/O transistor 30 illustrated in FIG. 22 are formed by implanting, for example, phosphorus that is an n-type impurity under the conditions: the accelerating energy of 35 keV and the dose amount of $3\times10^{13}$ cm$^{-2}$. The LDD region 25a and LDD region 25b of the logic transistor 20 illustrated in FIG. 23 are formed by implanting, for example, arsenic that is an n-type impurity under the conditions: the accelerating energy of 1.5 keV and the dose amount of $1\times10^{15}$ cm$^{-2}$. The channel region 36 of the I/O transistor 30 is formed between the LDD region 35a and the LDD region 35b, while the channel region 26 of the logic transistor 20 is formed between the LDD region 25a and the LDD region 25b.

Note that the sequence of the steps illustrated in FIGS. 21 to 23 may be interchanged with each other and performed.

Next, an insulating film, e.g., a silicon oxide film or a silicon nitride film, or a stacked film thereof is formed with a film thickness of 80 nm, which is then etched back. Accordingly, as illustrated in FIG. 24, the sidewall insulating film 23, sidewall insulating film 33, and sidewall insulating film 43 are formed on the respective sidewalls of the gate electrode 22, gate electrode 32, and gate electrode 42.

Note that, when only the sidewall insulating film 43 is formed in a stacked structure of an oxide film of silicon oxide or the like and a nitride film of silicon nitride or the like, the following steps may be performed after formation of the gate insulating film 21, gate insulating film 31, and gate insulating film 41 as in the above FIG. 19.

That is, after the step of the above FIG. 19, the polysilicon 4 is first formed on the gate insulating film 21, gate insulating film 31, and gate insulating film 41. Next, in accordance with the example of the step of the above FIG. 9 described in the third embodiment, the gate electrode 42 (element corresponding to the gate electrode 12 of FIG. 9) is formed in the element region 40b of the memory transistor 40. Next, in accordance with the example of the step of FIG. 10 (or FIG. 21), the LDD region 45a and LDD region 45b (elements corresponding to the LDD region 15a and LDD region 15b of FIG. 10) are formed in the element region 40b of the memory transistor 40. Next, in accordance with the example of the step of FIG. 11, an oxide film and nitride film (elements corresponding to the oxide film 13a and nitride film 13b of FIG. 11) are stacked and formed with a predetermined film thickness, and are then etched back to form the sidewall insulating film 43 (element corresponding to the sidewall insulating film 13 of FIG. 11) of the stacked structure of the oxide film and nitride film. Next, in accordance with the example of the step of FIG. 12, the polysilicon 4 of the element region 30*b* and element region 20*b* is patterned to form the gate electrode 32 and gate electrode 22.

Subsequently, in accordance with the example of the steps of FIGS. 22 and 23 described in the fourth embodiment, the LDD region 35*a* and LDD region 35*b* and the LDD region 25*a* and LDD region 25*b* are formed in the element region 30*b* and in the element region 20*b*, respectively. Then, a single layer of silicon oxide film is formed with a predetermined film thickness as the insulating film, and is then etched back to form the sidewall insulating film 33 and sidewall insulating film each having a single-layer structure in the element region 30*b* and in the element region 20*b*, respectively.

Accordingly, it is possible to form the sidewall insulating film 43 of the element region 40*b* in a stacked structure of an oxide film and a nitride film, form the sidewall insulating film 33 of the element region 30*b* and the sidewall insulating film 23 of the element region 20*b* in a single-layer structure, respectively, and obtain a structure as in FIG. 24. This facilitates the accumulation of charges in the sidewall insulating film 43, and also makes it possible to suppress the accumulation of charges into the sidewall insulating film 33 and sidewall insulating film 23, thereby minimizing the degradation of the performance of the I/O transistor 30 and logic transistor 20.

The steps may be changed as needed in accordance with the structure adopted for the sidewall insulating film 33, sidewall insulating film 43, and sidewall insulating film 23.

After performing the steps up to the step of FIG. 24 in the above-described manner, the process proceeds to the step of FIG. 25. Here, first, with the gate electrode 22 and the sidewall insulating film 23 of the side wall thereof, the gate electrode 32 and the sidewall insulating film 33 of the side wall thereof, and the gate electrode 42 and the sidewall insulating film 43 of the side wall thereof used as a mask, an n-type impurity, such as phosphorus, is implanted with respect to the semiconductor substrate 2. Such impurity implantation is performed by implanting phosphorus under the conditions: the accelerating energy of 8 keV and the dose amount of $1 \times 10^{16}$ cm$^{-2}$. Accordingly, as illustrated in FIG. 25, the n-type impurity region 24*a* and impurity region 24*b* which function as the source region or drain region of the logic transistor 20 are formed on the outside of the n-type LDD region 25*a* and LDD region 25*b* in the semiconductor substrate 2 of the element region 20*b*. Similarly, as illustrated in FIG. 25, the n-type impurity region 34*a* and impurity region 34*b* which function as the source region or drain region of the I/O transistor 30 are formed on the outside of the n-type LDD region 35*a* and LDD region 35*b* in the semiconductor substrate 2 of the element region 30*b*. As illustrated in FIG. 25, the n-type impurity region 44*a* and impurity region 44*b* which function as the source region or drain region of the memory transistor 40 are formed on the outside of the n-type LDD region 45*a* and LDD region 45*b* in the semiconductor substrate 2 of the element region 40*b*.

With the above-described steps, a semiconductor device 1D (nonvolatile memory), as illustrated in FIG. 25, having the logic transistor 20, I/O transistor 30, and memory transistor 40 mixedly mounted on the common semiconductor substrate 2 is obtained. Thereafter, the formation of an interlayer insulating film, the formation of a plug, and the formation of an upper wiring layer including the conductors, such as a wiring and a via, and the like are performed.

In the semiconductor device 1D according to the fourth embodiment, the channel region 46 having a lower impurity concentration is provided in the memory transistor 40, and the impurity region 47 having a relatively-high concentration is provided below the channel region 46. Accordingly, as described in the second embodiment, an improvement in the programming speed of the memory transistor 40 is achieved. The above-described steps make it possible to manufacture the semiconductor device 1D provided with the memory transistor 40 that exhibits an excellent programming speed.

Note that, although one memory transistor 40 is illustrated here, the semiconductor device 1D may include a plurality of memory transistors 40, or at least one memory transistor 40 and another memory transistor. Moreover, although one logic transistor 20 is illustrated here, the semiconductor device 1D may include a plurality of logic transistors 20, or at least one logic transistor 20 and another logic transistor. Moreover, although one I/O transistor 30 is illustrated here, the semiconductor device 1D may include a plurality of I/O transistors 30, or at least one I/O transistor 30 and another I/O transistor.

Next, a fifth embodiment will be described.

Here, as the fifth embodiment, a semiconductor device is described, in which a channel structure having a region with a high impurity concentration provided below a channel region with a low impurity concentration as described above is adopted for both a memory transistor and a logic transistor mixedly mounted with the memory transistor.

Figure 26:
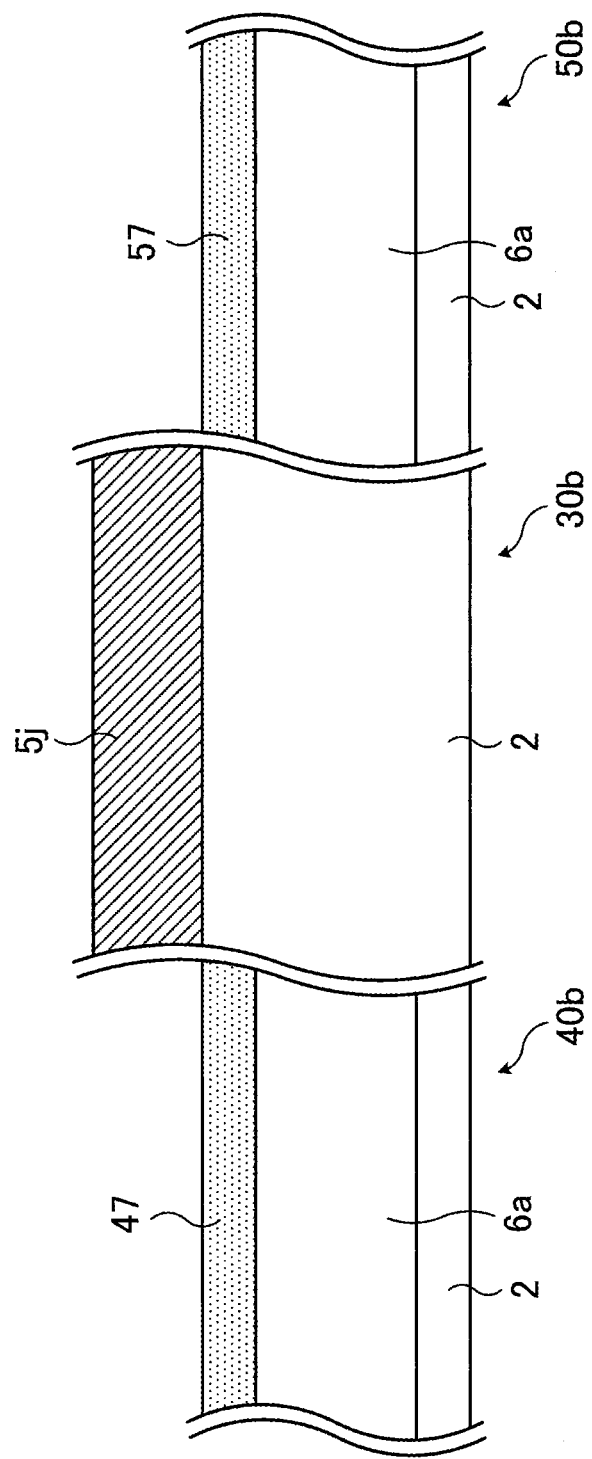
FIG. 26 is a view (part 1) illustrating an example of a method for manufacturing a semiconductor device according to a fifth embodiment.
Figure 27:
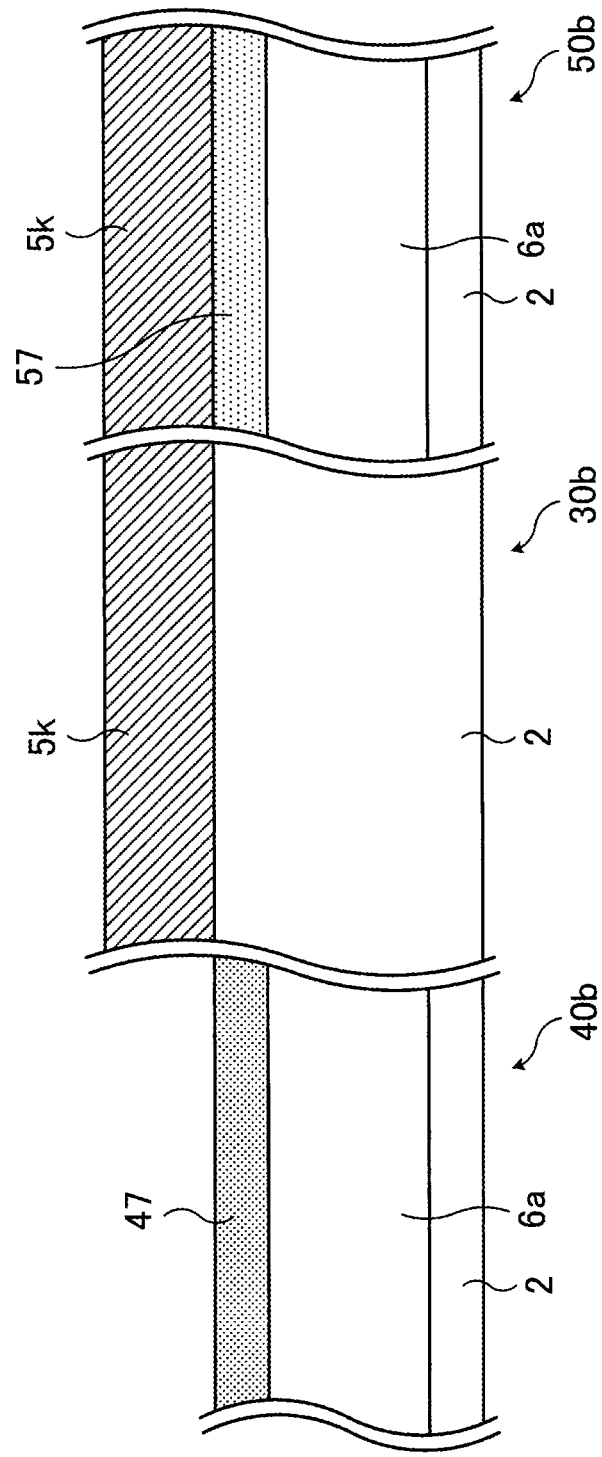
FIG. 27 is a view (part 2) illustrating an example of the method for manufacturing the semiconductor device according to the fifth embodiment.
Figure 28:
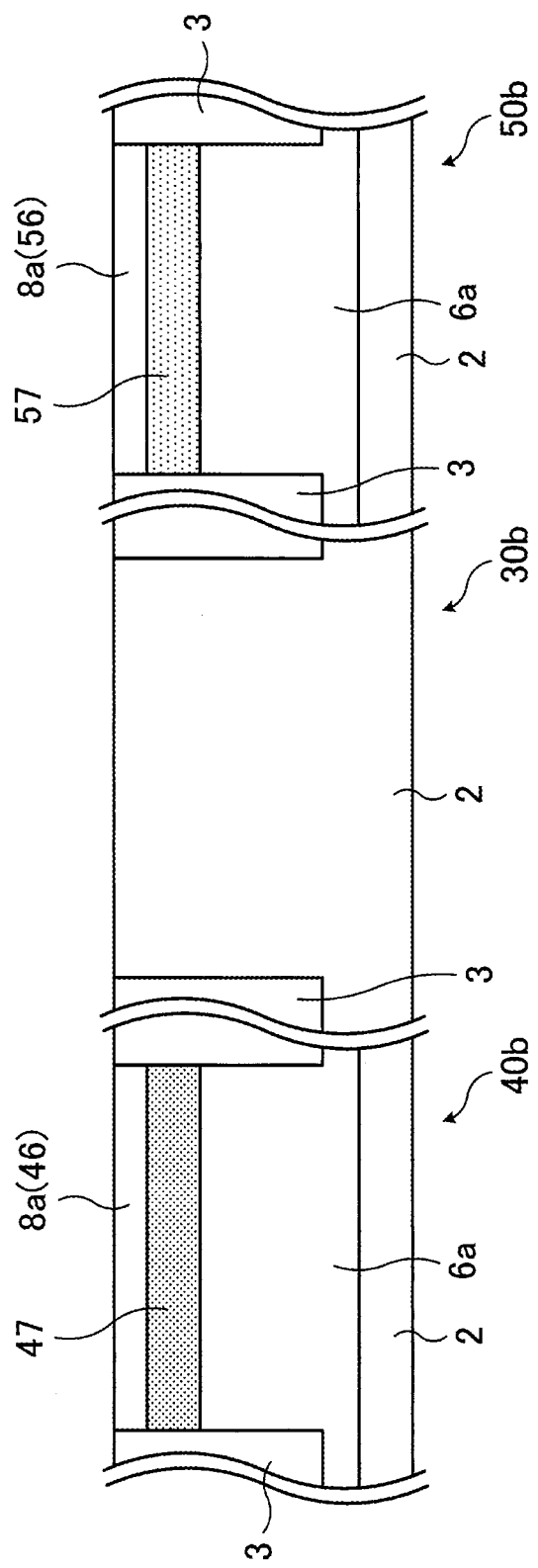
FIG. 28 is a view (part 3) illustrating an example of the method for manufacturing the semiconductor device according to the fifth embodiment.
Figure 29:
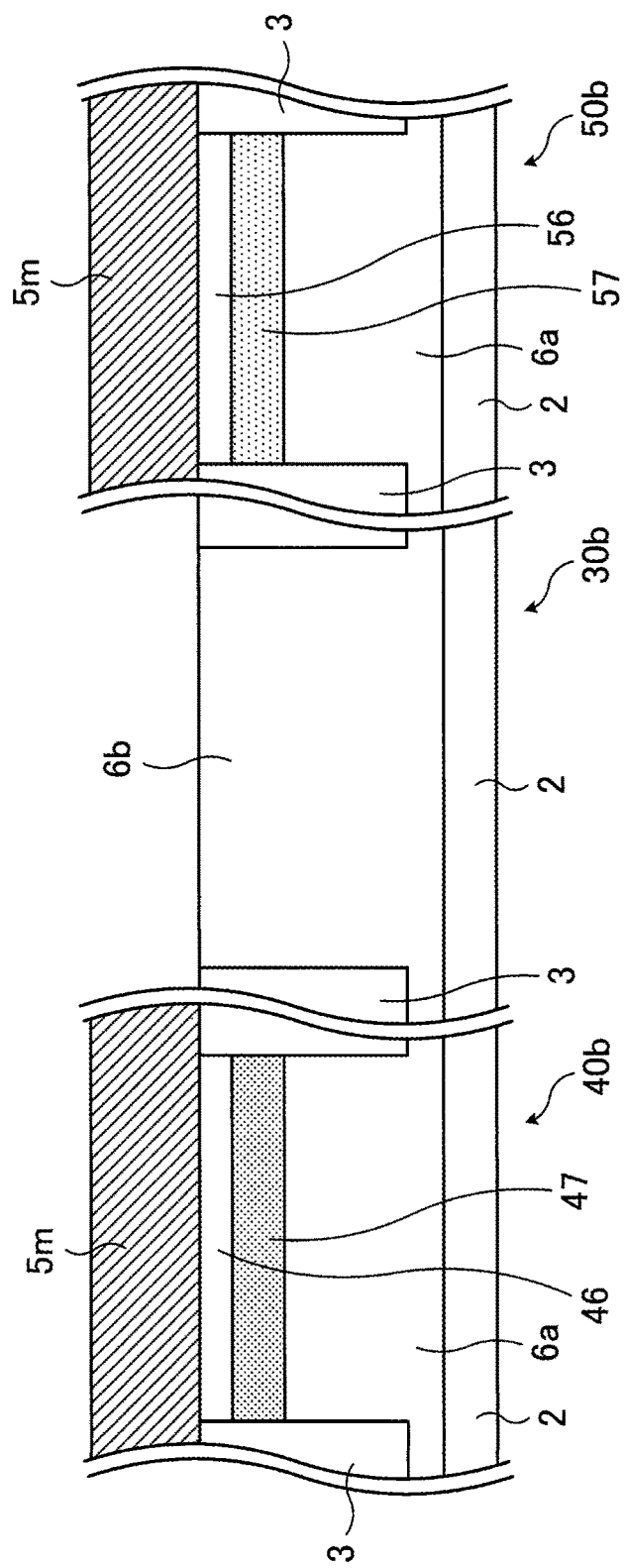
FIG. 29 is a view (part 4) illustrating an example of the method for manufacturing the semiconductor device according to the fifth embodiment.
Figure 30:
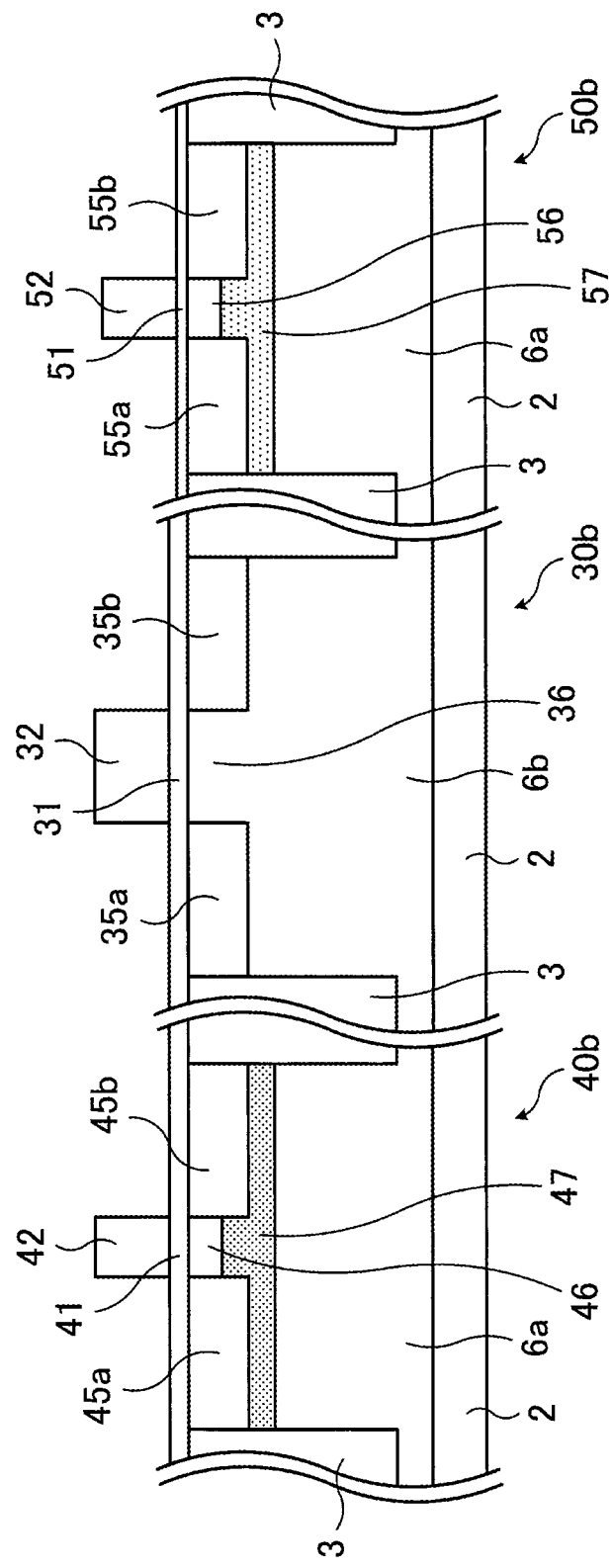
FIG. 30 is a view (part 5) illustrating an example of the method for manufacturing the semiconductor device according to the fifth embodiment.
Figure 31:
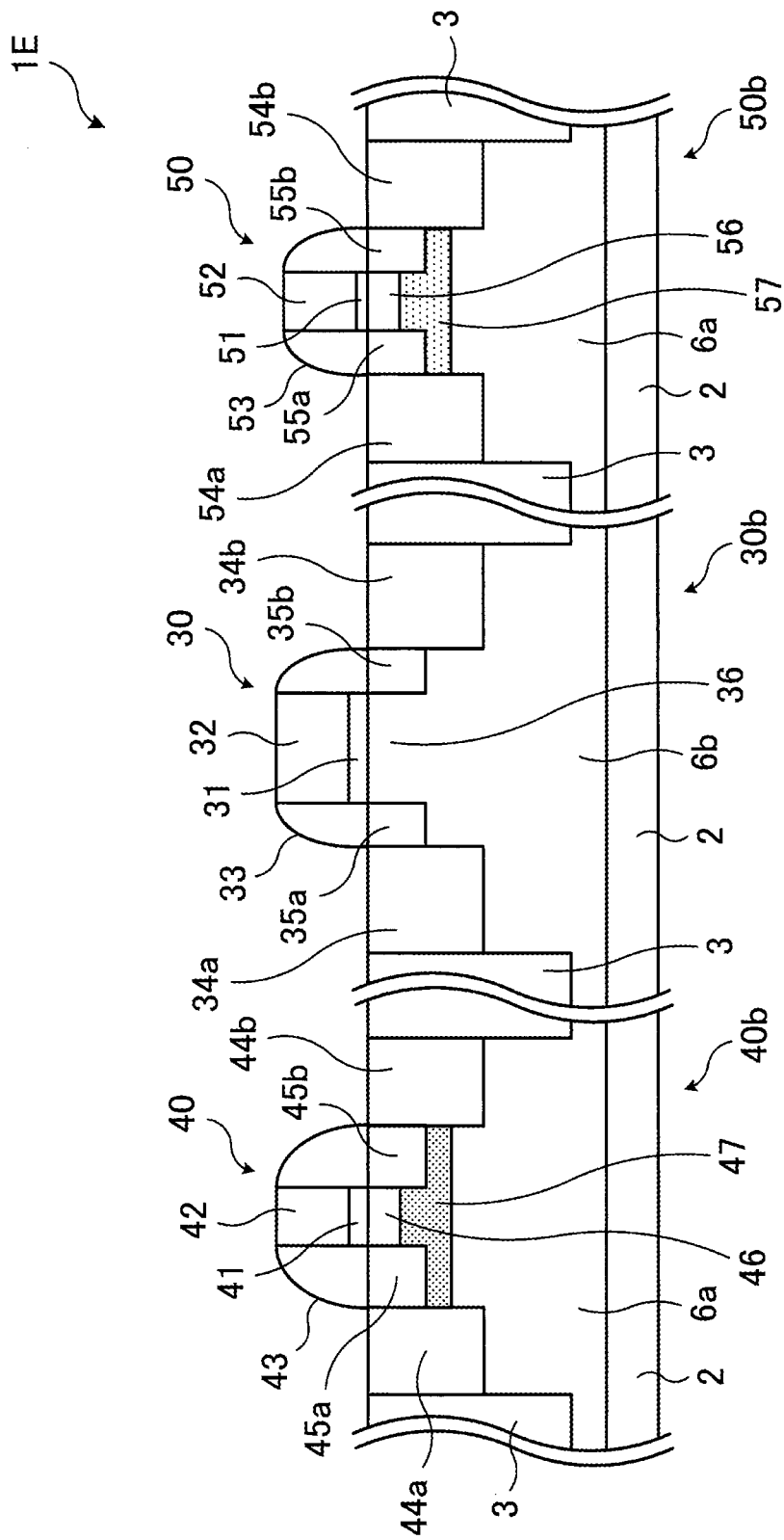
FIG. 31 is a view (part 6) illustrating an example of the method for manufacturing the semiconductor device according to the fifth embodiment.

FIGS. 26 to 31 illustrate an example of the method for manufacturing the semiconductor device according to the fifth embodiment. Here, FIG. 26 is an exemplary cross sectional schematic view of a main portion of the first manufacturing step, FIG. 27 is an exemplary cross sectional schematic view of the main portion of the second manufacturing step, FIG. 28 is an exemplary cross sectional schematic view of a main portion of the third manufacturing step, FIG. 29 is an exemplary cross sectional schematic view of a main portion of the fourth manufacturing step, FIG. 30 is an exemplary cross sectional schematic view of a main portion of the fifth manufacturing step, and FIG. 31 is an exemplary cross sectional schematic view of a main portion of the sixth manufacturing step. Hereinafter, an example of the manufacturing steps of the semiconductor device according to the fifth embodiment will be sequentially described with reference to FIGS. 26 to 31.

First, as illustrated in FIG. 26, a resist pattern 5*j*, in which the element region 40*b* of the memory transistor 40 (FIG. 31) and the element region 50*b* of the logic transistor 50 (FIG. 31) are opened and the element region 30*b* of the I/O transistor 30 (FIG. 31) is covered, is formed on the semiconductor substrate 2. With the resist pattern 5*j* used as a mask, a predetermined impurity implantation is performed on the semiconductor substrate 2 of the element region 40*b* and element region 50*b*. With this impurity implantation, the well region 6*a*, the impurity region 47 having a relatively-high concentration of the memory transistor 40, and the impurity region 57 having a relatively-high concentration of the logic transistor 50 are formed. The well region 6*a*, the impurity region 47, and the impurity region 57 each are of a p-type, for example.

The above-described impurity implantation is performed under the following conditions, for example. Boron is implanted under the conditions: the accelerating energy of 135 keV or 185 keV and the dose amount of $4 \times 10^{13}$ cm$^{-2}$. Germanium is implanted under the conditions: the accelerating energy of 30 keV and the dose amount of $5 \times 10^{14}$ cm$^{-2}$.

Carbon is implanted under the conditions: the accelerating energy of 5 keV and the dose amount of $5\times10^{14}$ cm$^{-2}$. Boron is implanted under the conditions: the accelerating energy of 20 keV and the dose amount of $5\times10^{12}$ cm$^{-2}$. Boron fluoride is implanted under the conditions: the accelerating energy of 10 keV and the dose amount of $1.5\times10^{12}$ cm$^{-2}$. By implanting each of these impurities under the predetermined conditions, respectively, the p-type well region 6a and the impurity region 47 are formed in the semiconductor substrate 2 of the element region 40b, and the p-type well region 6a and the impurity region 57 are formed in the semiconductor substrate 2 of the element region 50b. Note that implanting germanium and carbon suppresses the diffusion of the p-type impurities contained in the impurity region 47 and impurity region 57 into lower and/or upper regions.

When the logic transistor 50 to form is a super-low leakage transistor, the concentration of the impurity region 57 is set to be low as compared with the optimum concentration of the impurity region 47 of the memory transistor 40 in order to minimize a junction leak current.

Therefore, when the logic transistor 50 is formed as an ultra-low leakage transistor, impurity implantation with respect to the semiconductor substrate 2 of the element region 50b is performed under such conditions as to obtain the impurity region 57 having a concentration optimum for the logic transistor 50, in the step illustrated in FIG. 26. Further, as illustrated in FIG. 27, additional impurity implantation is performed on the semiconductor substrate 2 of the element region 40b of the memory transistor 40 to obtain the impurity region 47 having a concentration optimum for the memory transistor 40. The additional impurity implantation is performed, as illustrated in FIG. 27, with a resist pattern 5k, in which the element region 40b is opened, used as a mask, by implanting, for example, boron under the conditions: the accelerating energy of 20 keV and the dose amount of $2.5\times10^{13}$ cm$^{-2}$.

Thereafter, a semiconductor material is epitaxially grown on the semiconductor substrate 2 to form a semiconductor layer 8a (non-doped layer) on the impurity region 47 of the element region 40b and on the impurity region 57 of the element region 50b as illustrated in FIG. 28. The channel region 46 of the memory transistor 40 and the channel region 56 of the logic transistor 50 are formed in the semiconductor layer 8a. Note that, although a semiconductor layer similar to the semiconductor layer 8a of the element region 40b and element region 50b is formed also in the element region 30b due to the epitaxial growth, the former semiconductor layer is described as the layer integrated into the semiconductor substrate 2 for convenience here. After formation of the semiconductor layer 8a, the element isolating region 3 is formed which defines the element region 40b, the element region 30b, and the element region 50b, as illustrated in FIG. 28.

Next, as illustrated in FIG. 29, with a resist pattern 5m, in which the element region 30b is opened, used as a mask, impurity implantation is performed to form the well region 6b in the semiconductor substrate 2 of the element region 30b. The well region 6b is of a p-type, for example. Subsequently, impurity implantation for adjusting the threshold voltage of the I/O transistor 30 may be performed on the semiconductor substrate 2 of the element region 30b.

Thereafter, the steps similar to the steps in FIGS. 18 to 25 described in the above fourth embodiment are performed to obtain a structure illustrated in FIG. 30 and a structure as illustrated in FIG. 31.

That is, first in accordance with the example of steps of FIGS. 18 and 19, the gate insulating film 31, gate insulating film 41, and gate insulating film 51 each having a predetermined film thickness are formed in the element region 30b, in the element region 40b, and in the element region 50b, respectively, by thermal oxidation. Next, in accordance with the example of step of FIG. 20, the gate electrode 32, gate electrode 42, and gate electrode 52 are formed by forming and patterning polysilicon. Then, in accordance with the example of steps of FIGS. 21 to 23, the LDD region 45a and LDD region 45b, the LDD region 35a and LDD region 35b, and the LDD region 55a and LDD region 55b are formed by implanting an impurity under the predetermined conditions, respectively. The LDD region 45a and LDD region 45b, the LDD region 35a and LDD region 35b, and the LDD region 55a and LDD region 55b each are of an n-type, for example. Accordingly, the structure as illustrated in FIG. 30 is obtained. The channel region 36 of the I/O transistor 30 is formed between the LDD region 35a and LDD region 35b. The channel region 46 of the memory transistor 40 is formed between the LDD region 45a and LDD region 45b. The channel region 56 of the logic transistor 50 is formed between the LDD region 55a and the LDD region 55b.

Furthermore, by forming and etching back an insulating film in accordance with the example of step of FIG. 24, the sidewall insulating film 33, sidewall insulating film 43, and sidewall insulating film 53 are formed on the respective sidewalls of the gate electrode 32, gate electrode 42, and gate electrode 52. Then, in accordance with the example of step of FIG. 25, an impurity region that functions as the source region or drain region of the I/O transistor 30, memory transistor 40, and logic transistor 50 is formed by implanting an impurity under the predetermined conditions. That is, the n-type impurity region 34a and impurity region 34b which function as the source region or drain region of the I/O transistor 30 are formed on the outside of the n-type LDD region 35a and LDD region 35b in the semiconductor substrate 2 of the element region 30b. Similarly, the n-type impurity region 44a and impurity region 44b which function as the source region or drain region of the memory transistor 40 are formed on the outside of the n-type LDD region 45a and LDD region 45b in the semiconductor substrate 2 of the element region 40b. The n-type impurity region 54a and impurity region 54b which function as the source region or drain region of the logic transistor 50 are formed on the outside of the n-type LDD region 55a and LDD region 55b in the semiconductor substrate 2 of the element region 50b. Accordingly, the structure as illustrated in FIG. 31 is obtained.

Note that, the sidewall insulating film 33, sidewall insulating film 43, and sidewall insulating film 53 may each have a single-layer structure of an oxide film or a nitride film, or a stacked structure of an oxide film and a nitride film. As described in the above fourth embodiment, the steps may be changed as needed in accordance with a structure adopted for the sidewall insulating film 33, sidewall insulating film 43, and sidewall insulating film 53.

With the above-described steps, a semiconductor device 1E (nonvolatile memory) having the I/O transistor 30, memory transistor 40, and logic transistor 50 mixedly mounted on the common semiconductor substrate 2 is obtained. Thereafter, the formation of an interlayer insulating film, the formation of a plug, and the formation of an upper wiring layer including the conductors, such as a wiring and a via, and the like are performed.

In the semiconductor device 1E according to the fifth embodiment, the channel region 46 having a lower impurity concentration is provided in the memory transistor 40 and the impurity region 47 having a relatively-high concentration is provided below the channel region 46. Accordingly, as described in the above second embodiment, an improvement in the programming speed of the memory transistor 40 is achieved. Furthermore, in the semiconductor device 1E according to the fifth embodiment, the channel region 56 having a lower impurity concentration is provided also in the logic transistor 50, and the impurity region 57 having a relatively-high concentration is provided below the channel region 56. Accordingly, a reduction of the variation of the threshold voltage, a reduction of the power consumption, and the like of the logic transistor 50 are achieved. The above-described steps make it possible to manufacture the semiconductor device 1E provided with the memory transistor 40 that exhibits an excellent programming speed and the logic transistor 50 that exhibits an excellent operation performance.

Note that, here, a case is illustrated, where the logic transistor 50 having an ultra-low leakage is assumed, and impurity implantation is firstly performed under such conditions as to obtain the impurity region 57 having a concentration optimum for the logic transistor 50 (FIG. 26), and then an additional impurity implantation is performed to obtain the impurity region 47 having a concentration optimum for the memory transistor 40 (FIG. 27).

On the other hand, when the constraint on the power consumption of the whole semiconductor device 1E is relaxed, the constraint on the leakage current of the logic transistor 50 is also relaxed. In this case, the impurity region 57 of the logic transistor 50 may be made to have a higher impurity concentration. As the conditions for the impurity implantation in this case, the following may be adopted. Boron is implanted under the conditions: the accelerating energy of 135 keV or 185 keV and the dose amount of $4 \times 10^{13}$ cm$^{-2}$. Germanium is implanted under the conditions: the accelerating energy of 30 keV and the dose amount of $5 \times 10^{14}$ cm$^{-2}$. Carbon is implanted under the conditions: the accelerating energy of 5 keV and the dose amount of $5 \times 10^{14}$ cm$^{-2}$. Boron is implanted under the conditions: the accelerating energy of 20 keV and the dose amount of $1.8 \times 10^{13}$ cm$^{-2}$. Boron fluoride is implanted under the conditions: the accelerating energy of 25 keV and the dose amount of $6 \times 10^{12}$ cm$^{-2}$. Boron fluoride is implanted under the conditions: the accelerating energy of 10 keV and the dose amount of $3.0 \times 10^{12}$ cm$^{-2}$. In the step of FIG. 26, the p-type well region 6a, impurity region 47, and impurity region 57 are formed in the semiconductor substrate 2 by implanting each impurity under such conditions. Thereafter, the step of FIG. 28 and the subsequent steps may be performed without going through the step of FIG. 27. When such an approach is adopted, the threshold voltage of the memory transistor 40 becomes slightly high as compared with the above-described approach (FIGS. 26 and 27) in which an additional impurity implantation is performed to obtain the impurity region 47. However, because the constraint on the power consumption of the whole semiconductor device 1E is relaxed, it is possible to cope with such a problem by increasing the read voltage of the memory transistor 40.

Moreover, when the constraint on the leakage current is relaxed and the impurity region 57 of the logic transistor 50 may be made to have a higher impurity concentration, the following approach may be used. That is, in the step of FIG. 26, impurity implantation is simultaneously performed on the semiconductor substrate 2 of the element region 40b and element region 50b under such conditions as to obtain the impurity region 47 having a concentration optimum for the memory transistor 40. Accordingly, the impurity region 47 having a concentration optimum for the memory transistor 40 is formed in the semiconductor substrate 2 of the element region 40b, and the impurity region 57 having a concentration equal to that of the impurity region 47 is formed in the semiconductor substrate 2 of the element region 50b of the logic transistor 50. Thereafter, the step of FIG. 28 and the subsequent steps may be performed without going through the step of FIG. 27. When the constraint on the leakage current of the logic transistor 50 is relaxed, such an approach may be used.

Moreover, when the constraint on the leakage current is relaxed and the impurity region 57 of the logic transistor 50 may be made to have a higher impurity concentration, the following approach may be used. That is, in the step of FIG. 26, impurity implantation is performed under such conditions as to obtain an impurity region having a concentration higher than the concentration optimum for the logic transistor 50 of the ultra-low leakage and also to obtain an impurity region having a concentration lower than the concentration optimum for the memory transistor 40. Under such conditions, impurity implantation is simultaneously performed on the semiconductor substrate 2 of the element region 40b and the element region 50b to form the impurity region 47 having a lower concentration and the impurity region 57 having a higher concentration as compared with the above-described approach (FIGS. 26 and 27). Thereafter, the step of FIG. 28 and the subsequent steps may be performed without going through the step of FIG. 27. When the constraint on the leakage current of the logic transistor 50 is relaxed, such an approach may be used.

In either of the approaches described about the impurity region 47 and impurity region 57, the step of an additional impurity implantation as illustrated in FIG. 27 may be omitted to reduce the manufacturing steps of the semiconductor device 1E.

Note that, although one memory transistor 40 is illustrated here, the semiconductor device 1E may include a plurality of memory transistors 40, or at least one memory transistor 40 and another memory transistor. Moreover, although one logic transistor 50 is illustrated here, the semiconductor device 1E may include a plurality of logic transistors 50, or at least one logic transistor 50 and another logic transistor. Moreover, although one I/O transistor 30 is illustrated here, the semiconductor device 1E may include a plurality of I/O transistors 30, or at least one I/O transistor 30 and another I/O transistor.

Next, a sixth embodiment will be described.

Figure 32:
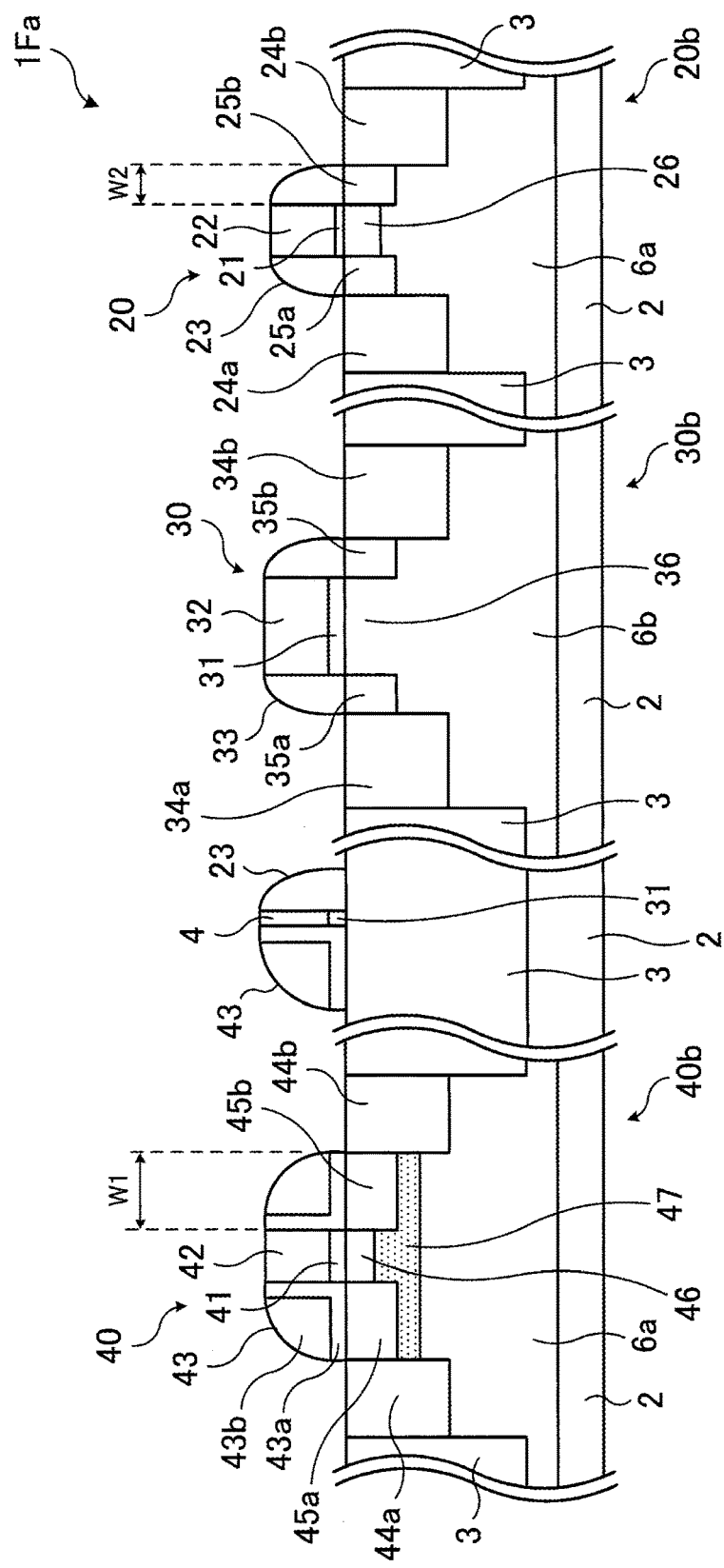
FIG. 32 illustrates a first configuration example of a semiconductor device according to a sixth embodiment.

FIG. 32 illustrates a first configuration example of a semiconductor device according to the sixth embodiment. FIG. 32 schematically illustrates the cross section of a main portion of the first configuration example of the semiconductor device.

A semiconductor device 1Fa illustrated in FIG. differs from the semiconductor device 1D (FIG. 25) described in the above fourth embodiment in that it includes the memory transistor 40 having the sidewall insulating film 43 with the width W1 larger than the width W2 of the sidewall insulating film 23 of the logic transistor 20. Note that the sidewall insulating film 43 having a stacked structure of the oxide film 43a and nitride film 43b is illustrated in FIG. 32.

The semiconductor device 1Fa as illustrated in FIG. 32 may be obtained, for example, by forming each element in accordance with the example of steps of FIGS. 8 to 13 described in the above third embodiment after performing the steps of FIGS. 14 to 17 described in the above fourth embodiment.

That is, the steps of FIGS. 14 to 17 are first performed to obtain the semiconductor substrate 2, as in the above FIG.

17, including the element region 40b of the memory transistor 40, the element region 30b of the I/O transistor 30, and the element region 20b of the logic transistor 20, each element region being defined by the element isolating region 3. The element region 40b of the memory transistor 40 includes the well region 6a, the impurity region 47, and the channel region 46 (semiconductor layer 8). The element region 30b of the I/O transistor 30 includes the well region 6b. The element region 20b of the logic transistor 20 includes the well region 6b and the channel region 26. The well region 6a, the well region 6b, and the impurity region 47 each are of a p-type, for example.

Subsequently, in accordance with the example of FIG. 8, the gate insulating film 41 (element corresponding to the gate insulating film 11 of FIG. 8), gate insulating film 31, and gate insulating film 21 each having a predetermined film thickness are formed in the element region 40b, the element region 30b, and the element region 20b, respectively, and then the polysilicon 4 is formed on these gate insulating films.

Next, in accordance with the example of FIG. 9, the polysilicon 4 is patterned to form the gate electrode (element corresponding to the gate electrode 12 of FIG. 9) of the memory transistor 40.

Next, in accordance with the example of FIG. 10, the LDD region 45a and LDD region 45b of the memory transistor 40 (elements corresponding to the LDD region 15a and LDD region 15b of FIG. 10) are formed by impurity implantation. The LDD region 45a and LDD region 45b are of an n-type, for example.

Next, in accordance with the example of FIG. 11, the oxide film 43a and the nitride film 43b (elements corresponding to the oxide film 13a and the nitride film 13b of FIG. 11) are formed and etched back. Accordingly, the sidewall insulating film 43 (element corresponding to the sidewall insulating film 13 of FIG. 11) of the memory transistor 40 having the predetermined width W1 is formed.

Next, in accordance with the example of FIG. 12, the polysilicon 4 of the element region 30b and element region 20b is patterned to form the gate electrode 32 of the I/O transistor 30 and the gate electrode 22 of the logic transistor 20.

Next, in accordance with the example of FIG. 13, the LDD region 35a and LDD region 35b are formed in the semiconductor substrate 2 of the element region 30b, and the LDD region 25a and LDD region 25b are formed in the semiconductor substrate 2 of the element region 20b. The LDD region 35a and LDD region 35b and the LDD region 25a and LDD region 25b each are of an n-type, for example. Furthermore, the sidewall insulating film 33 and sidewall insulating film 23 are formed on the side wall of the gate electrode 32 of the element region 30b and on the side wall of the gate electrode 22 of the element region 20b, respectively, by forming and etching back an insulating film. Then, the impurity region 44a and impurity region 44b (elements corresponding to the impurity region 14a and impurity region 14b of FIG. 13) which function as the source region or drain region of the memory transistor 40 are formed in the element region 40b by impurity implantation. Similarly, the impurity region 34a and impurity region 34b which function as the source region or drain region of the I/O transistor 30 are formed in the element region 30b by impurity implantation, and the impurity region 24a and impurity region 24b which function as the source region or drain region of the logic transistor 20 are formed in the element region 20b. The impurity region 44a and impurity region 44b, the impurity region 34a and impurity region 34b, and the impurity region 24a and impurity region 24b each are of an n-type, for example.

With such steps, the semiconductor device 1Fa (nonvolatile memory) as illustrated in FIG. 32 is obtained. Thereafter, the formation of an interlayer insulating film, the formation of a plug, and the formation of an upper wiring layer including the conductors, such as a wiring and a via, and the like are performed.

In the semiconductor device 1Fa of the first configuration example according to the sixth embodiment, the channel region 46 having a lower impurity concentration is provided in the memory transistor 40, and the impurity region 47 having a relatively-high concentration is provided below the channel region 46. Furthermore, the width W1 of the sidewall insulating film 43 of the logic transistor 40 is set to be larger than the width W2 of the sidewall insulating film 23 of the logic transistor 20 (and the sidewall insulating film 33 of the I/O transistor 30). These configurations contribute to an improvement in the programming speed of the memory transistor 40, as described in the above first and second embodiments. Adoption of these configurations makes it possible to realize the semiconductor device 1Fa provided with the memory transistor 40 exhibiting an excellent programming speed.

Note that, although one memory transistor 40 is illustrated here, the semiconductor device 1Fa may include a plurality of memory transistors 40, or at least one memory transistor 40 and another memory transistor. Moreover, although one logic transistor 20 is illustrated here, the semiconductor device 1Fa may include a plurality of logic transistors 20, or at least one logic transistor 20 and another logic transistor. Moreover, although one I/O transistor 30 is illustrated here, the semiconductor device 1Fa may include a plurality of I/O transistors 30, or at least one I/O transistor 30 and another I/O transistor.

Figure 33:
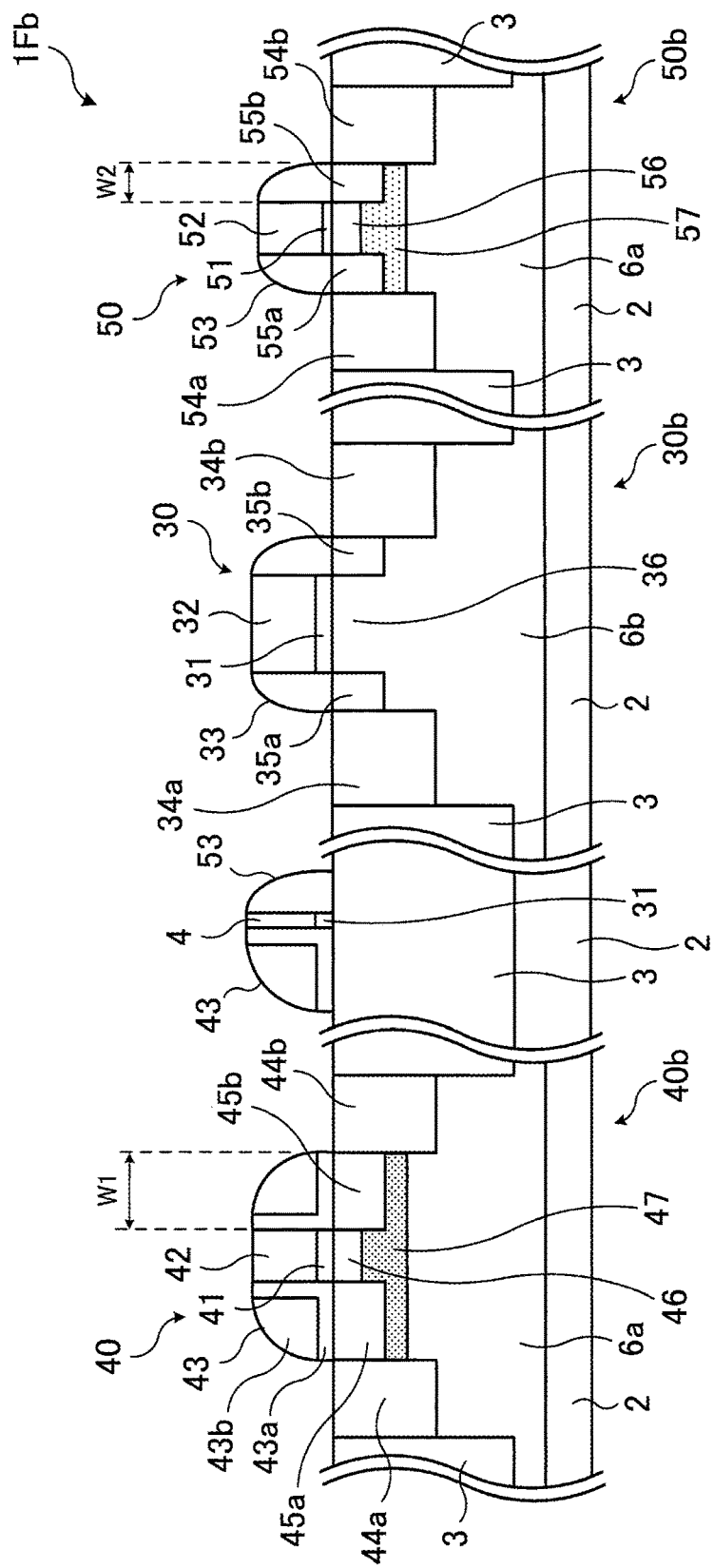
FIG. 33 illustrates a second configuration example of the semiconductor device according to the sixth embodiment.

FIG. 33 illustrates a second configuration example of the semiconductor device according to the sixth embodiment. FIG. 33 schematically illustrates the cross section of a main portion of the second configuration example of the semiconductor device.

A semiconductor device 1Fb illustrated in FIG. differs from the semiconductor device 1E (FIG. 31) described in the above fifth embodiment in that it includes the memory transistor 40 having the sidewall insulating film 43 with the width W1 larger than the width W2 of the sidewall insulating film 53 of the logic transistor 50. Note that the sidewall insulating film 43 having a stacked structure of the oxide film 43a and nitride film 43b is illustrated in FIG. 33.

The semiconductor device 1Fb as illustrated in FIG. 33 may be obtained, for example, by forming each element in accordance with the example of steps of FIGS. 8 to 13 described in the above third embodiment after performing the steps of FIGS. 26 to 29 described in the above fifth embodiment.

That is, the steps of FIGS. 26 to 29 are first performed to obtain the semiconductor substrate 2, as illustrated in FIG. 29, including the element region 40b of the memory transistor 40, the element region 30b of the I/O transistor 30, and the element region 50b of the logic transistor 50, each element region being defined by the element isolating region 3. The element region 40b of the memory transistor 40 includes the well region 6a, the impurity region 47, and the channel region 46 (semiconductor layer 8a). The element region 30b of the I/O transistor 30 includes the well region 6b. The element region 20b of the logic transistor 20 includes the well region 6a, the impurity region 57, and the channel region 56 (semiconductor layer 8a). The well region 6a, the well region 6b, the impurity region 47, and the impurity region 57 each are of a p-type, for example.

Subsequently, the gate insulating film 41 (element corresponding to the gate insulating film 11 of FIG. 8), gate insulating film 31, and gate insulating film (element corresponding to the gate insulating film 21 of FIG. 8) each having a predetermined film thickness are formed in the element region 40b, the element region 30b, and the element region 50b, respectively, in accordance with the example of FIG. 8. Furthermore, the polysilicon 4 is formed on these gate insulating films.

Next, in accordance with the example of FIG. 9, the polysilicon 4 is patterned to form the gate electrode (element corresponding to the gate electrode 12 of FIG. 9) of the memory transistor 40.

Next, in accordance with the example of FIG. 10, the LDD region 45a and LDD region 45b (elements corresponding to the LDD region 15a and LDD region 15b of FIG. 10) of the memory transistor 40 are formed by impurity implantation. The LDD region 45a and LDD region 45b are of an n-type, for example.

Next, in accordance with the example of FIG. 11, the oxide film 43a and the nitride film 43b (elements corresponding to the oxide film 13a and the nitride film 13b of FIG. 11) are formed and etched back. Accordingly, the sidewall insulating film 43 (element corresponding to the sidewall insulating film 13 of FIG. 11) of the memory transistor 40 having the predetermined width W1 is formed.

Next, in accordance with the example of FIG. 12, the polysilicon 4 of the element region 30b and element region 20b is patterned to form the gate electrode 32 of the I/O transistor 30 and the gate electrode 52 (element corresponding to the gate electrode 22 of FIG. 12) of the logic transistor 50.

Next, in accordance with the example of FIG. 13, the LDD region 35a and LDD region 35b are formed in the semiconductor substrate 2 of the element region 30b, and the LDD region 55a and the LDD region 55b (elements corresponding to the LDD region 25a and the LDD region 25b of FIG. 13) are formed in the semiconductor substrate 2 of the element region 50b. The LDD region 35a and LDD region 35b and the LDD region 55a and LDD region 55b each are of an n-type, for example. Furthermore, the sidewall insulating film 33 and sidewall insulating film 53 (element corresponding to the sidewall insulating film 23 of FIG. 13) are formed on the side wall of the gate electrode 32 of the element region 30b and on the side wall of the gate electrode 52 of the element region 50b, respectively, by forming and etching back an insulating film. Then, the impurity region 44a and impurity region 44b (elements corresponding to the impurity region 14a and impurity region 14b of FIG. 13) which function as the source region or drain region of the memory transistor 40 are formed in the element region 40b by impurity implantation. Similarly, by impurity implantation, the impurity region 34a and impurity region 34b which function as the source region or drain region of the I/O transistor are formed in the element region 30b. The impurity region 54a and impurity region 54b (elements corresponding to the impurity region 24a and impurity region 24b of FIG. 13) which function as the source region or drain region of the logic transistor 50 are formed in the element region 50b. The impurity region 44a and impurity region 44b, the impurity region 34a and impurity region 34b, and the impurity region 54a and impurity region 54b each are of an n-type, for example.

With these steps, the semiconductor device 1Fb (nonvolatile memory) as illustrated in FIG. 33 is obtained. Thereafter, the formation of an interlayer insulating film, the formation of a plug, and the formation of an upper wiring layer including the conductors, such as a wiring and a via, and the like are performed.

In the semiconductor device 1Fb of the second configuration example according to the sixth embodiment, the channel region 46 having a lower impurity concentration is provided in the memory transistor 40, and the impurity region 47 having a relatively-high concentration is provided below the channel region 46. Furthermore, the width W1 of the sidewall insulating film 43 of the memory transistor 40 is set to be larger than the width W2 of the sidewall insulating film 23 of the logic transistor 20 (and the sidewall insulating film 33 of the I/O transistor 30). These configurations contribute to an improvement in the programming speed of the memory transistor 40, as described in the above first and second embodiments. Moreover, also in the logic transistor 50 as with the memory transistor 40, the channel region 56 having a lower impurity concentration is provided, and the impurity region 57 having a relatively-high concentration is provided below the channel region 56, thereby achieving a reduction of the variation of the threshold voltage, a reduction of the power consumption, and the like. Adoption of these configurations makes it possible to realize the semiconductor device 1Fb provided with the memory transistor 40 exhibiting an excellent programming speed and the logic transistor 50 exhibiting an excellent operational performance.

Note that, although one memory transistor 40 is illustrated here, the semiconductor device 1Fb may include a plurality of memory transistors 40, or at least one memory transistor 40 and another memory transistor.

Moreover, although one logic transistor 50 is illustrated here, the semiconductor device 1Fb may include a plurality of logic transistors 50, or at least one logic transistor 50 and another logic transistor. Moreover, although one I/O transistor 30 is illustrated here, the semiconductor device 1Fb may include a plurality of I/O transistors 30, or at least one I/O transistor 30 and another I/O transistor.

Next, a seventh embodiment will be described.

For example, in order to increase the generation of hot carriers in the memory transistor 40 provided with the impurity region 47 having a relatively-high concentration below the channel region 46 having a lower impurity concentration, the following approach may be adopted: i.e., an approach for making steeper the concentration distribution of the impurity region 44a and impurity region 44b which function as the source region or drain region of the memory transistor 40. In order to make steeper the concentration distribution of the impurity region 44a and impurity region 44b of the memory transistor 40, the steps as illustrated in FIGS. 34 and 35 are performed, for example.

Figure 34:
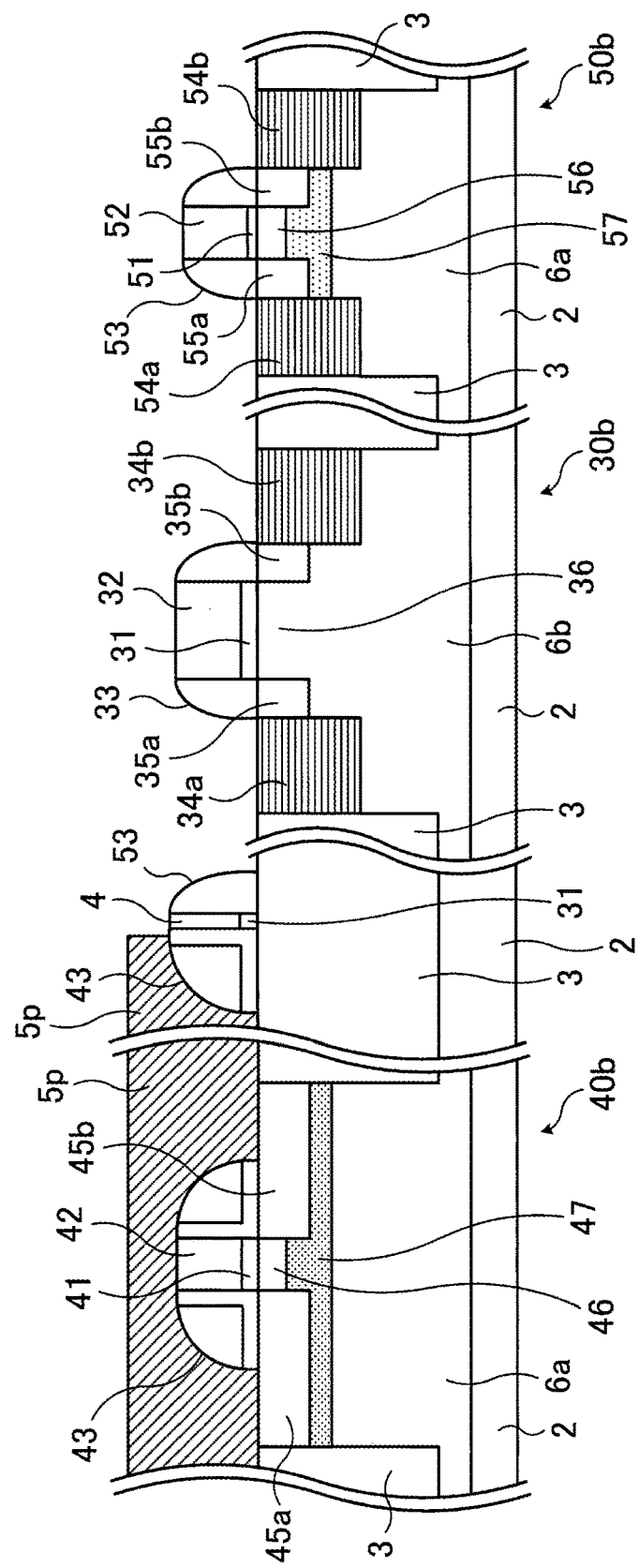
FIG. 34 is a view (part 1) illustrating an example of a method for manufacturing a semiconductor device according to a seventh embodiment.
Figure 35:
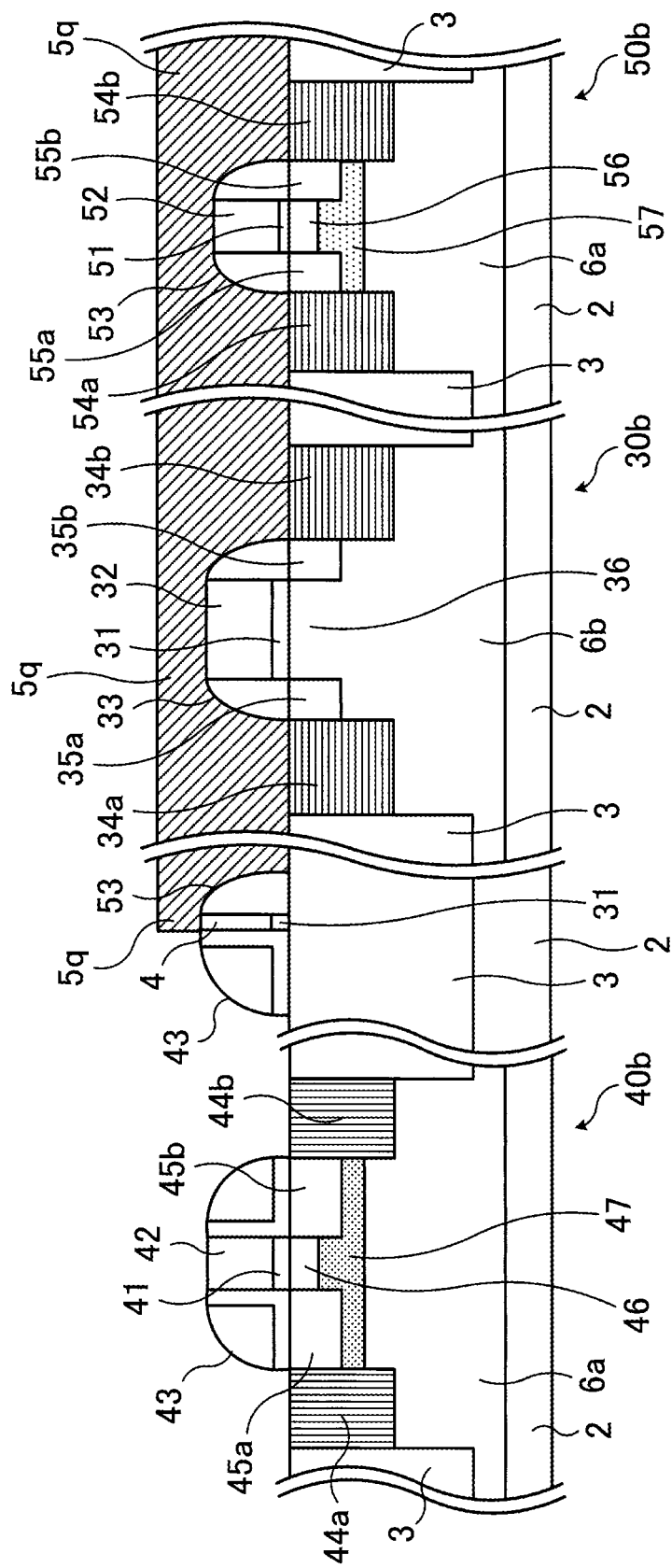
FIG. 35 is a view (part 2) illustrating an example of a method for manufacturing the semiconductor device according to the seventh embodiment.

FIGS. 34 and 35 illustrate an example of the method for manufacturing a semiconductor device according to the seventh embodiment. Here, FIG. 34 is an exemplary cross sectional schematic view of a main portion of the first manufacturing step, while FIG. 35 is an exemplary cross sectional schematic view of the main portion of the second manufacturing step. Hereinafter, an example of the manufacturing steps of the semiconductor device according to the seventh embodiment will be sequentially described with reference to FIGS. 34 and 35.

Here, a case is taken as an example, where the concentration distribution of the impurity region 44a and impurity region 44b of the memory transistor 40 of the semiconductor device 1Fb (FIG. 33) taken as the second configuration example in the above sixth embodiment is made steeper. In this case, impurity implantation with respect to the element region 40b of the memory transistor 40 and impurity implantation with respect to the element region 30b of the I/O transistor 30 and with respect to the element region 50b of the logic transistor 50 are performed in separate steps, not simultaneously (collectively).

For example, after formation of the sidewall insulating film 33, sidewall insulating film 43, and sidewall insulating film 53, a resist pattern 5p that covers the element region 40b of the memory transistor 40 is formed first as illustrated in FIG. 34. With the resist pattern 5p used as a mask, impurity implantation is performed to form the impurity region 34a and impurity region 34b of the I/O transistor 30 and the impurity region 54a and impurity region 54b of the logic transistor 50. This impurity implantation is performed, for example, by implanting phosphorus under the conditions: the accelerating energy of 8 keV and the dose amount of $1 \times 10^{16}$ cm$^{-2}$.

Next, the resist pattern 5p is removed, and as illustrated in FIG. 35, a resist pattern 5q that covers the element region 30b of the I/O transistor 30 and the element region 50b of the logic transistor 50 is formed. With the resist pattern 5q used as a mask, impurity implantation is performed to form the impurity region 44a and impurity region 44b of the memory transistor 40. This impurity implantation is performed, for example, by implanting arsenic under the conditions: the accelerating energy of 5 keV and the dose amount of $5 \times 10^{15}$ cm$^{-2}$. Use of such conditions makes it possible to obtain the impurity region 44a and impurity region 44b each having a concentration distribution steeper than that of the impurity region 34a and impurity region 34b of the I/O transistor 30 and than that of the impurity region 54a and impurity region 54b of the logic transistor 50. The resist pattern 5q is removed after the impurity implantation.

Performing such steps makes it possible to realize a semiconductor device (nonvolatile memory) provided with the memory transistor 40 which includes the impurity region 44a and impurity region 44b having a steeper concentration distribution and which is capable of increasing the generation of hot carriers.

Note that, although one memory transistor 40 is illustrated here, the above-described semiconductor device may include a plurality of memory transistors 40, or at least one memory transistor 40 and another memory transistor. Moreover, although one logic transistor 50 is illustrated here, the above-described semiconductor device may include a plurality of logic transistors 50, or at least one logic transistor 50 and another logic transistor. Moreover, although one I/O transistor 30 is illustrated here, the above-described semiconductor device may include a plurality of I/O transistors 30, or at least one I/O transistor 30 and another I/O transistor.

Here, a case has been taken and described as an example, where the concentration distribution of the impurity region 44a and impurity region 44b of the memory transistor 40 of the semiconductor device 1Fb (FIG. 33) taken as the second configuration example in the sixth embodiment is made steeper. The approach for making steeper the concentration distribution of an impurity region in this manner is similarly applicable also to the memory transistor 10 described in the third embodiment, and to the memory transistor 40 described in the fourth and fifth embodiments and described in the first configuration example of the sixth embodiment to obtain the same effect as the above-described effect.

Next, an eighth embodiment will be described.

Below the channel region of the memory transistor described above, or below the impurity region having a relatively-high concentration provided below the channel region, a region containing a relatively high-concentration impurity (high-concentration embedded layer) may be further provided. Here, as the eighth embodiment, a semiconductor device including a memory transistor provided with such a high-concentration embedded layer will be described.

Figure 36:
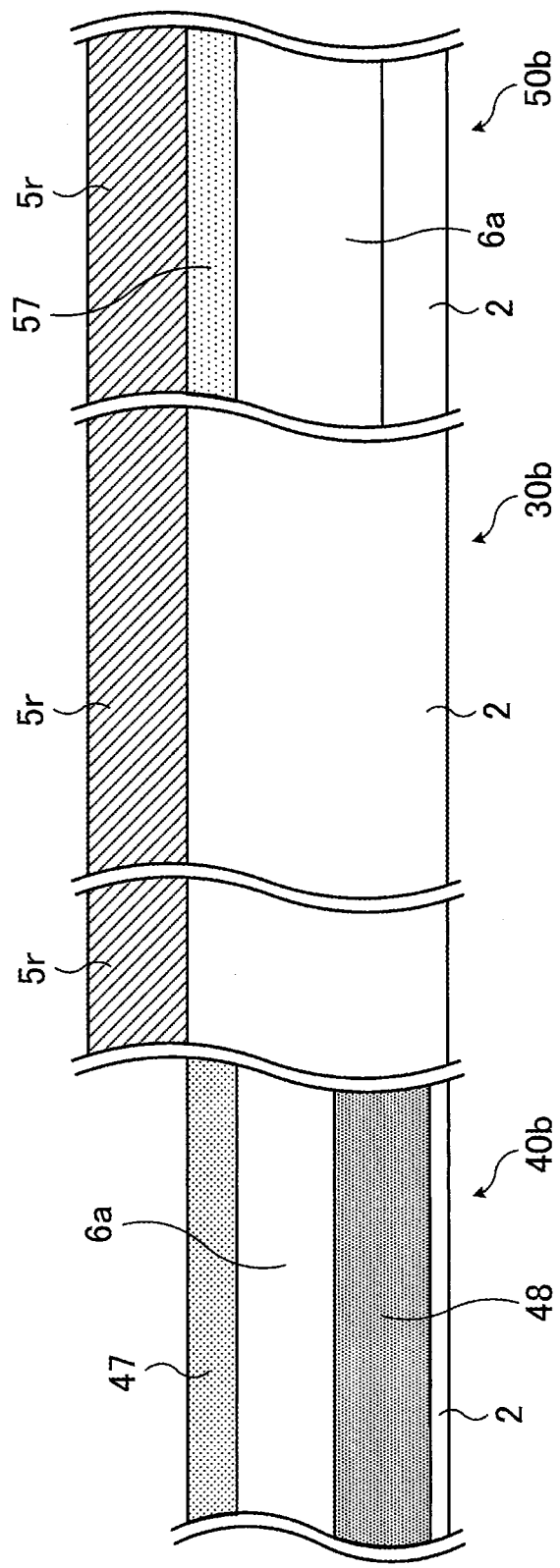
FIG. 36 is a view (part 1) illustrating an example of a method for manufacturing a semiconductor device according to an eighth embodiment.
Figure 37:
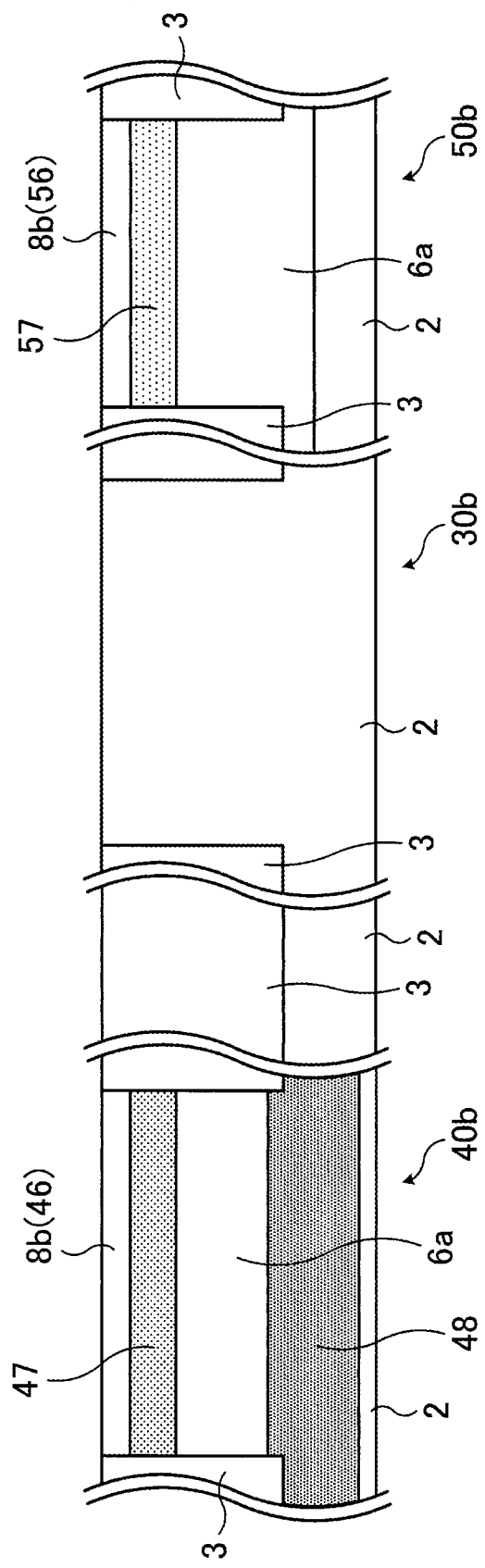
FIG. 37 is a view (part 2) illustrating an example of the method for manufacturing the semiconductor device according to the eighth embodiment.
Figure 38:
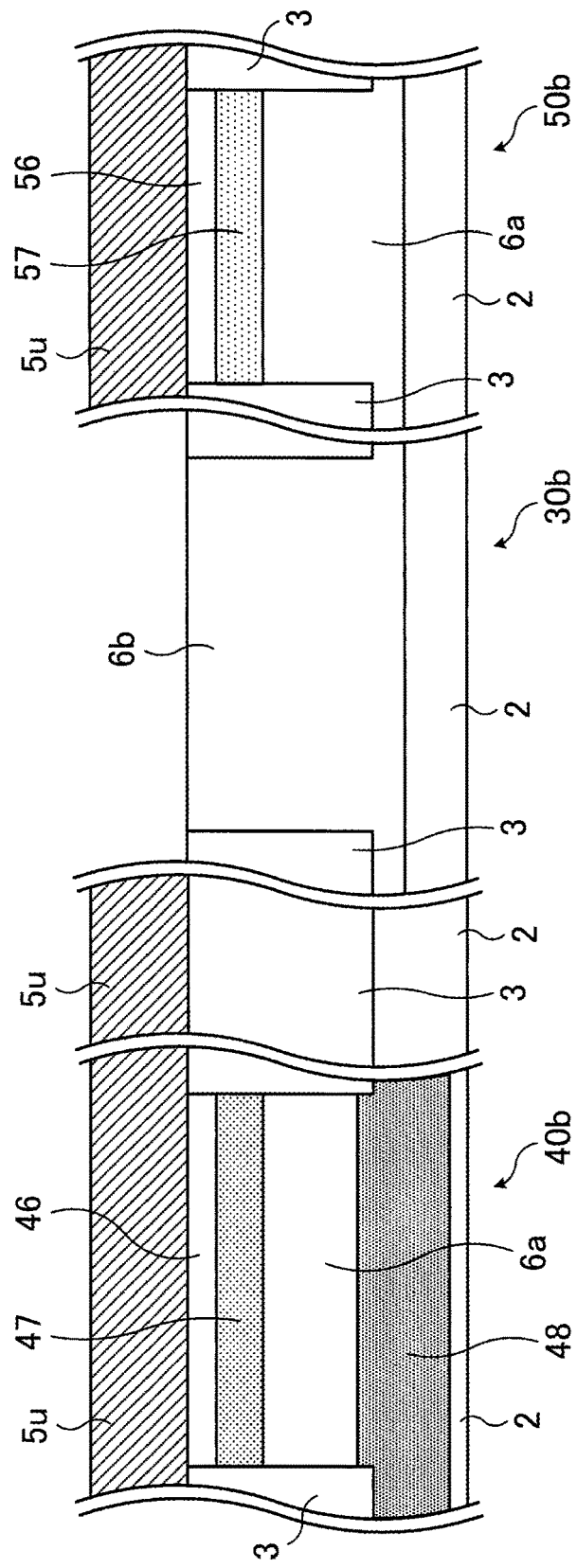
FIG. 38 is a view (part 3) illustrating an example of the method for manufacturing the semiconductor device according to the eighth embodiment.
Figure 39:
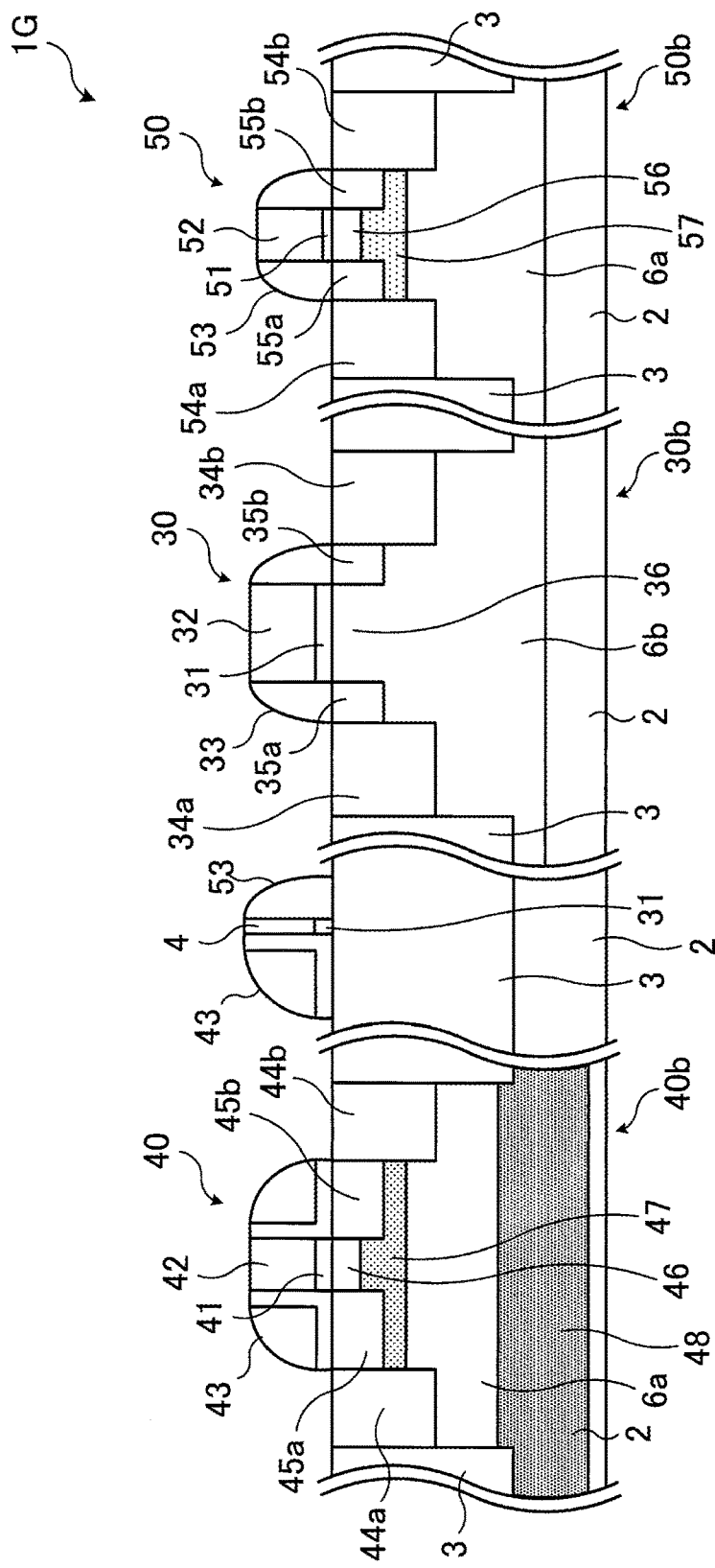
FIG. 39 is a view (part 4) illustrating an example of the method for manufacturing the semiconductor device according to the eighth embodiment.

FIGS. 36 to 39 illustrate an example of the method for manufacturing the semiconductor device according to the eighth embodiment. Here, FIG. 36 is an exemplary cross sectional schematic view of a main portion of the first manufacturing step, FIG. 37 is an exemplary cross sectional schematic view of the main portion of the second manufacturing step, FIG. 38 is an exemplary cross sectional schematic view of the main portion of the third manufacturing step, and FIG. 39 is an exemplary cross sectional schematic view of the main portion of the fourth manufacturing step. Hereinafter, an example of the manufacturing steps of the semiconductor device according to the eighth embodiment will be sequentially described with reference to FIGS. 36 to 39.

Here, a case is taken as an example, where the high-concentration embedded layer is provided below the impurity region 47 of the memory transistor 40 of the semiconductor device 1Fb (FIG. 33) taken as the second configuration example in the sixth embodiment.

In this case, first, the step as illustrated in FIG. 26 is performed to form, in the semiconductor substrate 2, the well region 6a, the impurity region 47 having a relatively-high concentration of the memory transistor 40, and the impurity region 57 having a relatively-high concentration of the logic transistor 50. The well region 6a, the impurity region 47, and the impurity region 57 each are of a p-type, for example.

Subsequently, as illustrated in FIG. 36, a resist pattern 5r, in which the element region 40b of the memory transistor 40 is opened, is formed on the semiconductor substrate 2. With the resist pattern 5r used as a mask, a predetermined impurity implantation is performed on the semiconductor substrate 2 of the element region 40b. In this impurity implantation, an impurity of the same conductivity type as the impurity region 47 and well region 6a, i.e., for example, a p-type impurity is implanted if the impurity region 47 and the well region 6a are of a p-type. For the impurity implantation, for example, boron is implanted under the conditions: the accelerating energy of 20 keV and the dose amount of $2.5 \times 10^{13}$ cm$^{-2}$, and is implanted under the conditions: the accelerating energy of 200 keV and the dose amount of $1 \times 10^{14}$ cm$^{-2}$. With this impurity implantation, the high-concentration embedded layer 48 is formed below the impurity region 47.

After formation of the high-concentration embedded layer 48 in this manner, a semiconductor material is epitaxially grown on the semiconductor substrate 2 to form a semiconductor layer 8b (non-doped layer) on the impurity region 47 of the element region 40b and on the impurity region 57 of the element region 50b, as illustrated in FIG. 37. The channel region 46 of the memory transistor 40 and the channel region 56 of the logic transistor 50 are formed in the semiconductor layer 8b. Note that, although a semiconductor layer similar to the semiconductor layer 8b of the element region 40b and element region 50b is formed also in the element region 30b due to the epitaxial growth, the former semiconductor layer is described as the layer integrated into the semiconductor substrate 2 for convenience here. After formation of the semiconductor layer 8b, the element isolating region 3 is formed which defines the element region 40b, the element region 30b, and the element region 50b, as illustrated in FIG. 37.

Next, as illustrated in FIG. 38, with a resist pattern 5u, in which the element region 30b is opened, used as a mask, impurity implantation is performed to form the well region 6b in the semiconductor substrate 2 of the element region 30b. The well region 6b is of a p-type, for example. Subsequently, impurity implantation for adjusting the threshold voltage of the I/O transistor 30 may be performed on the semiconductor substrate 2 of the element region 30b.

Thereafter, as described in the second configuration example according to the above sixth embodiment, each element is formed in accordance with the example of steps of FIGS. 8 to 13 described in the third embodiment to obtain a semiconductor device 1G (nonvolatile memory) as illustrated in FIG. 39. Thereafter, the formation of an interlayer insulating film, the formation of a plug, and the formation of an upper wiring layer including the conductors, such as a wiring and a via, and the like are performed.

Note that, although one memory transistor 40 is illustrated here, the semiconductor device 1G may include a plurality of memory transistors 40, or at least one memory transistor 40 and another memory transistor. Moreover, although one logic transistor 50 is illustrated here, the semiconductor device 1G may include a plurality of logic transistors 50, or at least one logic transistor 50 and another logic transistor. Moreover, although one I/O transistor 30 is illustrated here, the semiconductor device 1G may include a plurality of I/O transistors 30, or at least one I/O transistor 30 and another I/O transistor.

In the semiconductor device 1G according to the eighth embodiment, the high-concentration embedded layer 48 is provided further below the impurity region 47 having a relatively-high concentration provided below the channel region 46 of the memory transistor 40. In the semiconductor device 1G, the provision of the high-concentration embedded layer 48 makes it possible to achieve a reduction of the resistance (well resistance) in applying a bias (substrate bias) to the semiconductor substrate 2. A reduction of the well resistance makes it possible to achieve a reduction of the substrate bias to apply, for example.

Moreover, a reduction of the well resistance makes it possible to achieve a reduction of the area of the memory region of the semiconductor device 1G and a reduction of the size of the semiconductor device 1G. This is due to the following reason.

That is, in the memory region of the semiconductor device 1G, a well tap region electrically connected to the well region in the semiconductor substrate 2 is provided on the semiconductor substrate 2, and a substrate bias is applied from the well tap region on the semiconductor substrate 2 to the well region in the semiconductor substrate 2. The memory region usually includes memory transistors 40 in the number corresponding to the memory capacity. The well region is shared by a certain number of memory transistors 40, and from one well tap region, the substrate bias is applied to the well region shared by the certain number of memory transistors 40. Accordingly, well tap regions are arranged on the semiconductor substrate 2, in the number corresponding to a total number of memory transistors 40 included in the memory region.

If the well resistance is reduced by providing the well region 6a and high-concentration embedded layer 48 in the semiconductor substrate 2 as described above, a certain substrate bias may be applied from one well tap region to a wider range of well region 6a and high-concentration embedded layer 48. If the range, in which a certain substrate bias may be applied from one well tap region, expands, the number of memory transistors 40, to which a certain substrate bias may be applied from one well tap region, may be increased. If the number of memory transistors 40, to which a certain substrate bias may be applied from one well tap region, may be increased, a total number of well tap regions arranged on the semiconductor substrate 2 may be reduced. If a total number of well tap regions may be reduced, the area, which the well tap region on the semiconductor substrate 2 occupies, may be reduced and accordingly the area of a memory region may be reduced. Furthermore, reducing the area of a memory region makes it possible to achieve a reduction of the size of the semiconductor device 1G provided with the memory region.

Here, a case has been described, where the high-concentration embedded layer 48 is provided below the impurity region 47 of the memory transistor 40 of the semiconductor device 1Fb (FIG. 33) taken as the second configuration example in the above sixth embodiment. The approach for providing the high-concentration embedded layer 48 may be similarly applied also to the memory transistor 40 described in the fourth and fifth embodiments, in the first configuration example of the sixth embodiment, and in the seventh embodiment, and the same effect as the above-described effect is obtained. Moreover, the approach for providing the high-concentration embedded layer may be applied also to the above-described memory transistor 10, logic transistor 20, logic transistor 50, and I/O transistor 30, and accordingly may achieve reduction of the size of the semiconductor device.

When a transistor not provided with the impurity regions 47 (screen (SCR) layer) as described above is used as the memory transistor of a nonvolatile memory, the layout of the memory cell array may be restricted.

Figure 40:
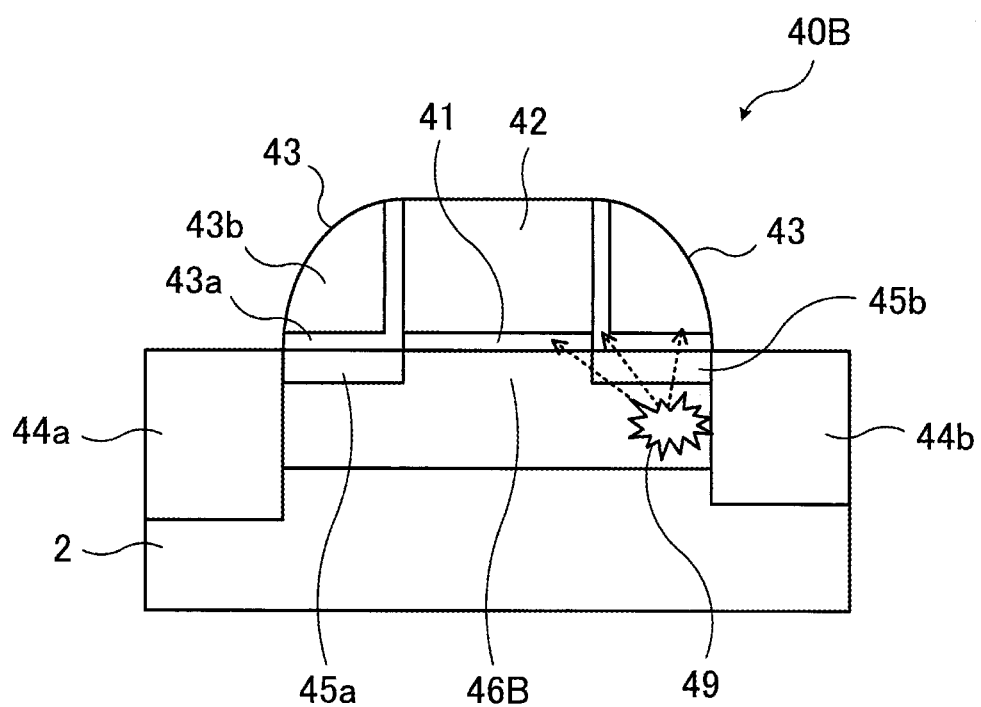
FIG. 40 illustrates a memory transistor of a comparative example.

Here, FIG. 40 illustrates a memory transistor of a comparative example. FIG. 40 schematically illustrates an exemplary cross section of a main portion of the memory transistor.

A memory transistor 40B illustrated in FIG. 40 includes a gate insulating film 41 provided above the semiconductor substrate 2, a gate electrode 42 provided above the gate insulating film 41, and a sidewall insulating film 43 provided on the side wall of the gate electrode 42 and above the semiconductor substrate 2. The sidewall insulating film 43 has a stacked structure of an oxide film 43a of silicon oxide or the like and a nitride film 43b of silicon nitride or the like. The memory transistor 40B further includes impurity regions 44a and 44b which are provided in the semiconductor substrate 2 on both sides of the gate electrode 42, respectively, and which function as a source region or drain region (SD region). The memory transistor 40B also includes LDD regions 45a and 45b inside the impurity regions 44a and 44b which function as the SD region in the semiconductor substrate 2 below the sidewall insulating film 43. The region between the LDD regions 45a and 45b serves as a channel region 46B in which a carrier moves.

For example, in the case of the n-channel memory transistor 40B, information is written by injecting and accumulating the hot electrons (hot carriers 49), which are generated in the vicinity of the impurity region 44b (drain region), into the sidewall insulating film 43. In addition, information is erased by neutralizing the electrons, which are injected and accumulated in the sidewall insulating film 43, with the hot holes (hot carriers 49) generated in the vicinity of the impurity region 44b.

In the memory transistor 40B, in order to efficiently generate the hot carriers 49 in the vicinity of the impurity region 44b, a p-type impurity is implanted into the surface of the semiconductor substrate 2 in which the channel region 46B is formed. Into the semiconductor substrate 2 below the sidewall insulating film 43, an n-type impurity together with the p-type impurity is implanted, so that the p-type impurity is cancelled out by a part of the n-type impurity and the n-type impurity regions 45a and 45b are formed. In order to stably form the n-type impurity regions 45a and 45b in the semiconductor substrate 2 below the sidewall insulating film 43, the concentration of the n-type impurity needs to be set high enough against the concentration of the p-type impurity. Therefore, the concentration of the n-type impurity is not allowed to be too low. As the result, only a characteristic difference of an on-current ratio differing by on the order of one digit is obtained, between the memory transistor 40B having information written therein and the memory transistor 40B having no information written therein. The on-current ratio converted into a threshold voltage is very small, i.e., on the order of 0.1 V.

Moreover, an evaluated variation value AVT of the threshold voltage of the memory transistor 40B is on the order of 10 mV$\mu$m or more. Note that, the evaluated variation value AVT of the threshold voltage is the gradient (mV$\mu$m) of a Pelgrom plot (which is the standard deviation $\sigma$ (mV) of the threshold voltage plotted against the inverse number ($\mu m^{-1}$) of the square root of the gate area (channel length L×channel width W)). Assume W/L of the memory transistor 40B is 0.1 $\mu$m/0.1 $\mu$m, then the variation in threshold voltage is 0.1 V as one $\sigma$ and is thus 5$\sigma$=0.5 V in a 1M bit memory cell array, which significantly exceeds a shift of the threshold voltage before and after programming. Therefore, in attempting to realize a nonvolatile memory using the memory transistor 40B as illustrated in FIG. 40, it is difficult to adopt a NOR type layout for the memory cell array.

Figure 41:
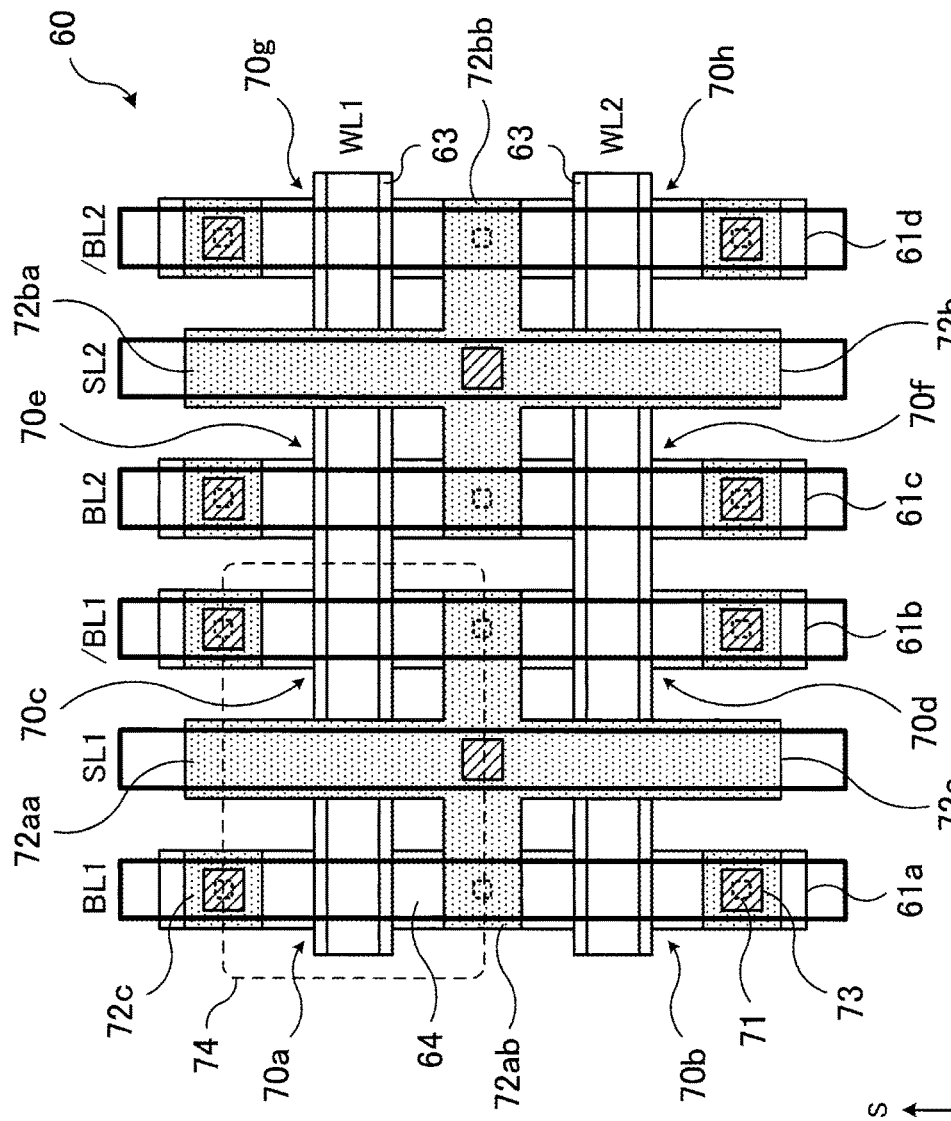
FIG. 41 illustrates an example of a twin-bit cell type nonvolatile memory.

As a layout that makes it possible to stably read information even in a memory cell array using the memory transistor 40B, a twin-bit cell type layout as illustrated in FIG. 41 may be contemplated.

FIG. 41 illustrates an example of the twin-bit cell type nonvolatile memory. FIG. 41 schematically illustrates an exemplary planar layout of a main portion of the twin-bit cell type nonvolatile memory.

A nonvolatile memory 60 (semiconductor device) illustrated in FIG. 41 includes, as the element region (element region of the semiconductor substrate 2 of FIG. 40), a plurality of (e.g., four) active regions 61a, 61b, 61c, and 61d which extends in a direction S and is arranged in parallel in a direction T perpendicular to the direction S. Word lines WL1 and WL2 (corresponding to the gate electrode 42 of FIG. 40) extend, via a non-illustrated gate insulating film (corresponding to the gate insulating film 41 of FIG. 40), in the direction T so as to traverse these active regions 61a, 61b, 61c, and 61d. A sidewall insulating film 63 (corresponding to the sidewall insulating film 43 of FIG. 40) is formed on the sidewall of the word lines WL1 and WL2. Impurity regions (corresponding to the impurity regions 44a and 44b of FIG. 40) which function as the SD region are formed respectively on both sides of the word lines WL1 and WL2 of each of the active regions 61a, 61b, 61c, and 61d. Non-illustrated LDD regions (corresponding to the impurity regions 45a and 45b of FIG. 40) are formed under the sidewall insulating film 63 and on the inner side of the impurity region 64, and a non-illustrated channel region is formed between the LDD regions. The nonvolatile memory includes a plurality of (e.g., eight) memory transistors 70a, 70b, 70c, 70d, 70e, 70f, 70g, and 70h (corresponding to the memory transistor 40B of FIG. 40) that is formed from these elements.

A plug 71 (contact) extending toward the upper layer is formed on each impurity region 64. Each impurity region 64 is connected, via the plug 71, to wirings 72a, 72b, and 72c included in the first conductive layer.

The wiring 72a has a planar crisscross shape that includes a region 72aa extending in the direction S and a region 72ab extending in the direction T. The region 72aa extends in the direction S between the adjacent active regions 61a and 61b. The region 72ab extends in the direction T so as to connect the impurity region 64 shared by the memory transistors 70a and 70b of the active region 61a and the impurity region 64 shared by the memory transistors 70c and 70d of the active region 61b.

The wiring 72b has a planar crisscross shape that includes a region 72ba extending in the direction S and a region 72bb extending in the direction T. The region 72ba extends in the direction S between the adjacent active regions 61c and 61d. The region 72bb extends in the direction T so as to connect the impurity region 64 shared by the memory transistors 70e and 70f of the active region 61c and the impurity region 64 shared by the memory transistors 70g and 70h of the active region 61d. The wiring 72c is connected, via the plug 71, to the impurity region 64 on the opposite side of the impurity region 64 connected to the wirings 72a and 72b of each of the memory transistors 70a, 70b, 70c, 70d, 70e, 70f, 70g, and 70h.

A via 73 extending toward the upper layer is formed on each of the wirings 72a, 72b, and 72c. The wiring 72a is connected, via the via 73, to a source line SL1 extending in the direction S. The wiring 72b is connected, via the via 73, to a source line SL2 extending in the direction S. The wiring 72c connected to the impurity region 64 of the transistors 70a and 70b of the active region 61a is connected, via the via 73, to a bit line BL1 extending in the direction S. The wiring 72c connected to the impurity region 64 of the transistors 70c and 70d of the active region 61b is connected, via the via 73, to a bit line /BL1 extending in the direction S. The wiring 72c connected to the impurity region 64 of the transistors 70e and 70f of the active region 61c is connected, via the via 73, to a bit line BL2 extending in the direction S. The wiring 72c connected to the impurity region 64 of the transistors 70g and 70h of the active region 61d is connected, via the via 73, to a bit line /BL2 extending in the direction S. The source lines SL1 and SL2 and the bit lines BL1, /BL1, BL2, and /BL2 are included in the second conductive layer of the nonvolatile memory 60.

In the twin-bit cell type nonvolatile memory 60, a pair of memory transistors 70a and 70c, for example, surrounded by a frame 74 of FIG. 41 function as one memory cell. In the memory cell inside the frame 74, pieces of information opposite to each other are written into the memory transistors 70a and 70c connected to the bit lines BL1 and/BL1, and subsequently the information of one memory cell is read by differentially driving the memory transistors 70a and 70c. Similarly, in the nonvolatile memory 60, a pair of memory transistors 70b and 70d, a pair of memory transistors 70e and 70g, and a pair of memory transistors 70f and 70h each function as one memory cell.

An example of each of the programming (writing), reading, and erasing operations of information in the nonvolatile memory 60 will be specifically described with reference to FIG. 42, FIG. 43, and FIG. 44. Note that, here, the nonvolatile memory 60 provided with the n-channel memory transistors 70a, 70b, 70c, 70d, 70e, 70f, 70g, and 70h is taken as an example.

Figure 42:
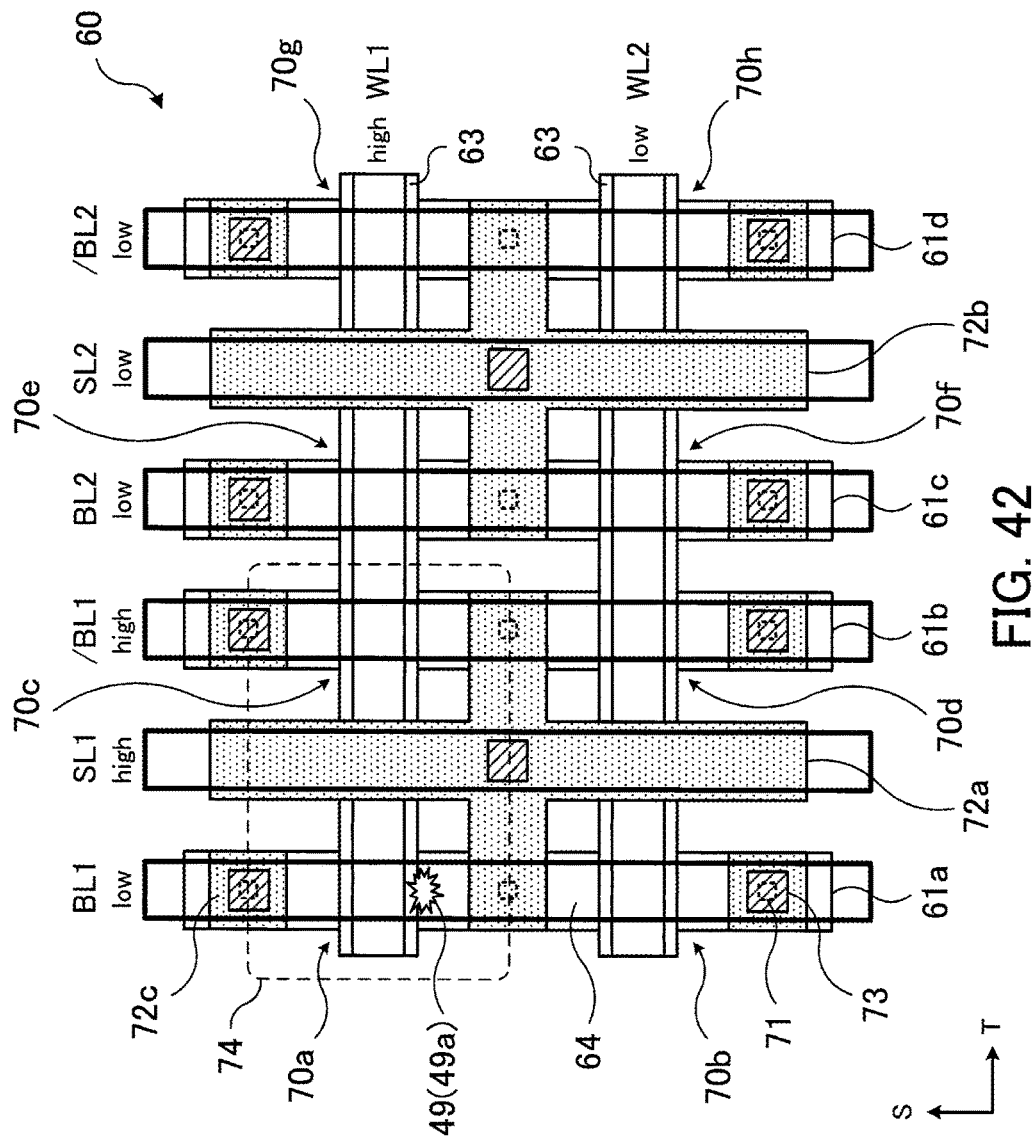
FIG. 42 is an explanatory view of a programming operation of the twin-bit cell type nonvolatile memory.

FIG. 42 is an explanatory view of the programming operation of the twin-bit cell type nonvolatile memory.

For example, during the programming operation with respect to the memory cell (inside the frame 74) including the pair of memory transistors 70a and 70c, the potential of the word line WL1 is set to a high level, the potential of the bit line BL1 is set to a low level, the potential of the bit line/BL1 is set to a high level, and the potential of the source line SL1 is set to a high level. The potential of the word line WL2 is set to a low level, the potential of each of the bit lines BL2 and/BL2 is set to a low level, and the potential of the source line SL2 is set to a low level. Accordingly, hot electrons (hot carriers 49, electric charges 49a) are injected and accumulated into the sidewall insulating film 63 of the memory transistor 70a, thereby performing the programming of information.

Figure 43:
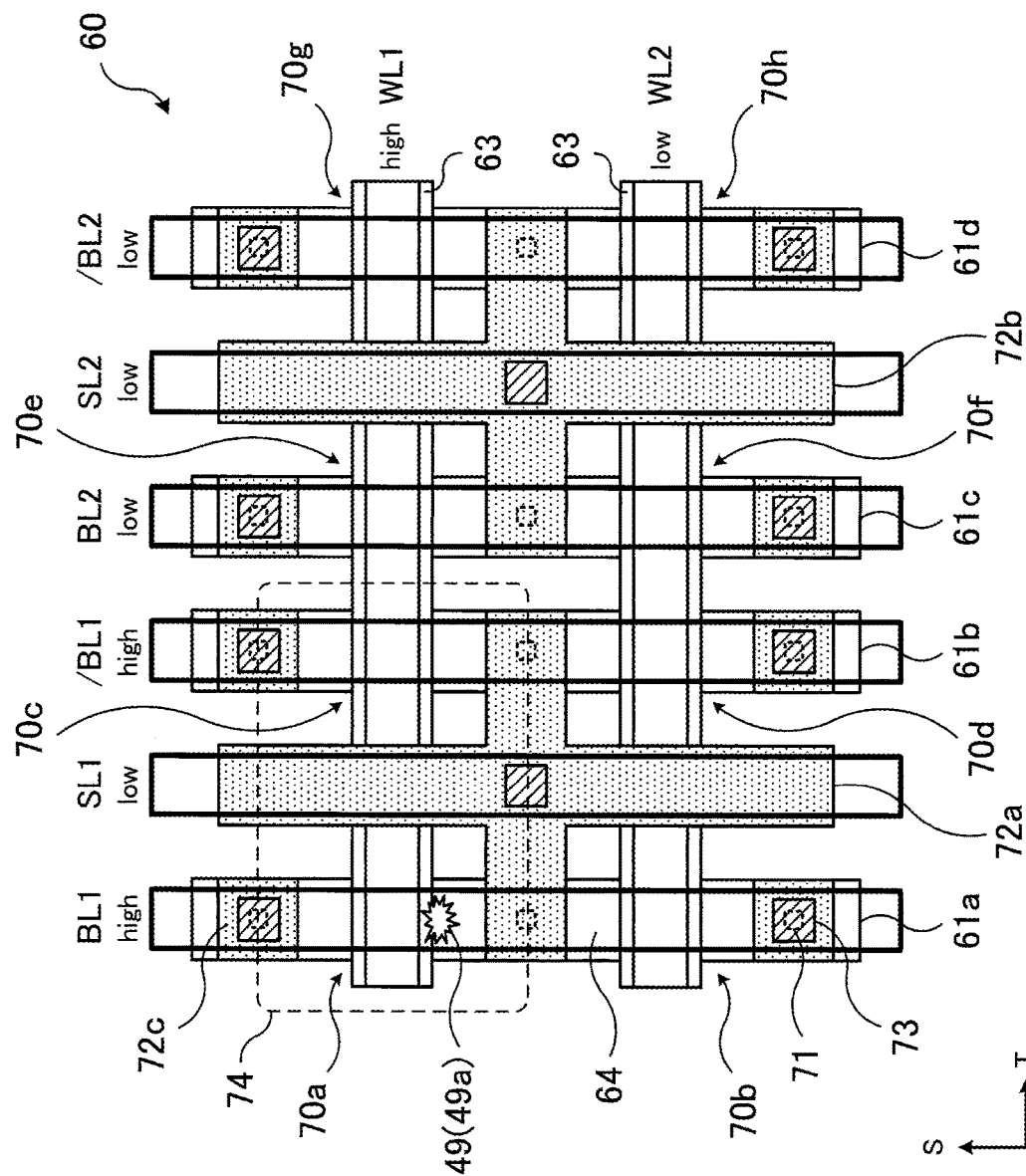
FIG. 43 is an explanatory view of a reading operation of the twin-bit cell type nonvolatile memory.

FIG. 43 is an explanatory view of the reading operation of the twin-bit cell type nonvolatile memory.

During the reading operation with respect to the memory cell (inside the frame 74) including the memory transistors 70a and 70c, the potential of the word line WL1 is set to a high level, the potential of each of the bit lines BL1 and/BL1 is set to a high level, and the potential of the source line SL1 is set to a low level. The potential of the word line WL2 is set to a low level, the potential of each of the bit lines BL2 and/BL2 is set to a low level, and the potential of the source line SL2 is set to a low level. For example, in the memory cell including the memory transistor 70a where the programming has been performed as in the above FIG. 42, when such potentials are set, the currents flowing through the bit lines BL1 and/BL1 that are connected to the memory transistors 70a and 70c, respectively, will differ from each other in magnitude. By detecting a difference in magnitude between the currents, the reading of the information of the memory transistor 70a is performed.

Figure 44:
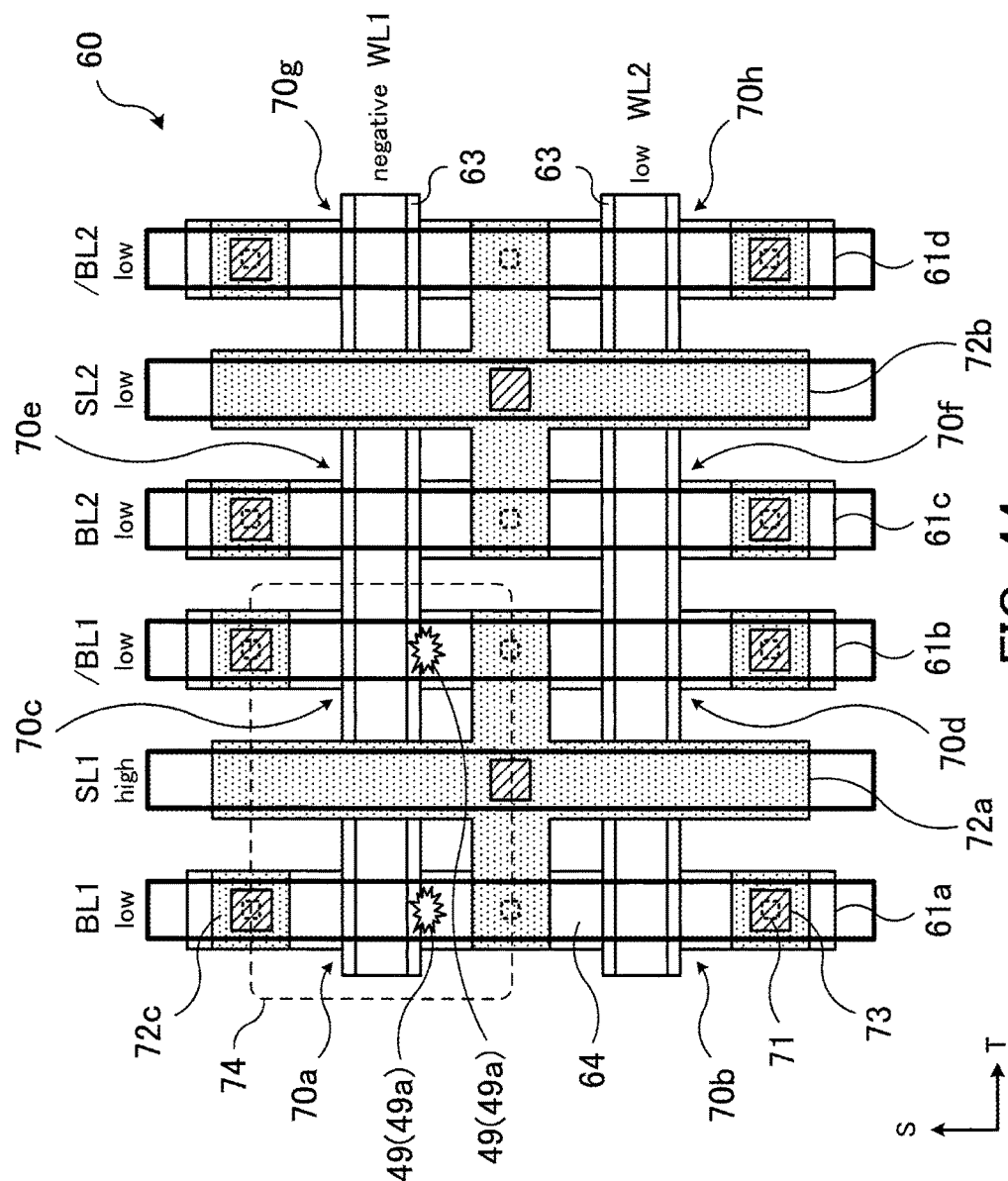
FIG. 44 is an explanatory view of an erasing operation of the twin-bit cell type nonvolatile memory.

FIG. 44 is an explanatory view of the erasing operation of the twin-bit cell type nonvolatile memory.

During the erasing operation with respect to the memory cell (inside the frame 74) including the memory transistors 70a and 70c, first the programming operation as described above is performed on the memory transistors 70a and 70c (not illustrated). After both the memory transistors 70a and 70c of the memory cell are set to a programmed state, the potential of the word line WL1 is set to be negative, the potential of each of the bit lines BL1 and/BL1 is set to a low level, and the potential of the source line SL1 is set to a high level. The potential of the word line WL2 is set to a low level, the potential of each of the bit lines BL2 and/BL2 is set to a low level, and the potential of the source line SL2 is set to a low level. Thus, the erasing of the information, which has been programmed into both the memory transistors 70a and 70c of the memory cell, is performed.

Figure 45:
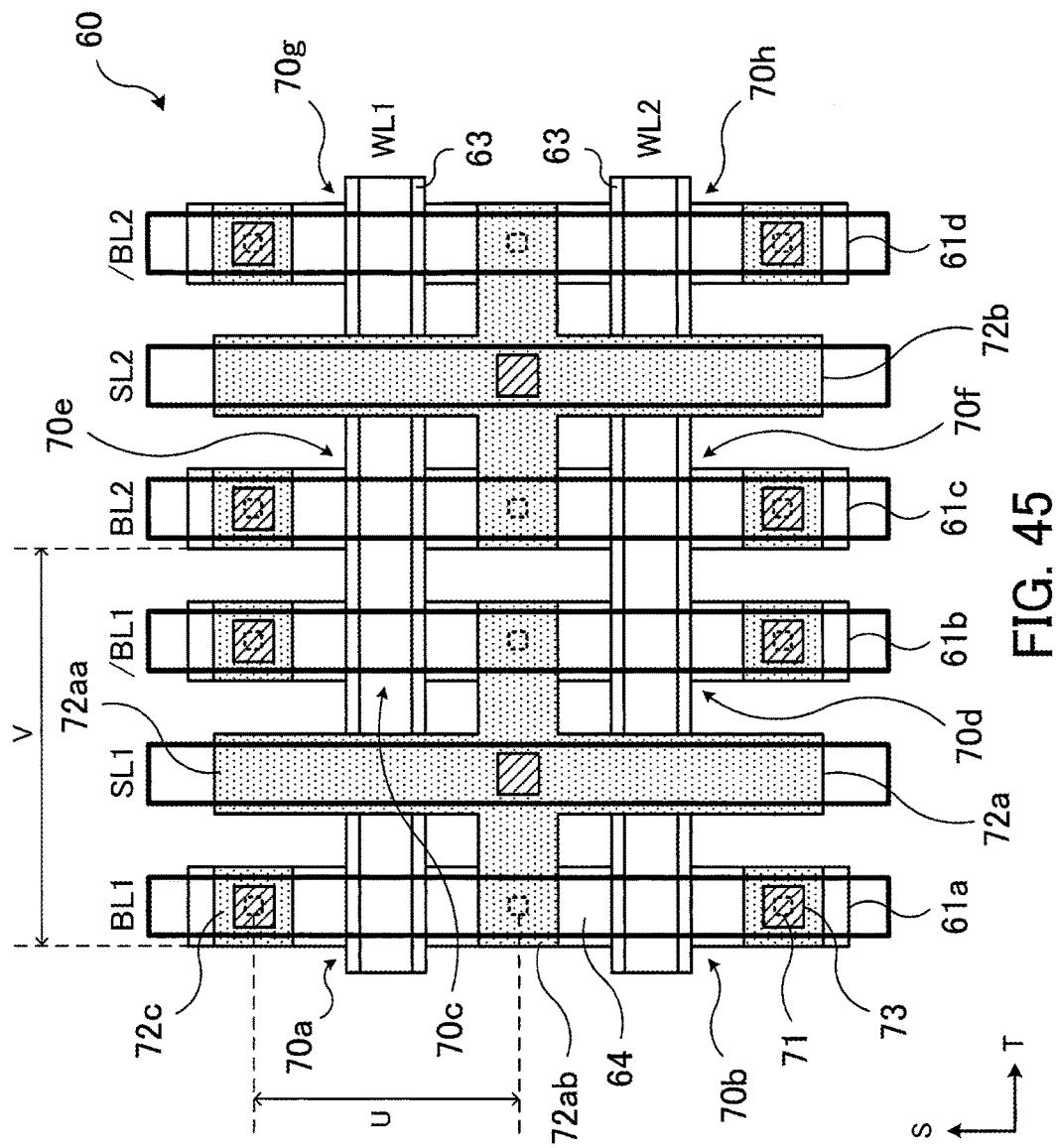
FIG. 45 is an explanatory view of the area of the twin-bit cell type nonvolatile memory.

Such a twin-bit cell type nonvolatile memory 60 is designed so as to have the area as illustrated in the next FIG. 45, for example.

FIG. 45 is an explanatory view of the area of the twin-bit cell type nonvolatile memory.

We now focus on one memory cell including the memory transistors 70a and 70c, for example.

In the direction S of this memory cell, assume that the size (gate length Lg) of the word line WL1 is 0.06 µm, a half-size of each of the wirings 72a (region 72ab) and 72c connected to the plug 71 is 0.04 µm, and the size between the word line WL1 and each of the wirings 72a (region 72ab) and 72c is 0.07 µm. In this case, a size U in the direction S of the memory cell including the memory transistors 70a and 70c results in 0.28 µm (=0.06 µm+0.04 µm×2+0.07 µm×2).

In the direction T of the memory cell, both the width and pitch of each of the wirings 72a (region 72aa) and 72c are assumed to be 0.18 µm in total. In this case, a size V in the direction T of the memory cell including the memory transistors 70a and 70c results in 0.54 µm (=0.18 µm×3).

Accordingly, the area of one memory cell including the memory transistors 70a and 70c of the nonvolatile memory 60 results in 0.1512 µm² (=0.28 µm×0.54 µm). The same goes for the other memory cells. For example, in the case of the 1M bit nonvolatile memory 60, a total area of the memory region results in 1.21 mm², the area of a whole memory macro (including a logic region, an I/O region, and the like in addition to the memory region) results in 3 mm², and thus the occupation ratio of the memory region is 40%.

A memory transistor without the SCR layer and a twin-bit cell type nonvolatile memory using this memory transistor have been described, but in contrast, if a memory transistor with the SCR layer is used, the following advantages are obtained.

Figure 46:
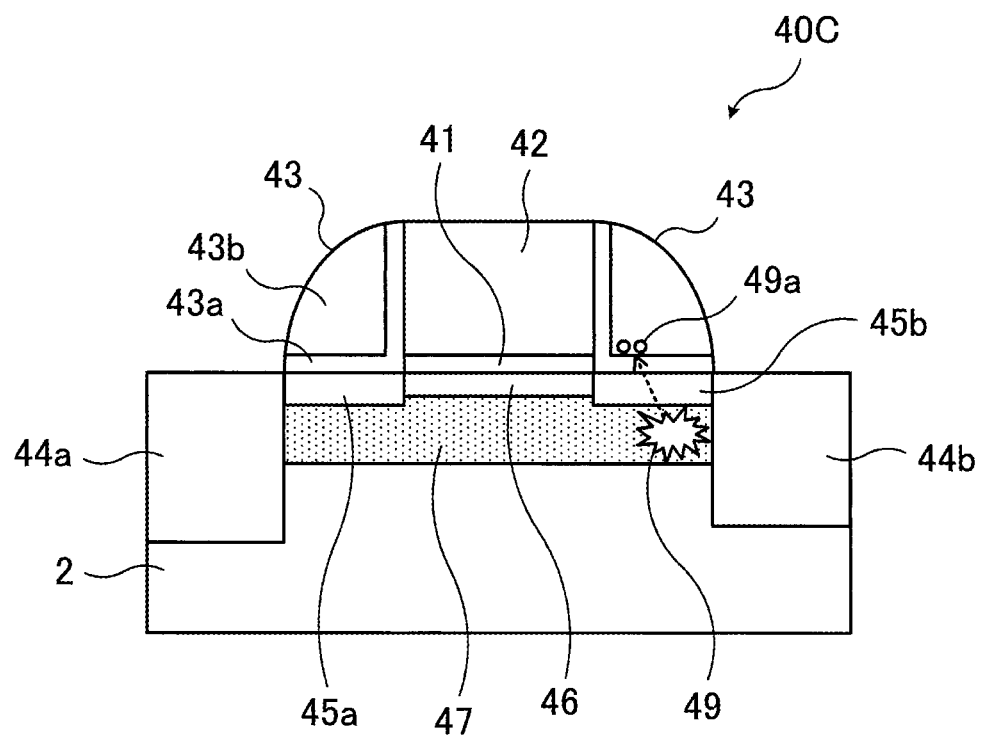
FIG. 46 illustrates an example of a memory transistor according to an embodiment.

FIG. 46 illustrates an example of a memory transistor according to an embodiment. FIG. 46 schematically illustrates an exemplary cross section of a main portion of the memory transistor.

A memory transistor 40C illustrated in FIG. 46 includes the gate insulating film 41 provided above the semiconductor substrate 2, the gate electrode 42 provided above the gate insulating film 41, and the sidewall insulating film 43 provided on the side wall of the gate electrode 42 and above the semiconductor substrate 2. The sidewall insulating film 43 has a stacked structure of the oxide film 43a of silicon oxide or the like and the nitride film 43b of silicon nitride or the like. The memory transistor 40C further includes the impurity regions 44a and 44b which are provided in the semiconductor substrate 2 on both sides of the gate electrode 42, respectively, and which function as the SD region. The memory transistor 40C also includes the LDD regions 45a and 45b inside the impurity regions 44a and 44b which function as the SD region in the semiconductor substrate 2 below the sidewall insulating film 43. The region between the LDD regions 45a and 45b serves as the channel region 46 in which a carrier moves. The memory transistor 40C includes the impurity region 47, as the SCR layer, below the channel region 46.

The channel region 46 of the memory transistor 40C is a non-doped region where any impurity is intentionally not added, or a region where a very low concentration of impurity is contained. The impurity region 47 below the channel region 46 is a region, e.g., a high-concentration p-type region, which has the conductivity type different from the LDD regions 45a and 45b and contains a higher concentration of impurity than the channel region 46. The dose amount during the impurity implantation of the LDD regions 45a and 45b is set to a value lower than the dose amount during the impurity implantation of the impurity region 47 which is the SCR layer.

In the memory transistor 40C, the non-doped or very low concentration channel region 46 achieves a lower threshold voltage and also reduces the variation in the threshold voltage. The evaluated variation value AVT of the threshold voltage of the memory transistor 40C is on the order of 4 mVµm, and across the whole 1M bit memory region, the variation in the threshold voltage is on the order of 5σ=0.2 V, which is very small as compared with the case where the above-described memory transistor 40B (FIG. 40) is used.

Figure 63:
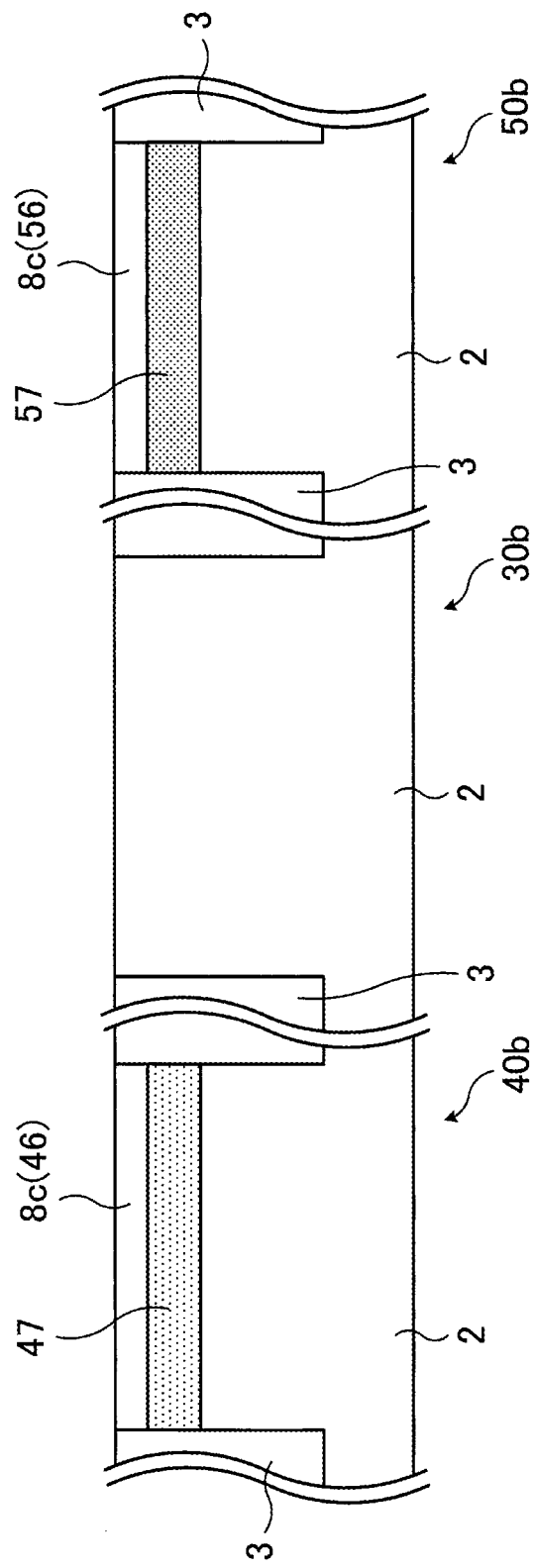
FIG. 63 is a view (part 3) illustrating an example of the method for manufacturing the nonvolatile memory.
Figure 64:
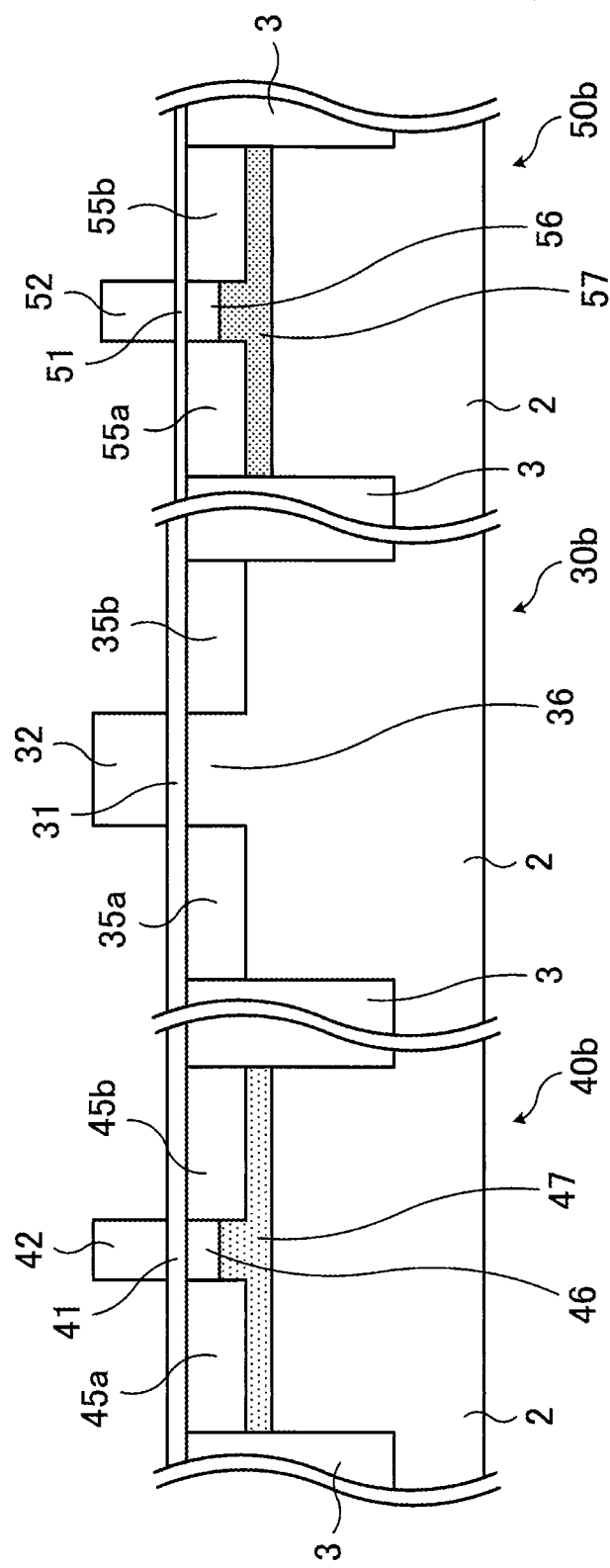
FIG. 64 is a view (part 4) illustrating an example of the method for manufacturing the nonvolatile memory.

In the memory transistor 40C, the relatively high-concentration impurity region 47 efficiently generates the hot carriers 49. The LDD regions 45a and 45b below the sidewall insulating film 43 are formed in the semiconductor layer in which the non-doped or very low concentration channel region 46 is formed (FIGS. 63 and 64). The semiconductor layer, in which the non-doped or very low concentration channel region 46 is formed, suppresses the diffusion of the impurity, e.g., p-type impurity, from the impurity region 47. Therefore, even if the impurity implantation of the LDD regions 45a and 45b, e.g., implantation of an n-type impurity, is performed under the condition of a lower dose amount, the conductivity type of the LDD regions 45a and 45b always results in the conductivity type of the impurity, e.g., an n-type, which thus does not cause any offset. Accordingly, in the memory transistor 40C, a higher on-current may be stably achieved in a state where the electric charge 49a is not trapped in the sidewall insulating film 43, and a larger variation in the threshold voltage may be caused in a state where the electric charge 49a is trapped in the sidewall insulating film 43.

Here, an example of the concentration profile is illustrated in FIGS. 47A to 47D when phosphorus is used for the impurity of the LDD region.

FIGS. 47A to 47D each illustrate the concentration profile obtained by TCAD (Technology Computer Aided Design) when phosphorus for the LDD region has been implanted into a semiconductor substrate having the SCR layer formed by impurity implantation (FIG. 61), having the semiconductor layer formed by epitaxial growth (FIG. 63), and having the gate electrode formed via the gate insulating film (FIG. 64).

The following impurity implantation conditions are used in the formation of the SCR layer. Germanium is implanted under the conditions: the accelerating energy of 30 keV and the dose amount of $5 \times 10^{14}$ cm$^{-2}$. Carbon is implanted under the conditions: the accelerating energy of keV and the dose amount of $5 \times 10^{14}$ cm$^{-2}$. Boron is implanted under the conditions: the accelerating energy of 20 keV and the dose amount of $4 \times 10^{13}$ cm$^{-2}$.

Figure 47A:
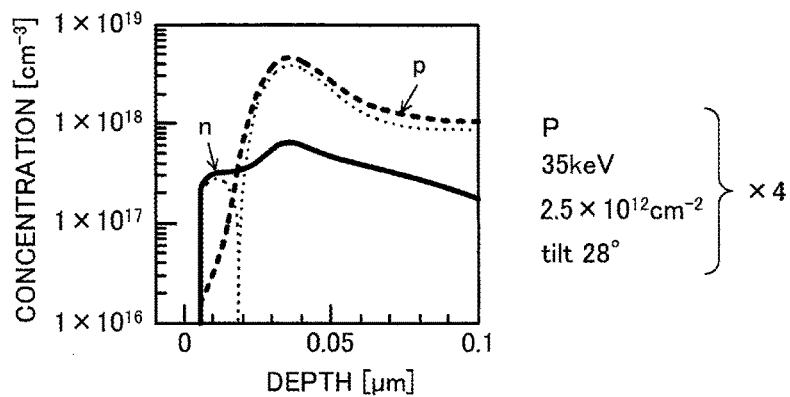
FIGS. 47A to 47D illustrate an example of the concentration profile when phosphorus is used for the impurity of an LDD (Lightly Doped Drain) region.
Figure 47B:
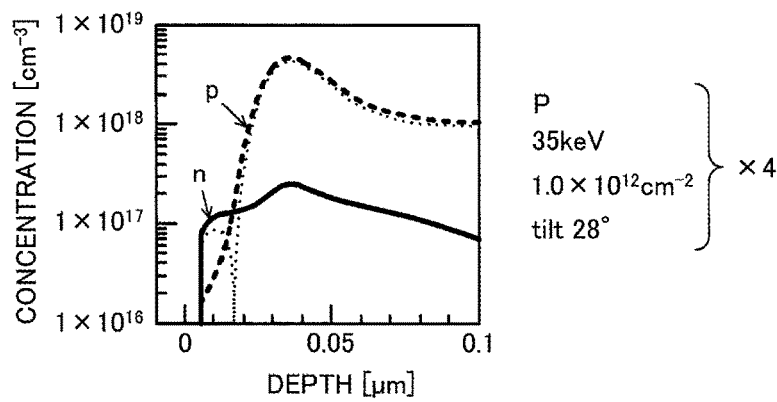
Figure 47C:
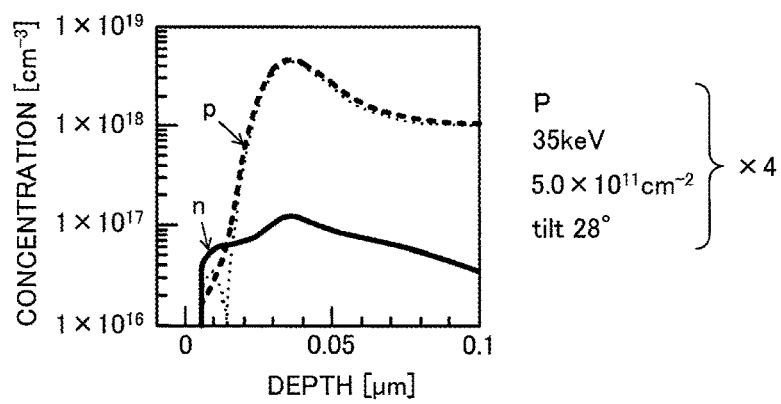
Figure 47D:
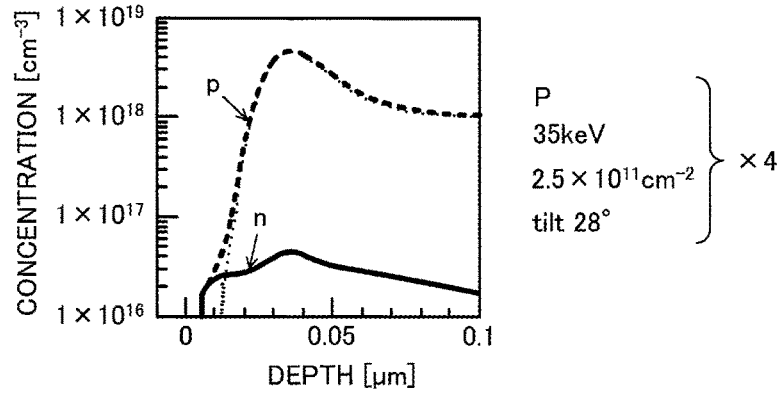

FIG. 47A illustrates the concentration profile when the implantation of phosphorus under the conditions: the accelerating energy of 35 keV and the dose amount of $2.5 \times 10^{12}$ cm$^{-2}$, is performed from four directions with a tilt angle of 28° to form the LDD region. FIG. 47B illustrates the concentration profile when the implantation of phosphorus under the conditions: the accelerating energy of 35 keV and the dose amount of $1.0 \times 10^{12}$ cm$^{-2}$, is performed from four directions with the tilt angle of 28° to form the LDD region. FIG. 47C illustrates the concentration profile when the implantation of phosphorus under the conditions: the accelerating energy of 35 keV and the dose amount of $5.0 \times 10^{11}$ cm$^{-2}$ is performed from four directions with the tilt angle of 28° to form the LDD region. FIG. 47D illustrates the concentration profile when the implantation of phosphorus under the conditions: the accelerating energy of 35 keV and the dose amount of $2.5 \times 10^{11}$ cm$^{-2}$ is performed from four directions with the tilt angle of 28° to form the LDD region.

In FIGS. 47A to 47D, the horizontal axis represents the depth (μm) from the surface of the semiconductor substrate while the vertical axis represents the concentration (cm$^{-3}$) of the p-type and n-type impurities. Note that, in FIGS. 47A to 47D, the concentration profile of the p-type impurity is drawn with a thick chain line, the concentration profile of the n-type impurity is drawn with a thick solid line, and the cancelled-out concentration profile of the p-type and n-type impurities is drawn with a thin dotted line.

For example, as illustrated in FIG. 47A, an n-type impurity (phosphorus) implanted for formation of the LDD region is present closer to the front side of the semiconductor substrate than the p-type impurity (boron) implanted for formation of the SCR layer. Under the implanting conditions of the n-type impurity as in FIG. 47A, the n-type LDD region is stably formed in the vicinity of the surface of the semiconductor substrate having the p-type SCR layer formed therein. Similarly, also under the implanting conditions of the n-type impurity as in FIGS. 47B and 47C, the n-type impurity is present closer to the front side of the semiconductor substrate than the p-type impurity, and the n-type LDD region is stably formed in the vicinity of the surface of the semiconductor substrate having the p-type SCR layer formed therein. Furthermore, also under the implanting conditions of the n-type impurity as in FIG. 47D, the n-type LDD region is formed in the vicinity of the surface of the semiconductor substrate having the p-type SCR layer formed therein. According to FIGS. 47A to 47D, even in a very low concentration, e.g., $1 \times 10^{17}$ cm$^{-3}$ or less, the n-type LDD region may be formed in the vicinity of the surface of the semiconductor substrate having the p-type SCR layer formed therein.

Moreover, an example of the concentration profile is illustrated in FIGS. 48A to 48D when arsenic is used for the impurity of the LDD region.

FIGS. 48A to 48D each illustrate the concentration profile obtained by TCAD when arsenic for the LDD region has been implanted into a semiconductor substrate having the SCR layer formed by impurity implantation (FIG. 61), having the semiconductor layer formed by epitaxial growth (FIG. 63), and having the gate electrode formed via the gate insulating film (FIG. 64).

The following impurity implantation conditions are used in the formation of the SCR layer. Germanium is implanted under the conditions: the accelerating energy of 30 keV and the dose amount of $5 \times 10^{14}$ cm$^{-2}$. Carbon is implanted under the conditions: the accelerating energy of keV and the dose amount of $5 \times 10^{14}$ cm$^{-2}$. Boron is implanted under the conditions: the accelerating energy of 20 keV and the dose amount of $4 \times 10^{13}$ cm$^{-2}$.

Figure 48A:
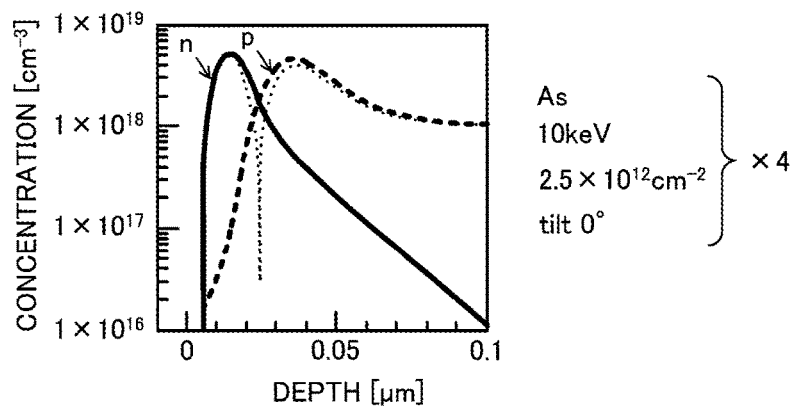
FIGS. 48A to 48D illustrate an example of the concentration profile when arsenic is used for the impurity of the LDD region.
Figure 48B:
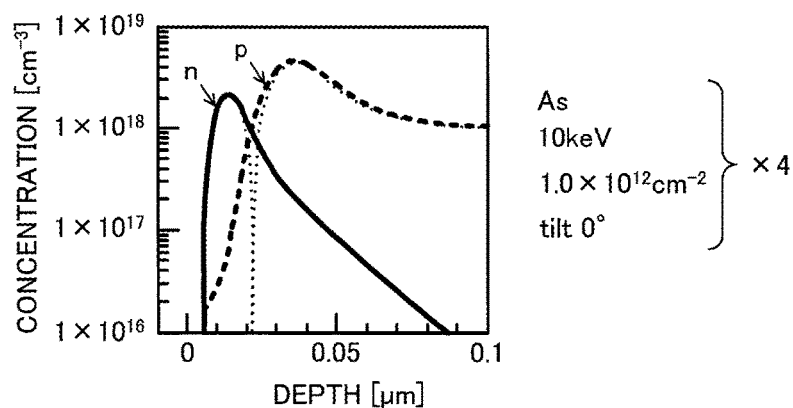
Figure 48C:
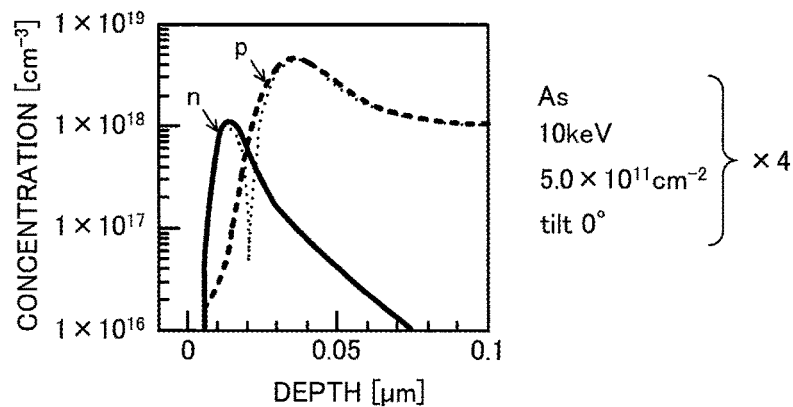
Figure 48D:
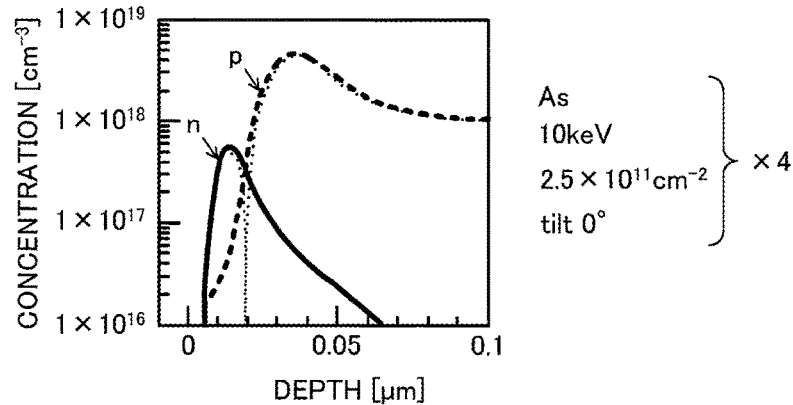

FIG. 48A illustrates the concentration profile when the implantation of arsenic under the conditions: the accelerating energy of 10 keV and the dose amount of $2.5 \times 10^{12}$ cm$^{-2}$, is performed four times with the tilt angle of 0° to form the LDD region. FIG. 48B illustrates the concentration profile when the implantation of arsenic under the conditions: the accelerating energy of 10 keV and the dose amount of $1.0 \times 10^{12}$ cm$^{-2}$, is performed four times with the tilt angle of 0° to form the LDD region. FIG. 48C illustrates the concentration profile when the implantation of arsenic under the conditions: the accelerating energy of 10 keV and the dose amount of $5.0 \times 10^{11}$ cm$^{-2}$, is performed four times with the tilt angle of 0° to form the LDD region. FIG. 48D illustrates the concentration profile when the implantation of arsenic under the conditions: the accelerating energy of 10 keV and the dose amount of $2.5 \times 10^{11}$ cm$^{-2}$, is performed four times with the tilt angle of 0° to form the LDD region.

In FIGS. 48A to 48D, the horizontal axis represents the depth (μm) from the surface of the semiconductor substrate while the vertical axis represents the concentration (cm$^{-3}$) of the p-type and n-type impurities. Note that, in FIGS. 48A to 48D, the concentration profile of the p-type impurity is drawn with a thick chain line, the concentration profile of the n-type impurity is drawn with a thick solid line, and the cancelled-out concentration profile of the p-type and n-type impurities is drawn with a thin dotted line.

For example, as illustrated in FIG. 48A, the n-type impurity (arsenic) implanted for formation of the LDD region is present closer to the front side of the semiconductor substrate than the p-type impurity (boron) implanted for formation of the SCR layer. Under the implanting conditions of the n-type impurity as in FIG. 48A, the n-type LDD region is stably formed in the vicinity of the surface of the semiconductor substrate having the p-type SCR layer formed therein. Similarly, also under the implanting conditions of the n-type impurity as in FIGS. 48B to 48D, the n-type impurity is present closer to the front side of the semiconductor substrate than the p-type impurity, and the n-type LDD region is stably formed in the vicinity of the surface of the semiconductor substrate having the p-type SCR layer formed therein.

Figure 49:
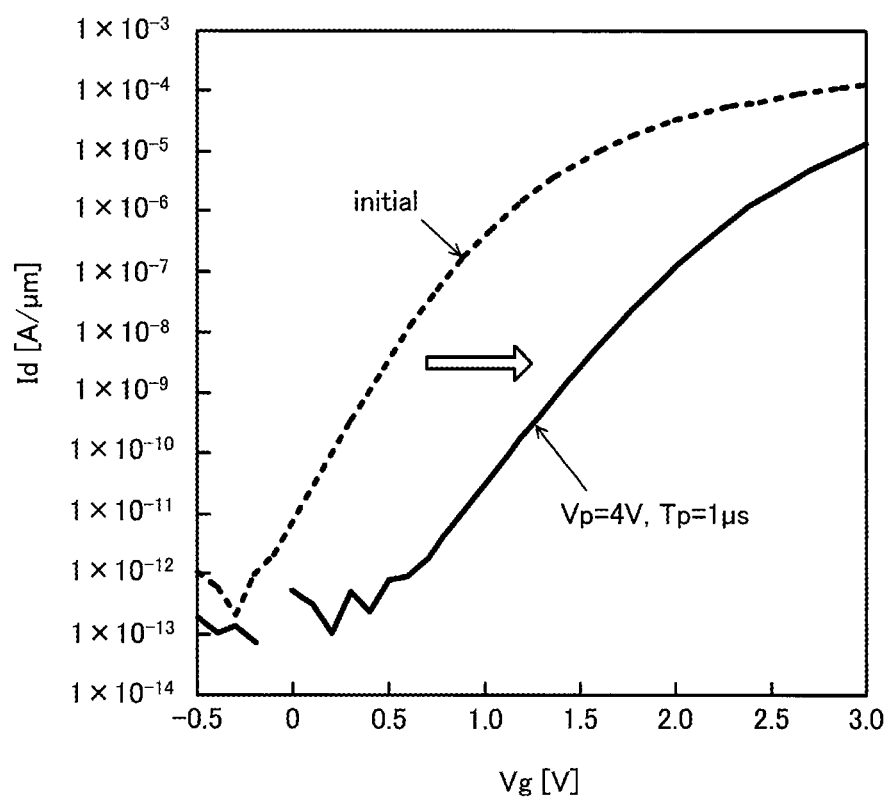
FIG. 49 illustrates an example of the programming characteristics of a memory transistor with an SCR (screen) layer.

FIG. 49 illustrates an example of the programming characteristics of the memory transistor with the SCR layer.

FIG. 49 illustrates a relationship between the gate voltage Vg (V) and the read current (drain current) Id (A/μm), the relationship being obtained by the reading operation before and after the programming, of the memory transistor 40C with the impurity region 47 which is the SCR layer illustrated in the above FIG. 46.

The programming operation with respect to the memory transistor 40C is performed under the voltage conditions where both the impurity region 44a and the semiconductor substrate 2 are set to 0 V and both the gate electrode 42 and the impurity region 44b are set to 4 V (programming voltage Vp=4 V). After the programming operation is performed with a program time Tp=1 μs under the voltage conditions described above, the reading operation is performed by setting the impurity region 44b and the semiconductor substrate 2 to 0 V and applying a predetermined voltage to the gate electrode 42 and applying 0.5 V (drain voltage Vd=0.5 V) to the impurity region 44a. The relationship between the gate voltage Vg and the read current Id during the reading operation is illustrated in FIG. 49.

The threshold voltage before programming (the initial threshold voltage) of the memory transistor 40C is on the order of 0.5 V. FIG. 49 reveals that in the memory transistor 40C, a sufficient on-current of 0.5 pA or more is obtained even with the gate voltage Vg=1.0 V. If the programming operation with a relatively low voltage and short time, such as the voltage Vp=4 V and program time Tp=1 μs as described above, is performed with respect to the memory transistor 40C, the threshold voltage after programming will shift to a higher Vg side by on the order of 1 V. The on-current ratio between before and after programming is significantly large by around four digits as compared with the above-described memory transistor 40B without the SCR layer (impurity region 47). This shift of the threshold voltage in the memory transistor 40C before and after programming is significantly larger than the variation in threshold voltage across the whole memory region in the case of the memory region of a 1M-bit memory, for example. Accordingly, the memory transistor 40C does not need to adopt the twin-bit cell type configuration.

The memory transistor 40C will be further described.

Figure 50:
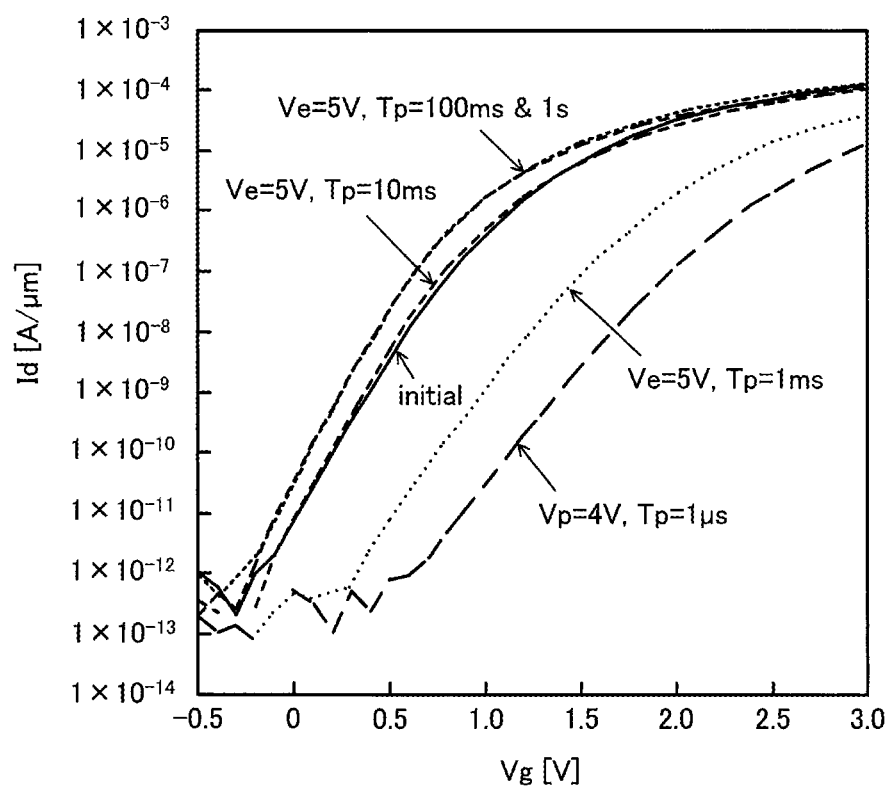
FIG. 50 illustrates an example of the erasing characteristics of the memory transistor with the SCR layer.

FIG. 50 illustrates an example of the erasing characteristics of the memory transistor with the SCR layer.

FIG. 50 illustrates a relationship between the gate voltage Vg (V) and the read current Id (A/μm), the relationship being obtained in the reading operation before and after the programming operation and after the erasing operation, of the memory transistor 40C illustrated in the above FIG. 46 with the impurity region 47 which is the SCR layer.

The programming operation with respect to the memory transistor 40C is performed with the program time Tp set to 1 μs under the voltage conditions where both the impurity region 44a and the semiconductor substrate 2 are set to 0 V and both the gate electrode 42 and the impurity region 44b are set to 4 V (programming voltage Vp=4 V). The erasing operation after the programming operation is performed with the erasing time Te set to 1 ms, 10 ms, 100 ms, and 1 s, respectively, under the voltage conditions where both the impurity region 44a and the semiconductor substrate 2 are set to 0 V, the gate electrode 42 is set to −5 V and the impurity region 44b is set to 5 V (erasing voltage Ve=5 V). The reading operation before and after programming and after erasing is performed by setting the impurity region 44b and the semiconductor substrate 2 to 0 V and applying a predetermined voltage to the gate electrode 42 and applying 0.5 V (drain voltage Vd=0.5 V) to the impurity region 44a. The relationship between the gate voltage Vg and the read current Id during the reading operation is illustrated in FIG. 50.

As described in the above FIG. 49, if the programming operation is performed under the conditions: the programming voltage Vp=4 V and the program time Tp=1 μs, the threshold voltage after programming will shift to a higher Vg side, by on the order of 1 V, than before programming (than the initial value).

If with respect to the memory transistor 40C after programming, the erasing operation is performed under the conditions: the erasing voltage Ve=5 V and the erasing time of 1 ms, the threshold voltage after the erasing operation shifts back, by on the order of 0.4 V, to a lower Vg side, as illustrated in FIG. 50. If with respect to the memory transistor 40C after programming, the erasing operation is performed with a longer erasing time of 10 ms, the threshold voltage after erasing will return to the value before the programming (to the initial value). In the memory transistor 40C, even if the erasing operation is performed with a further longer erasing time of 100 ms or 1 s, after programming, the threshold voltage after erasing hardly shifts as illustrated in FIG. 50 and thus the memory transistor 40C will not be in an over-erased state. As described above, in the transistor 40C with the SCR layer (impurity region 47), an excellent erasing operation may be performed under the conditions: the erasing voltage Ve=5 V, the erasing time of 10 ms or more.

FIGS. 51A and 51B to FIGS. 53A and 53B each illustrate the LDD region concentration dependence of the programming characteristics of the memory transistor with the SCR layer.

Figure 51A:
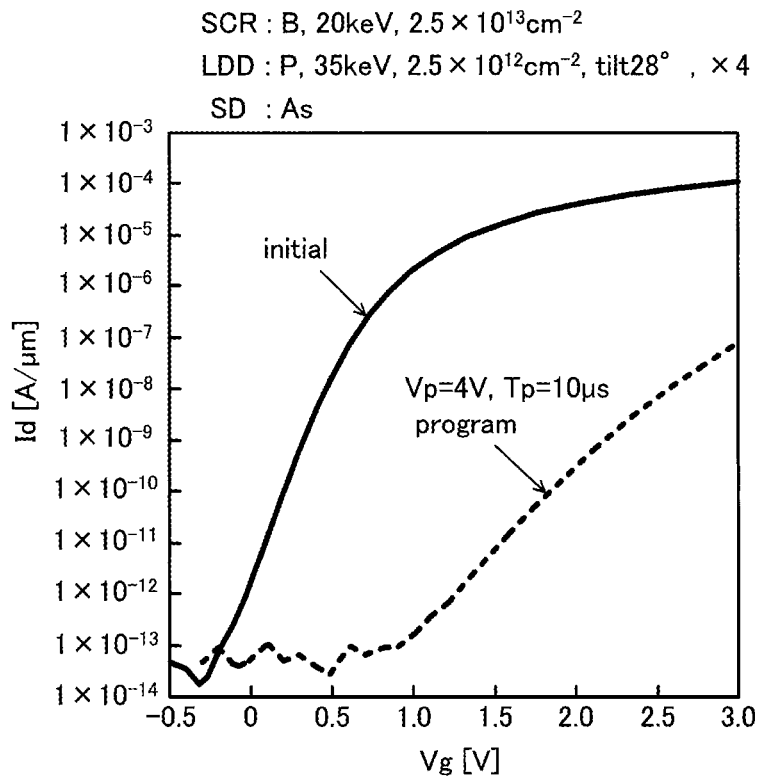
FIGS. 51A and 51B are views (part 1) illustrating the LDD region concentration dependence of the programming characteristics of the memory transistor with the SCR layer.

FIG. 51A illustrates the programming characteristics of the memory transistor 40C in the case where boron has been implanted into the impurity region 47 which is the SCR layer, phosphorus has been implanted into the LDD regions 45a and 45b, and then arsenic has been implanted into the impurity regions 44a and 44b which are the SD regions. Here, the boron of the SCR layer is implanted under the conditions: the accelerating energy of keV and the dose amount of $2.5 \times 10^{13}$ $cm^{-2}$. The phosphorus of the LDD regions 45a and 45b is implanted from four directions under the conditions: the accelerating energy of 35 keV, the dose amount of $2.5 \times 10^{12}$ $cm^{-2}$, and the tilt angle of 28°.

Figure 51B:
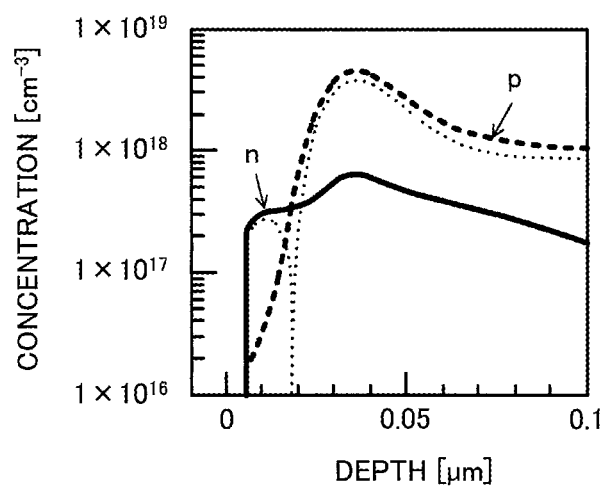

The programming operation is performed with the program time Tp set to 10 μs under the voltage conditions where both the impurity region 44a and the semiconductor substrate 2 are set to 0 V and both the gate electrode 42 and the impurity region 44b are set to 4 V (programming voltage Vp=4 V). The reading operation is performed by setting the impurity region 44b and the semiconductor substrate 2 to 0 V and applying a predetermined gate voltage Vg to the gate electrode 42 and applying the drain voltage Vd=0.5 V to the impurity region 44a. FIG. 51A illustrates a relationship between the gate voltage Vg (V) and the read current Id (A/μm), the relationship being obtained in the reading operation before and after programming. FIG. 51B illustrates the concentration profiles, obtained by TCAD, of the p-type and n-type impurities of the impurity region 47 and LDD regions 45a and 45b in the memory transistor 40C having the Id-Vg characteristics of FIG. 51A.

Figure 52A:
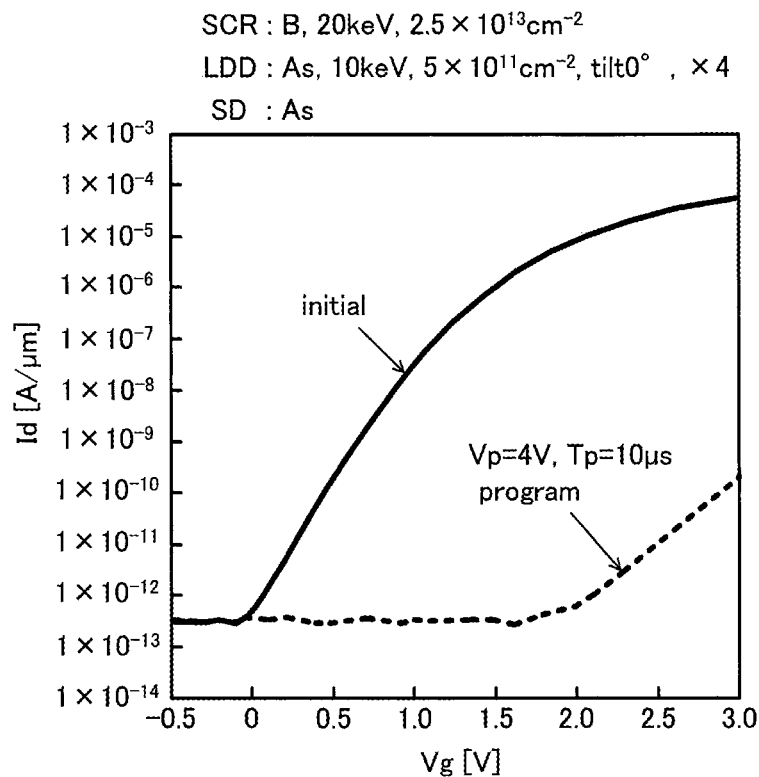
FIGS. 52A and 52B are views (part 2) illustrating the LDD region concentration dependence of the programming characteristics of the memory transistor with the SCR layer.

FIG. 52A illustrates the programming characteristics of the memory transistor 40C in the case where boron has been implanted into the impurity region 47 which is the SCR layer, arsenic has been implanted into the LDD regions 45a and 45b, and then arsenic has been implanted into the impurity regions 44a and 44b which are the SD regions. Here, the boron of the SCR layer is implanted under the conditions: the accelerating energy of 20 keV and the dose amount of $2.5 \times 10^{13}$ cm$^{-2}$. The arsenic of the LDD regions 45a and 45b is implanted four times under the conditions: the accelerating energy of 10 keV, the dose amount of $5 \times 10^{11}$ cm$^{-2}$, and the tilt angle of 0°.

Figure 52B:
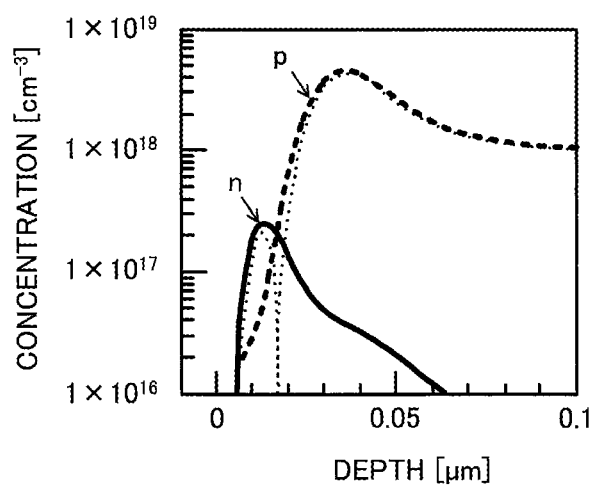

The programming operation is performed with the program time Tp set to 10 μs under the voltage conditions where both the impurity region 44a and the semiconductor substrate 2 are set to 0 V and both the gate electrode 42 and the impurity region 44b are set to 4 V (programming voltage Vp=4 V). The reading operation is performed by setting the impurity region 44b and the semiconductor substrate 2 to 0 V and applying a predetermined gate voltage Vg to the gate electrode 42 and applying the drain voltage Vd=0.5 V to the impurity region 44a. FIG. 52A illustrates a relationship between the gate voltage Vg (V) and the read current Id (A/μm), the relationship being obtained in the reading operation before and after programming. FIG. 52B illustrates the concentration profile, obtained by TCAD, of the p-type and n-type impurities of the impurity region 47 and LDD regions 45a and 45b in the memory transistor 40C having the Id-Vg characteristics of FIG. 52A.

Figure 53A:
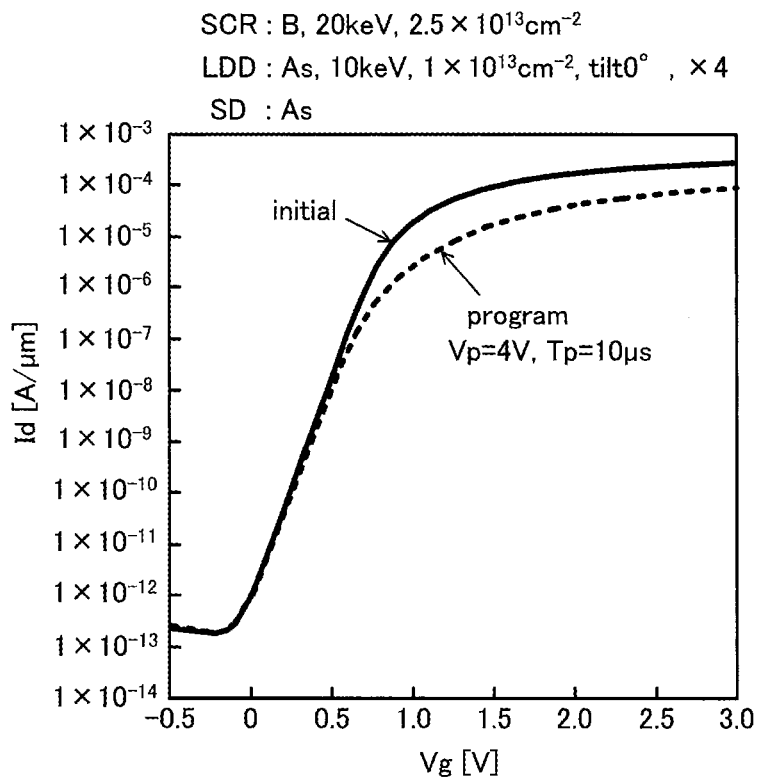
FIGS. 53A and 53B are views (part 3) illustrating the LDD region concentration dependence of the programming characteristics of the memory transistor with the SCR layer.

FIG. 53A illustrates the programming characteristics of the memory transistor 40C in the case where boron has been implanted into the impurity region 47 which is the SCR layer, arsenic has been implanted into the LDD regions 45a and 45b, and arsenic has been implanted into the impurity regions 44a and 44b which are the SD regions. Here, the boron of the SCR layer is implanted under the conditions: the accelerating energy of 20 keV and the dose amount of $2.5 \times 10^{13}$ cm$^{-2}$. The arsenic of the LDD regions 45a and 45b is implanted four times under the conditions: the accelerating energy of 10 keV, the dose amount of $1 \times 10^{13}$ cm$^{-2}$, and the tilt angle of 0°.

Figure 53B:
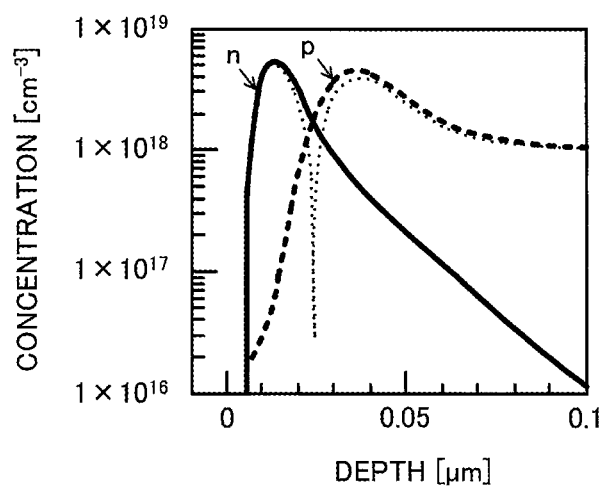

The programming operation is performed with the program time Tp set to 10 μs under the voltage conditions where both the impurity region 44a and the semiconductor substrate 2 are set to 0 V and both the gate electrode 42 and the impurity region 44b are set to 4 V (programming voltage Vp=4 V). The reading operation is performed by setting the impurity region 44b and the semiconductor substrate 2 to 0 V and applying the predetermined gate voltage Vg to the gate electrode 42 and applying the drain voltage Vd=0.5 V to the impurity region 44a. FIG. 53A illustrates a relationship between the gate voltage Vg (V) and the read current Id (A/μm), the relationship being obtained in the reading operation before and after programming. FIG. 53B illustrates the concentration profiles, obtained by TCAD, of the p-type and n-type impurities of the impurity region 47 and LDD regions 45a and 45b in the memory transistor 40C having the Id-Vg characteristics of FIG. 53A.

FIG. 51A reveals that in the memory transistor 40C with the LDD regions 45a and 45b that are formed by implanting phosphorus under the above-described conditions, after programming with Vp=4 V and Tp=10 μs, the threshold voltage shifts relatively largely from the value before the programming (the initial value). Moreover, FIG. 52A reveals that also in the memory transistor 40C with the LDD regions 45a and 45b that are formed by implanting arsenic under the above-described conditions, after programming with Vp=4 V and Tp=10 μs, the threshold voltage shifts relatively largely from the value before the programming (the initial value). In contrast, FIG. 53A reveals that in the case where the LDD regions 45a and 45b have been formed by implanting arsenic in a higher concentration than the case of FIG. 52A, after programming with Vp=4 V and Tp=10 μs, the threshold voltage hardly shifts from the value before the programming (the initial value).

In the memory transistor 40C whose threshold voltage shifts relatively largely as in FIGS. 51A and 52A, there is a relatively low concentration n-type impurity (LDD region) in the vicinity of the surface of the semiconductor substrate 2 having the p-type impurity (SCR layer) therein, as in FIGS. 51B and 52B. In contrast, in the memory transistor 40C whose threshold voltage hardly shifts as in FIG. 53A, there is a relatively high concentration n-type impurity (LDD region) in the vicinity of the surface of the semiconductor substrate 2 having the p-type impurity (SCR layer) therein, as in FIG. 53B.

FIGS. 51A and 51B to FIGS. 53A and 53B reveal that in the memory transistor 40C, if the LDD regions 45a and 45b are of a relatively low concentration, a relatively high programming speed is obtained, while if the LDD regions 45a and 45b are of an excessively high concentration, the programming speed will decrease. From the viewpoint of suppressing a significant decrease in programming speed, the concentration of the LDD regions 45a and 45b is set to $5 \times 10^{18}$ cm$^{-3}$ or less, preferably $5 \times 10^{17}$ cm$^{-3}$ or less, more preferably $3 \times 10^{17}$ cm$^{-3}$ or less, and further $1 \times 10^{17}$ cm$^{-3}$ or less.

Figure 54:
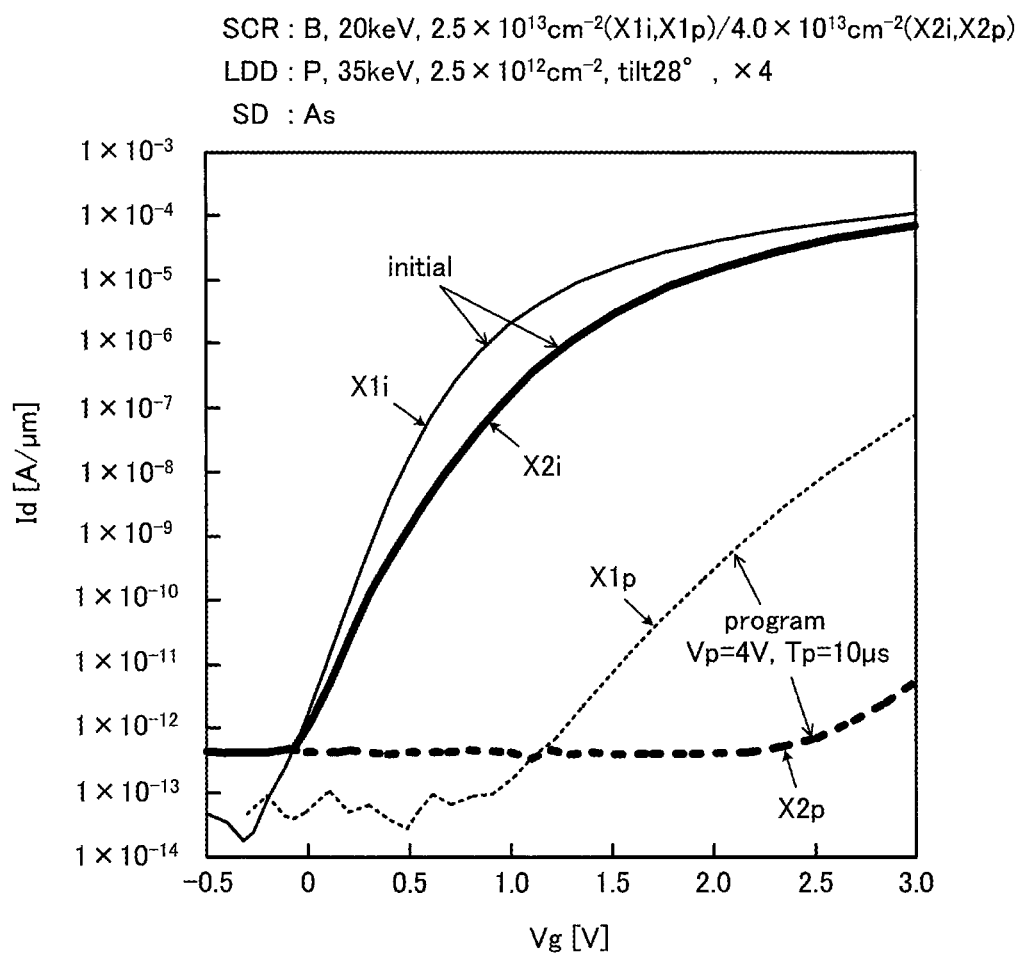
FIG. 54 is a view (part 1) illustrating the SCR layer concentration dependence and SD region impurity type dependence of the programming characteristics of the memory transistor with the SCR layer.
Figure 55:
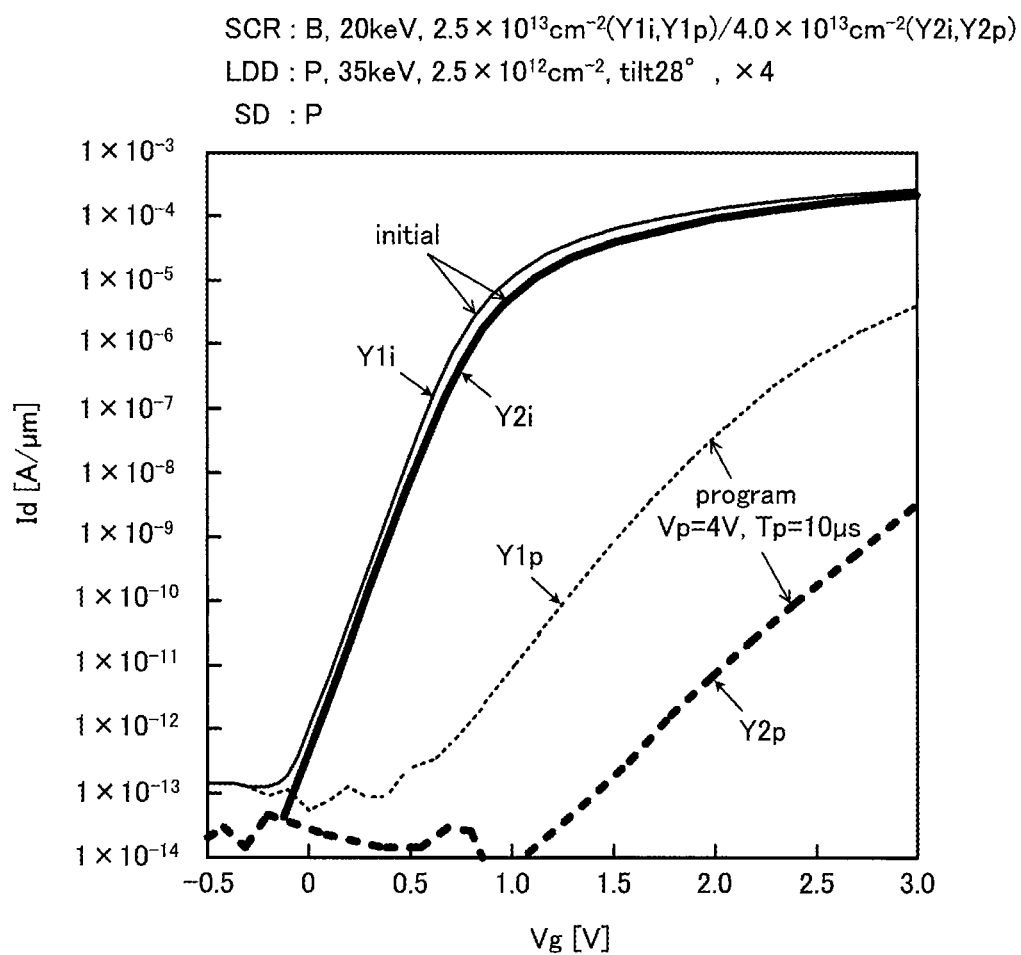
FIG. 55 is a view (part 2) illustrating the SCR layer concentration dependence and SD region impurity type dependence of the programming characteristics of the memory transistor with the SCR layer.

FIGS. 54 and 55 each illustrate the SCR layer concentration dependence and SD region impurity type dependence of the programming characteristics of the memory transistor with the SCR layer.

In FIG. 54, the Id-Vg characteristic before programming (the initial Id-Vg characteristic) illustrated in the above FIG. 51A is drawn with a solid line X1i, while the Id-Vg characteristic after programming is drawn with a chain line X1p. Additionally, in FIG. 54, the Id-Vg characteristic before programming (the initial Id-Vg characteristic) of the memory transistor 40C with the impurity region 47 of the SCR layer having a higher concentration than in the case of the above FIG. 51A is drawn with a thick solid line X2i, while the Id-Vg characteristic after programming is drawn with a thick chain line X2p. Boron is implanted into the high concentration SCR layer under the conditions: the accelerating energy of 20 keV and the dose amount of $4.0 \times 10^{13}$ cm$^{-2}$. In the memory transistor 40C exhibiting the Id-Vg characteristics of FIG. 54, arsenic is implanted into the impurity regions 44a and 44b of the SD region. Note that, the programming operation and reading operation are performed under the same conditions as in the case of the above FIG. 51A.

FIG. 55 illustrates the Id-Vg characteristics of the memory transistor 40C when the impurity implantation conditions (impurity concentration) of the impurity region 47 of the SCR layer and the LDD regions 45a and 45b are the same as in the case of FIG. 54 and not arsenic but phosphorus has been implanted into the impurity regions 44a and 44b of the SD region.

That is, the first memory transistor 40C includes the SCR layer of a relatively low concentration, and boron is implanted into the SCR layer under the conditions: the accelerating energy of 20 keV and the dose amount of $2.5 \times 10^{13}$ cm$^{-2}$. Phosphorus is implanted into the LDD regions 45a and 45b of the first memory transistor 40C four times under the conditions: the accelerating energy of 35 keV, the dose amount of $2.5 \times 10^{12}$ cm$^{-2}$, and the tilt angle of 28°, and phosphorus is implanted into the SD region. In FIG. 55, the Id-Vg characteristic before programming (the initial Id-Vg characteristic) of the first memory transistor 40C is drawn with a solid line Y1$i$, while the Id-Vg characteristic after programming is drawn with a chain line Y1$p$. Note that, the programming operation and reading operation are performed under the same conditions as in the case of the above FIG. 54.

Moreover, the second memory transistor 40C includes the SCR layer of a relatively high concentration, and boron is implanted into the SCR layer under the conditions: the accelerating energy of 20 keV and the dose amount of $4.0 \times 10^{13}$ cm$^{-2}$. Phosphorus is implanted into the LDD regions 45a and 45b of the second memory transistor 40C four times under the conditions: the accelerating energy of 35 keV, the dose amount of $2.5 \times 10^{12}$ cm$^{-2}$, and the tilt angle of 28°, and phosphorus is implanted into the SD region. In FIG. 55, the Id-Vg characteristic before programming (the initial Id-Vg characteristic) of the second memory transistor 40C is drawn with a thick solid line Y2$i$, while the Id-Vg characteristic after programming is drawn with a thick chain line Y2$p$. Note that, the programming operation and reading operation are performed under the same conditions as in the case of the above FIG. 54.

FIGS. 54 and 55 reveal that in either the case where the impurity implanted into the SD region is arsenic or the case where it is phosphorus, a shift in the threshold voltage before and after programming under the same conditions increases more in the case where the dose amount of the SCR layer is increased to increase the impurity concentration. Moreover, FIGS. 54 and 55 reveal that in the case where the impurity implanted into SD region is phosphorus (FIG. 55), the junction leak may be further reduced to reduce an off-current Ioff than the case where the impurity implanted into SD region is arsenic (FIG. 54).

Figure 56:
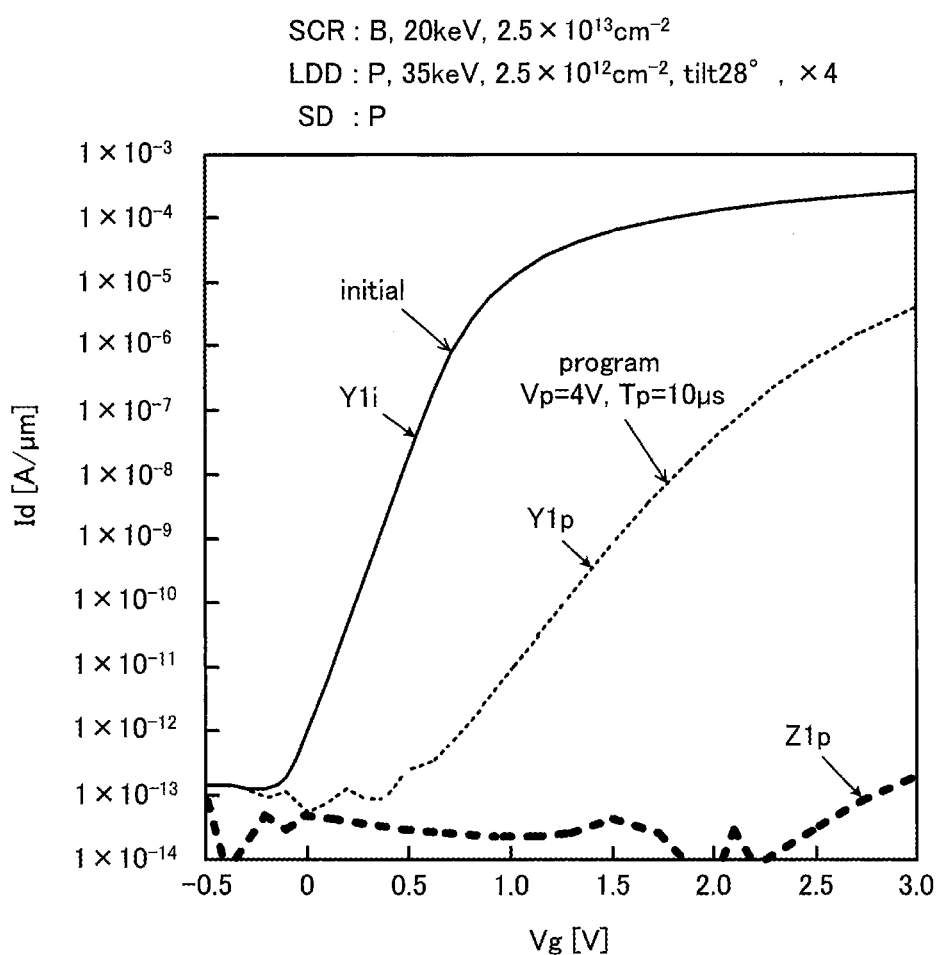
FIG. 56 illustrates another example of the programming characteristics of the memory transistor with the SCR layer.

FIG. 56 illustrates another example of the programming characteristics of the memory transistor with the SCR layer.

FIG. 56 illustrates the Id-Vg characteristics that are drawn with the solid line Y1$i$ and chain line Y1$p$ in the above FIG. 55. That is, in FIG. 56, the Id-Vg characteristics before and after programming of the first memory transistor 40C described in the above FIG. 55 are drawn with the solid line Y1$i$ and chain line Y1$p$, respectively. Additionally, in FIG. 56, the Id-Vg characteristic when a substrate bias (back bias) Vbb of −3.0 V has been applied to the semiconductor substrate 2 during the programming operation of the first memory transistor 40C is drawn with a thick chain line Z1$p$. Note that, the programming operation and reading operation are performed under the same conditions as in the case of the above FIG. 55.

FIG. 56 reveals that in the case where the substrate bias Vbb is applied during the programming operation (thick chain line Z1$p$), the threshold voltage after programming shifts to a significantly higher Vg side with respect to the threshold voltage before programming than the case where the substrate bias Vbb is not applied (chain line Y1$p$). Applying the substrate bias Vbb during the programming operation makes it possible to achieve a significant improvement in the programming speed.

As described above, in the memory transistor 40C having the impurity region 47 as the SCR layer, the impurity implanted into the LDD regions 45a and 45b, e.g., n-type impurity such as phosphorus or arsenic, may be set in a very low concentration. Furthermore, adjustment of the type and concentration of an impurity implanted into each of the LDD regions 45a and 45b, impurity region 47 (SCR layer), and impurity regions 44a and 44b (SD regions) or further application of the substrate bias Vbb makes it possible to achieve an improvement in the characteristics of the memory transistor 40C. For example, an increase of the variation in the threshold voltage before and after programming of the memory transistor 40C, i.e., an increase of the programming speed, may be achieved. Moreover, in the memory transistor 40C, the over-erasing may be suppressed. Therefore, in the nonvolatile memory using the memory transistor 40C, a relatively complicated processing operation, such as erase verification, does not need to be performed after the erasing operation.

Subsequently, a nonvolatile memory using the memory transistor 40C with the SCR layer as described above will be described.

Figure 57:
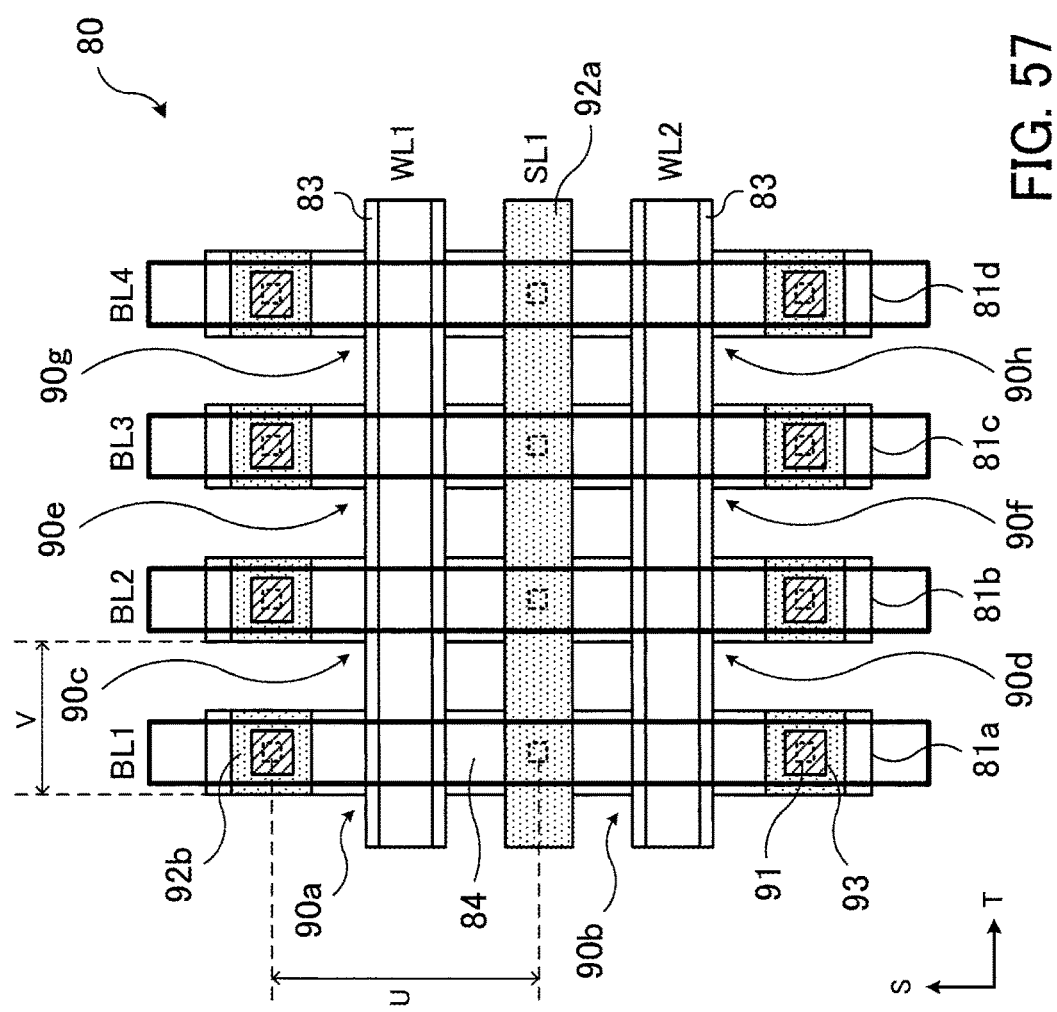
FIG. 57 illustrates an example of the nonvolatile memory using the memory transistor with the SCR layer.

FIG. 57 illustrates an example of the nonvolatile memory using the memory transistor with the SCR layer. FIG. 57 schematically illustrates an exemplary planar layout of a main portion of the nonvolatile memory using the memory transistor with the SCR layer.

A nonvolatile memory 80 (semiconductor device) illustrated in FIG. 57 includes, as an element region (element region of the semiconductor substrate 2 of FIG. 46), a plurality of (e.g., four) active regions 81a, 81b, 81c, and 81d which extends in the direction S and is arranged in parallel in the direction T perpendicular to the direction S. The word lines WL1, WL2 (corresponding to the gate electrode 42 of FIG. 46) extend via a non-illustrated gate insulating film (corresponding to the gate insulating film 41 of FIG. 46) in the direction T so as to traverse these active regions 81a, 81b, 81c, and 81d. A sidewall insulating film 83 (corresponding to the sidewall insulating film 43 of FIG. 46) is formed on the sidewall of the word lines WL1 and WL2. An impurity region (corresponding to the impurity regions 44a and 44b of FIG. 46) which functions as the SD region is formed respectively on both sides of the word lines WL1 and WL2 of each of the active regions 81a, 81b, 81c, and 81d. A non-illustrated LDD region (corresponding to the impurity regions 45a and 45b of FIG. 46) is formed under the sidewall insulating film 83 and on the inner side of the impurity region 84, and a non-illustrated channel region is formed between the LDD regions. Moreover, a non-illustrated impurity region serving as the SCR layer is formed below the channel region. The nonvolatile memory 80 includes a plurality of (e.g., eight) memory transistors 90a, 90b, 90c, 90d, 90e, 90f, 90g, and 90h (corresponding to the memory transistor 40C of FIG. 46) that is formed from these elements.

A plug 91 (contact) extending toward the upper layer is formed on each impurity region 84. Each impurity region 84 is connected, via the plug 91, to the wirings 92a and 92b included in the first conductive layer.

The wiring 92a extends in the direction T. The wiring 92a is connected, via the plug 91, to the impurity region 84 shared by the memory transistors 90a and 90b of the active region 81a. The wiring 92a is connected, via the plug 91, to the impurity region 84 shared by the memory transistors 90c and 90d of the active region 81b. The wiring 92a is connected, via the plug 91, to the impurity region 84 shared by the memory transistors 90e and 90f of the active region 81c. The wiring 92a is connected, via the plug 91, to the impurity region 84 shared by the memory transistors 90g and 90h of the active region 81d. The wiring 92a is used as the source line (SL1).

The wiring 92b is connected, via the plug 91, to the impurity region 84 on the opposite side of the impurity region 84 connected to the source line SL1 of each of the memory transistors 90a, 90b, 90c, 90d, 90e, 90f, 90g, and 90h.

A via 93 extending toward the upper layer is formed on each wiring 92b. The wiring 92b connected to the impurity region 84 of the transistors 90a and 90b of the active region 81a is connected, via the via 93, to the bit line BL1 which extends in the direction S. The wiring 92b connected to the impurity region 84 of the transistors 90c and 90d of the active region 81b is connected, via the via 93, to the bit line BL2 which extends in the direction S. The wiring 92b connected to the impurity region 84 of the transistors 90e and 90f of the active region 81c is connected, via the via 93, to the bit line BL3 which extends in the direction S. The wiring 92b connected to the impurity region 84 of the transistors 90g and 90h of the active region 81d is connected, via the via 93, to the bit line BL4 which extends in the direction S. The bit lines BL1, BL2, BL3, and BL4 are included in the second conductive layer of the nonvolatile memory 80.

In the nonvolatile memory 80, the individual memory transistors 90a, 90b, 90c, 90d, 90e, 90f, 90g, and 90h function as one memory cell. An example of each of the programming, reading, and erasing operations of information in the nonvolatile memory 80 will be specifically described with reference to FIGS. 58A and 58B, FIGS. 59A and 59B, and FIGS. 60A and 60B. Note that, here, the nonvolatile memory 80 provided with the n-channel memory transistors 90a, 90b, 90c, 90d, 90e, 90f, 90g, and 90h is taken as an example.

Figure 58A:
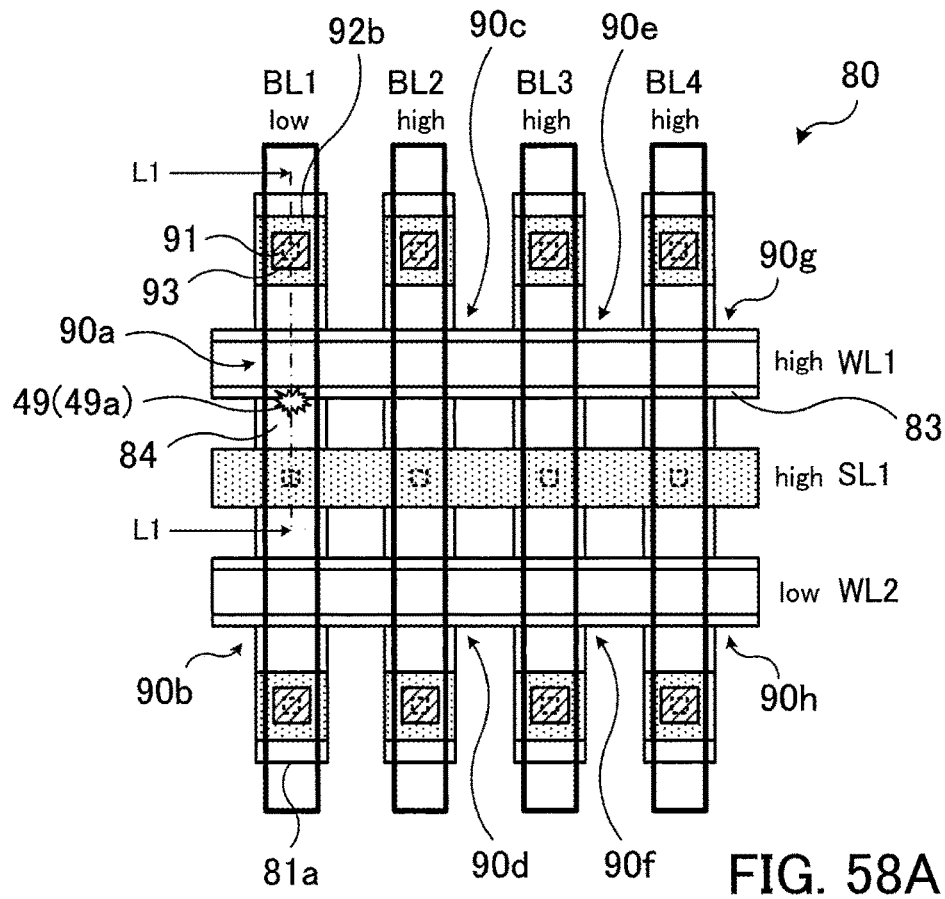
FIGS. 58A and 58B are explanatory views of the programming operation of the nonvolatile memory using the memory transistor with the SCR layer.
Figure 58B:
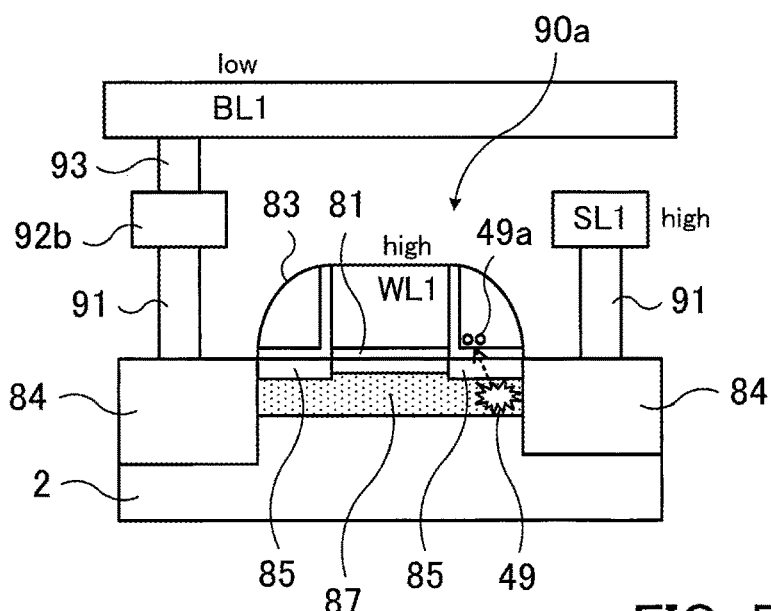

FIGS. 58A and 58B are explanatory views of the programming operation of the nonvolatile memory using the memory transistor with the SCR layer. FIG. 58A schematically illustrates a planar layout of a main portion of the nonvolatile memory during the programming operation, while FIG. 58B schematically illustrates a cross section of the main portion of the nonvolatile memory during the programming operation. Note that, FIG. 58B is a cross sectional schematic view along a line L1-L1 of FIG. 58A.

For example, during the programming operation with respect to the memory transistor 90a (memory cell) with the impurity region 87 serving as the SCR layer, the potential of the word line WL1 on the gate insulating film 81 is set to a high level (4 V to 5 V), the potential of the bit line BL1 is set to a low level (0 V), and the potential of the source line SL1 is set to a high level (4 V to 5 V). The potential of the unselected word line WL2 is set to a low level (0 V), and the potential of the unselected bit lines BL2 to BL4 is set to a high level (4 V to 5 V). Thus, the hot electrons (hot carriers 49, electric charges 49a) are injected and accumulated into the sidewall insulating film 83 above the LDD region 85 on the source line SL1 side of the memory transistor 90a, thereby performing the programming of information.

Because the LDD region 85 of the memory transistor 90a is in a very low concentration, the electric field of the LDD region 85 is relatively small. On the other hand, because the impurity region 84 which is the SD region adjacent to the outside of the LDD region 85 is in a high concentration, the electric field abruptly increases at an edge of the impurity region 84. As the result, the hot electrons are efficiently generated in the vicinity of the impurity region 84 (drain) on the source line SL1 side, and the generated hot electros are efficiently injected into the sidewall insulating film 83 above the LDD region 85 on the source line SL1 side.

Figure 59A:
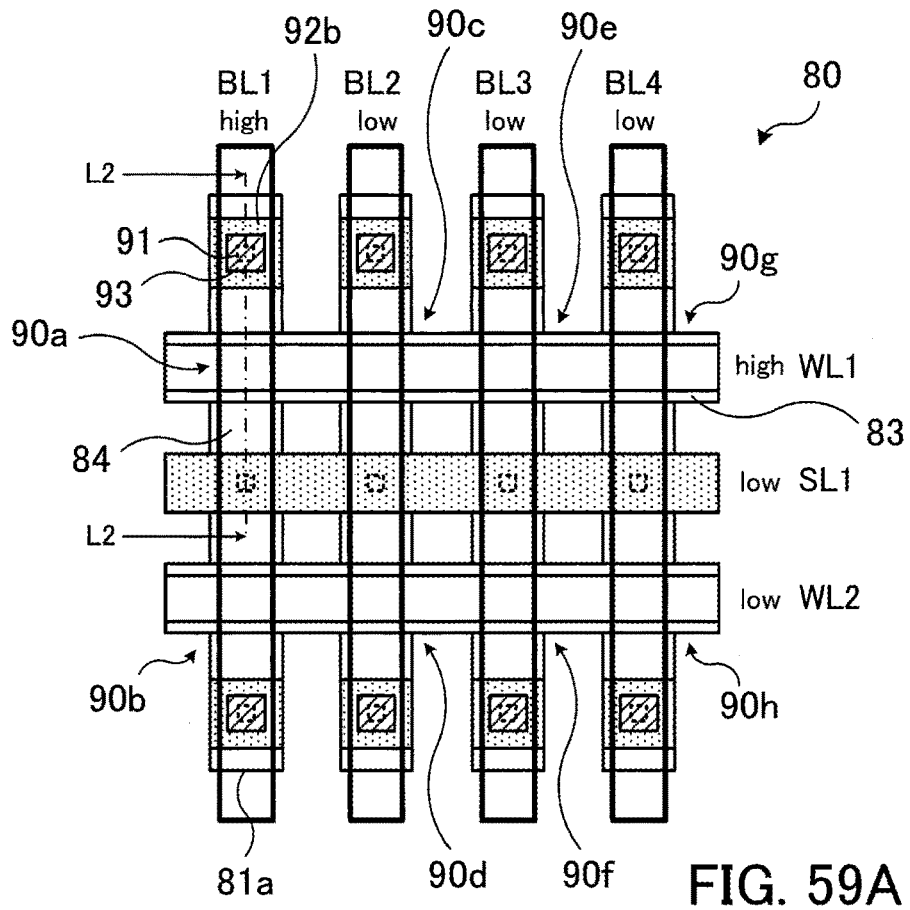
FIGS. 59A and 59B are explanatory views of the reading operation of the nonvolatile memory using the memory transistor with the SCR layer.
Figure 59B:
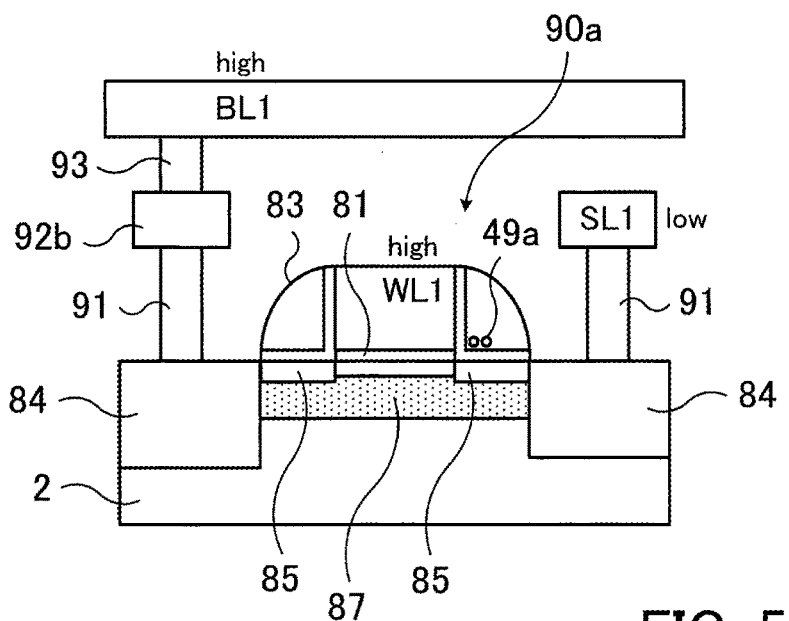

FIGS. 59A and 59B are explanatory views of the reading operation of the nonvolatile memory using the memory transistor with the SCR layer. FIG. 59A schematically illustrates a planar layout of a main portion of the nonvolatile memory during the reading operation, while FIG. 59B schematically illustrates a cross section of the main portion of the nonvolatile memory during the reading operation. Note that, FIG. 59B is the cross sectional schematic view along a line L2-L2 of FIG. 59A.

During the reading operation with respect to the memory transistor 90a, the potential of the word line WL1 is set to a high level (0.5 V), the potential of the bit line BL1 is set to a high level (0.5 V), and the potential of the source line SL1 is set to a low level (0 V). The potential of the unselected word line WL2 is set to a low level (0 V), and the potential of the unselected bit lines BL2 to BL4 is set to a low level (0 V). Note that, FIGS. 59A and 59B illustrate the memory transistor 90a in which the electric charges 49a are injected and accumulated into the sidewall insulating film 83. The reading of information of the memory transistor 90a is performed by detecting a current which flows from the bit line BL1 side to the source line SL1 side when such potentials are set.

Figure 60A:
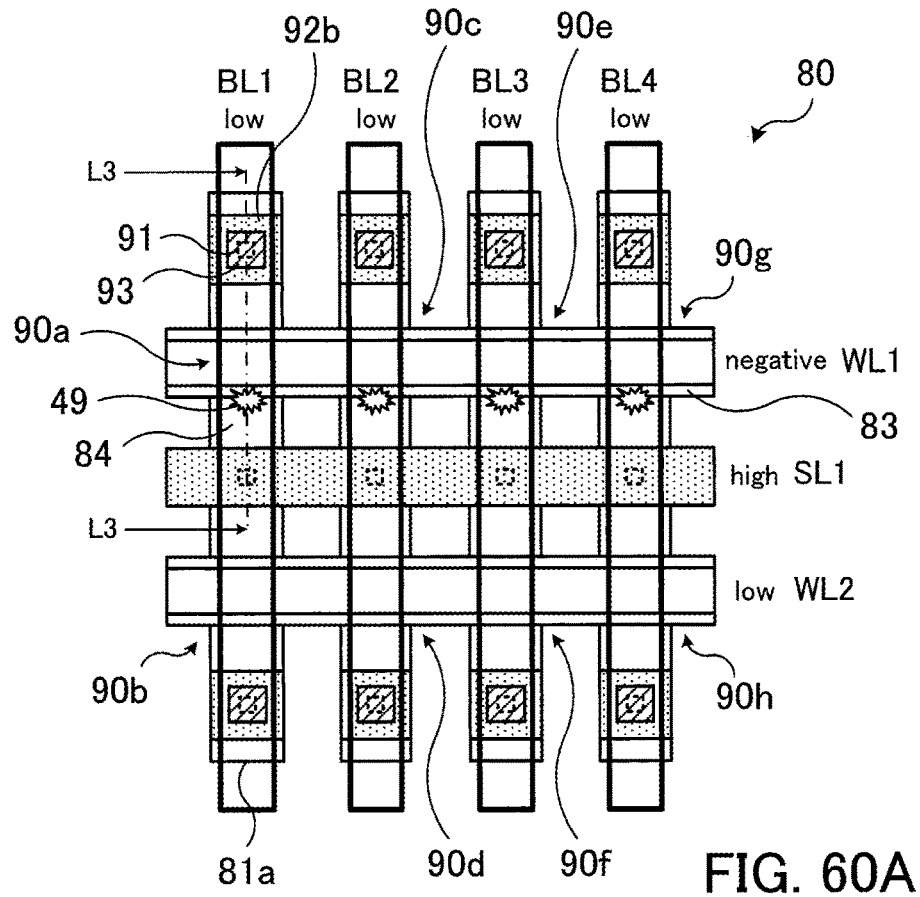
FIGS. 60A and 60B are explanatory views of the erasing operation of the nonvolatile memory using the memory transistor with the SCR layer.
Figure 60B:
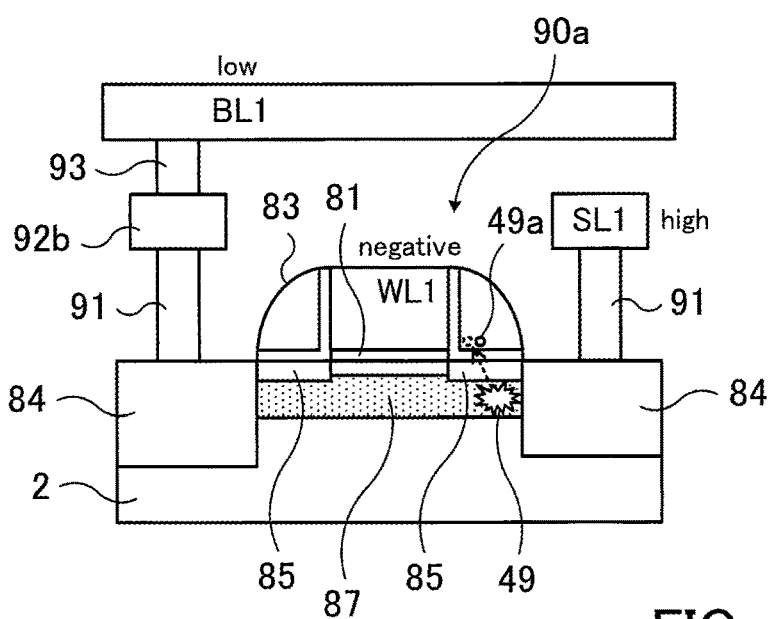

FIGS. 60A and 60B are explanatory views of the erasing operation of the nonvolatile memory using the memory transistor with the SCR layer. FIG. 60A schematically illustrates a planar layout of a main portion of the nonvolatile memory during the erasing operation, while FIG. 60B schematically illustrates a cross section of the main portion of the nonvolatile memory during the erasing operation. Note that, FIG. 60B is the cross sectional schematic view along a line L3-L3 of FIG. 60A.

During the erasing operation with respect to the memory transistor 90a, first the programming operation as described above is performed on the memory transistors 90a, 90c, 90e, and 90g connected to the word line WL1 (not illustrated). After the memory transistors 90a, 90c, 90e, and 90g are set to a programmed state, the potential of the word line WL1 is set to negative (−5 V to −6 V), the potential of the bit lines BL1 to BL4 is set to a low level (0 V), and the potential of the source line SL1 is set to a high level (5 V to 6 V). The potential of the unselected word line WL2 is set to a low level (0 V). Thus, erasing of the information, which has been programmed into the memory transistors 90a, 90c, 90e, and 90g connected to the word line WL1, is performed.

During the erasing operation, the hot holes (hot carriers 49) are generated in the vicinity of the impurity region 84 on the source line SL1 side to neutralize the electrons (electric charges 49a) accumulated in the sidewall insulating film 83 above the LDD region 85 on the source line SL1 side. Because the hot holes are generated in the vicinity of the impurity region 84 on the source line SL1 side, the influence on the threshold voltage in regions away from the impurity region 84 is reduced. Accordingly, unless a gate length Lg of the word line WL1 is excessively reduced, the threshold voltage as a whole is positive, i.e., the off-current of the memory transistor 90a will not significantly exceed the initial value.

Note that, in a floating gate type memory transistor, if the erasing time is extended, an over-erasing problem will occur in which the threshold voltage becomes negative, but in a memory transistor with the SCR layer as described above, such a problem may be avoided unless the gate length Lg is set excessively small.

In the nonvolatile memory 80 in which each of the programming, reading, and erasing operations may be performed in a manner described above, a reduction in the area of the memory region may be achieved as compared with the twin-bit cell type nonvolatile memory 60 described above. Here, we will focus on one memory cell, e.g., the memory transistor 90a, in the nonvolatile memory 80 illustrated in FIG. 57.

In the direction S of the memory transistor 90a, assume that the size (gate length Lg) of the word line WL1 is 0.06 μm, a half-size of each of the source line SL1 and wiring 92b connected to the plug 91 is 0.04 μm, and the size between the word line WL1 and each of the source line SL1 and wiring 92b is 0.07 μm. In this case, the size U in the direction S of the memory transistor 90a results in 0.28 μm (=0.06 μm+0.04 μm×2+0.07 μm×2).

In the direction T of the memory transistor 90a, if the width and pitch of the wiring 92b is assumed to be 0.18 μm in total, a size V in the direction T of the memory transistor 90a results in 0.18 μm.

Accordingly, the area of one memory cell of the nonvolatile memory 80 results in 0.0504 μm² (=0.28 μm×0.18 μm). The same goes for the other memory cells. For example, in the case of the 1M bit nonvolatile memory 80, a total area of the memory region is 0.402 mm², the area of a whole memory macro (including a logic region, an I/O region, and the like in addition to the memory region) is 1.34 mm², and thus the occupation ratio of the memory region is 30%. In the nonvolatile memory 80, the area of the memory region may be reduced to one third as compared with the twin-bit cell type nonvolatile memory 60.

An example of the configuration of and method for manufacturing a nonvolatile memory using the memory transistor 40C (90a or the like) will be further described with reference to FIGS. 61 to 65.

Figure 61:
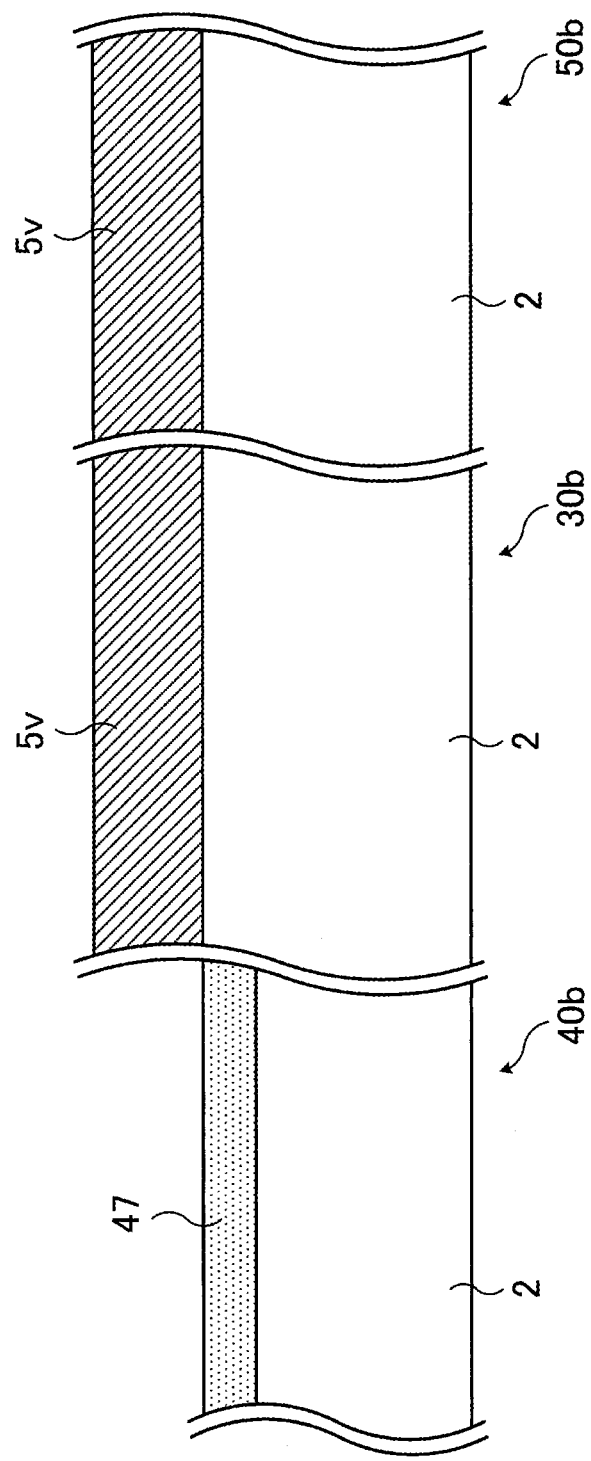
FIG. 61 is a view (part 1) illustrating an example of the method for manufacturing the nonvolatile memory.
Figure 62:
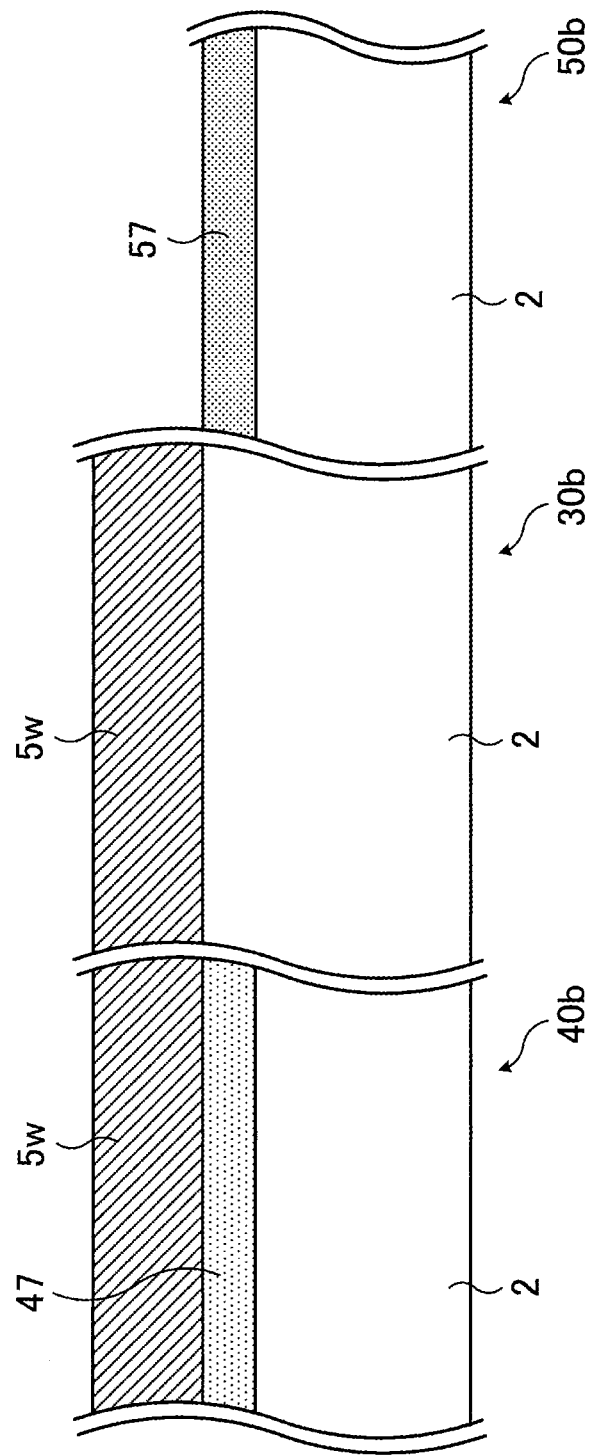
FIG. 62 is a view (part 2) illustrating an example of the method for manufacturing the nonvolatile memory.
Figure 65:
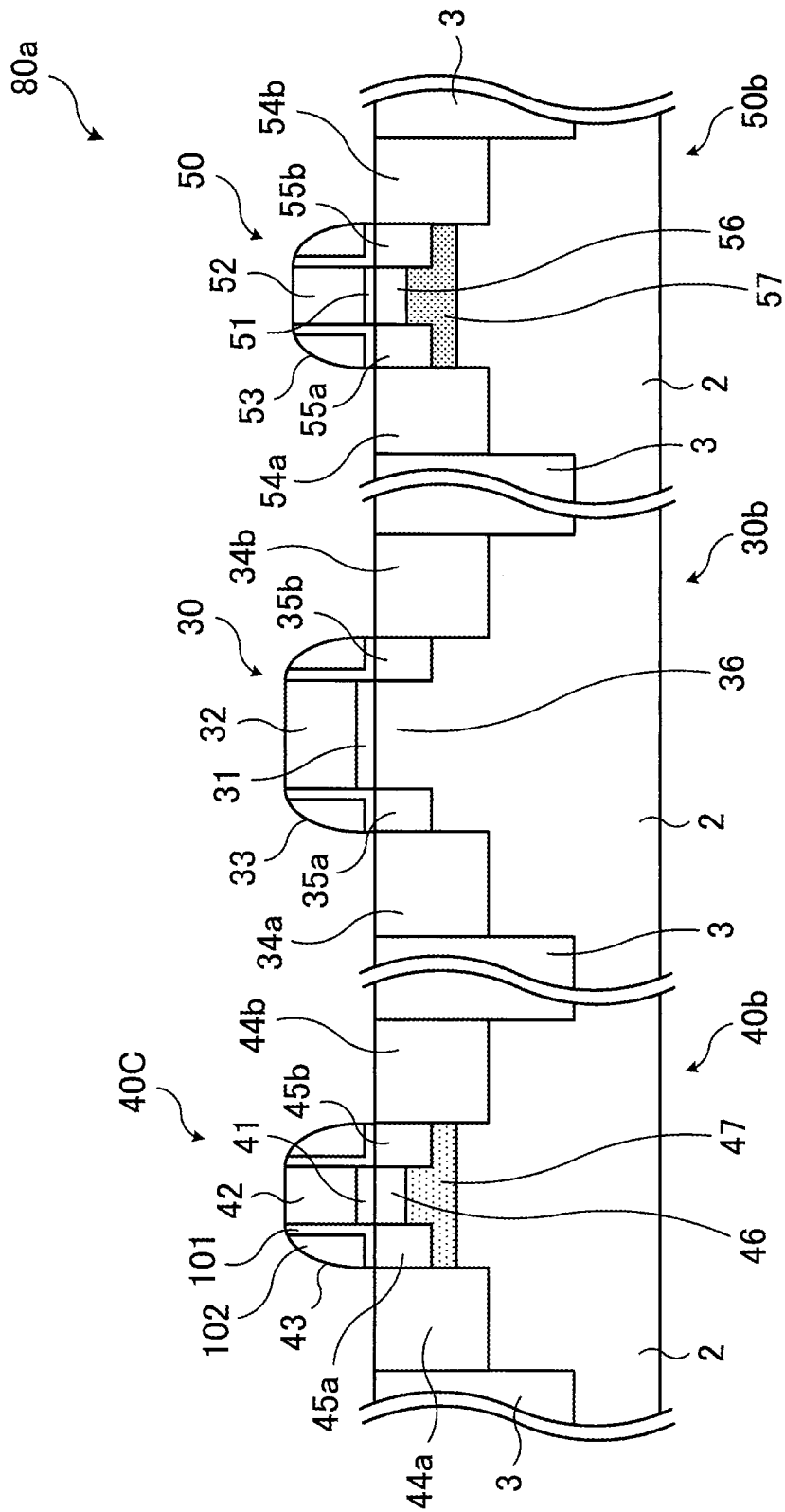
FIG. 65 is a view (part 5) illustrating an example of the method for manufacturing the nonvolatile memory.

FIGS. 61 to 65 illustrate an example of the method for manufacturing the nonvolatile memory. Here, FIG. is an exemplary cross sectional schematic view of a main portion in the first manufacturing step, FIG. 62 is an exemplary cross sectional schematic view of the main portion in the second manufacturing step, FIG. 63 is an exemplary cross sectional schematic view of the main portion in the third manufacturing step, FIG. 64 is an exemplary cross sectional schematic view of the main portion in the fourth manufacturing step, and FIG. 65 is an exemplary cross sectional schematic view of the main portion in the fifth manufacturing step. Hereinafter, an example of the steps of manufacturing the nonvolatile memory will be sequentially described with reference to FIGS. 61 to 65.

First, as illustrated in FIG. 61, a resist pattern 5v, in which an element region 40b of the memory transistor 40C (FIG. 65) is opened and an element region 50b of the logic transistor 50 (FIG. 65) and the element region 30b of the I/O transistor 30 (FIG. 65) are covered, is formed on the semiconductor substrate 2. With the resist pattern 5v used as a mask, a predetermined impurity implantation is performed on the semiconductor substrate 2 of the element region 40b. For example, germanium is implanted under the conditions: the accelerating energy of 30 keV and the dose amount of 5×10¹⁴ cm⁻². Carbon is implanted under the conditions: the accelerating energy of keV and the dose amount of 5×10¹⁴ cm⁻². Boron is implanted under the conditions: the accelerating energy of 20 keV and the dose amount of 4×10¹³ cm⁻². With these impurity implantations, the relatively-high concentration impurity region 47 (SCR layer) of the memory transistor 40C is formed.

Next, as illustrated in FIG. 62, a resist pattern 5w, in which the element region 50b of the logic transistor 50 is opened and the element region 40b of the memory transistor 40C and the element region 30b of the I/O transistor 30 are covered, is formed on the semiconductor substrate 2. With the resist pattern 5w used as a mask, a predetermined impurity implantation is performed on the semiconductor substrate 2 of the element region 50b. For example, germanium is implanted under the conditions: the accelerating energy of 30 keV and the dose amount of 5×10¹⁴ cm⁻². Carbon is implanted under the conditions: the accelerating energy of 5 keV and the dose amount of 5×10¹⁴ cm⁻². Boron is implanted under the conditions: the accelerating energy of 20 keV and the dose amount of 5×10¹² cm⁻². Boron fluoride is implanted under the conditions: the accelerating energy of 10 keV and the dose amount of 1.5×10¹² cm⁻². With the impurity implantation, the relatively-high concentration impurity region 57 (SCR layer) of the logic transistor 50 is formed.

Next, as illustrated in FIG. 63, a semiconductor material is epitaxially grown on the semiconductor substrate 2 to form a semiconductor layer 8c (non-doped layer) on the impurity region 47 of the element region 40b and on the impurity region 57 of the element region 50b. The channel region 46 of the memory transistor 40C and a channel region 56 of the logic transistor 50 are formed in the semiconductor layer 8c. Note that, although a semiconductor layer similar to the semiconductor layer 8c of the element region 40b and element region 50b is formed also in the element region 30b due to the epitaxial growth, the semiconductor layer will be described as the layer integrated into the semiconductor substrate 2 for convenience here. After formation of the semiconductor layer 8c, an element isolating region 3 is formed which defines the element region 40b, the element region 30b, and the element region 50b, as illustrated in FIG. 63.

Next, the impurity implantation for adjusting each threshold voltage of the I/O transistor 30 and the logic transistor 50 is performed on the semiconductor substrate 2 of the element region 30b and element region 50b. Subsequently, by thermal oxidation, as illustrated in FIG. 64, the gate insulating film 31, gate insulating film 41, and gate insulating film 51 each having a predetermined film thickness are formed in the element region 30b, in the element region 40b, and in the element region 50b, respectively. For example, the gate insulating film 31 and gate insulating film 41 each having the film thickness of 7 nm and the gate insulating film 51 having the film thickness of 1.5 nm are formed. Next, the gate electrode 32, gate electrode 42, and gate electrode 52 are formed by forming and patterning polysilicon.

Next, by the impurity implantation under a predetermined condition, as illustrated in FIG. 64, the LDD regions 45a and 45b, the LDD regions 35a and 35b, and the LDD regions 55a and 55b are formed. For example, phosphorus is implanted from four directions under the conditions: the accelerating energy of 35 keV, the dose amount of 2.5×10¹² cm⁻², and the tilt angle of 28°, to form the LDD regions 45a and 45b and LDD regions 35a and 35b. Arsenic is implanted two times under the conditions: the accelerating energy of 1.5 keV, the dose amount of 2.5×10¹⁴ cm⁻², and the tilt angle of 0°, to form the LDD regions 55a and 55b. Thus, the structure as illustrated in FIG. 64 is obtained. The channel region 36 of the I/O transistor 30 is formed between the LDD regions 35a and 35b. The channel region 46 of the memory transistor 40C is formed between the LDD regions 45a and 45b. The channel region 56 of the logic transistor 50 is formed between the LDD regions 55a and 55b.

Next, by the formation and etchback of an insulating film, as illustrated in FIG. 65, the sidewall insulating film 33, sidewall insulating film 43, and sidewall insulating film 53 are formed on each sidewall of the gate electrode 32, gate electrode 42, and gate electrode 52. For example, an oxide film 101 of silicon oxide or the like having the film thickness of 5 nm and a nitride film 102 of silicon nitride or the like having the film thickness of 70 nm are sequentially formed and etched back, thereby forming the sidewall insulating film 33, sidewall insulating film 43, and sidewall insulating film 53. Note that, the oxide film 101 having a different film thickness may be adopted for the sidewall insulating film of the memory transistor 40C and for the sidewall insulating film 53 of the logic transistor 50. For example, the oxide film 101 of the sidewall insulating film 43 of the memory transistor 40C is made thinner than the oxide film 101 of the sidewall insulating film 53 of the logic transistor 50. Thus, in the memory transistor 40C, the injection efficiency of hot carriers into the nitride film 102 is improved and the programming speed is improved.

Next, by the impurity implantation under a predetermined condition, as illustrated in FIG. 65, the impurity regions 34a and 34b, impurity regions 44a and 44b, and impurity regions 54a and 54b each serving as the SD region of each of the I/O transistor 30, memory transistor 40C, and logic transistor 50 are formed. For example, phosphorus is implanted under the conditions: the accelerating energy of 8 keV and the dose amount of $1.2 \times 10^{16}$ $cm^{-2}$ to form the impurity regions 34a and 34b, impurity regions 44a and 44b, and impurity regions 54a and 54b.

With the above-described manufacturing steps, a nonvolatile memory 80a having the I/O transistor 30, memory transistor 40C, and logic transistor 50 mixedly mounted on the common semiconductor substrate 2 is obtained. Thereafter, the formation of an interlayer insulating film, the formation of a plug, and the formation of an upper wiring layer including the conductors, such as a wiring and a via, and the like are performed.

Another example of the configuration of and method for manufacturing a nonvolatile memory using the memory transistor 40C (90a, or the like) will be further described with reference to FIGS. 66 to 71.

Figure 66:
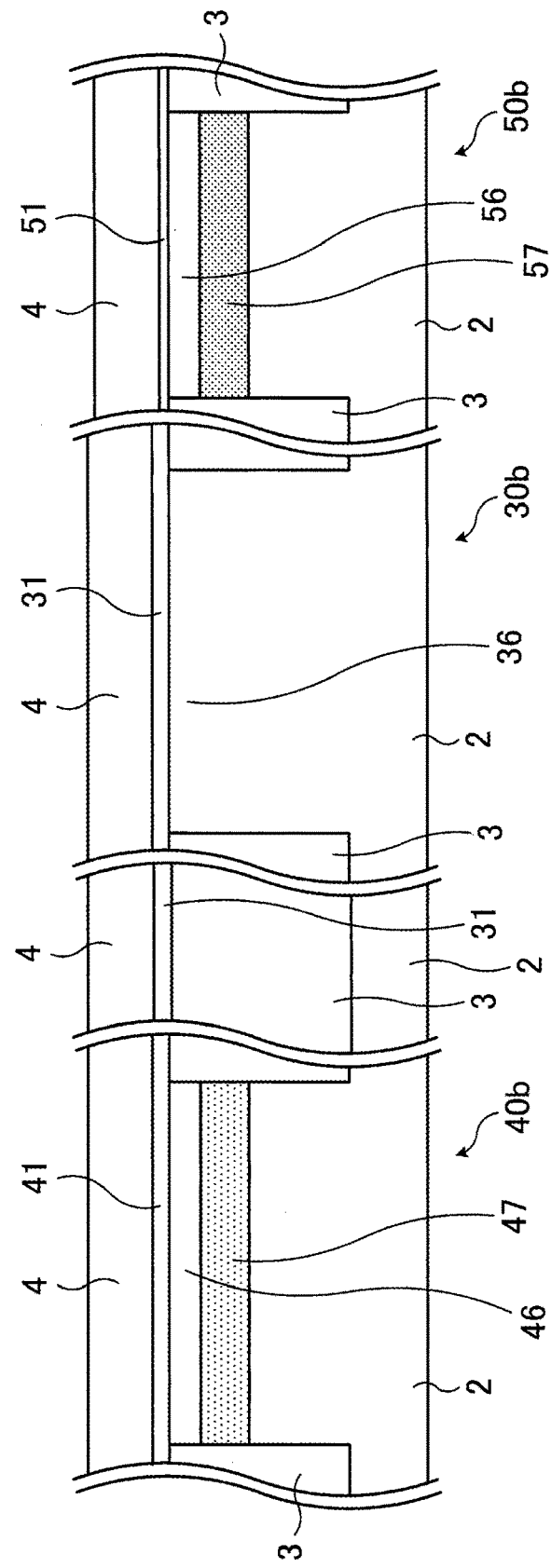
FIG. 66 is a view (part 1) illustrating another example of the method for manufacturing the nonvolatile memory.
Figure 67:
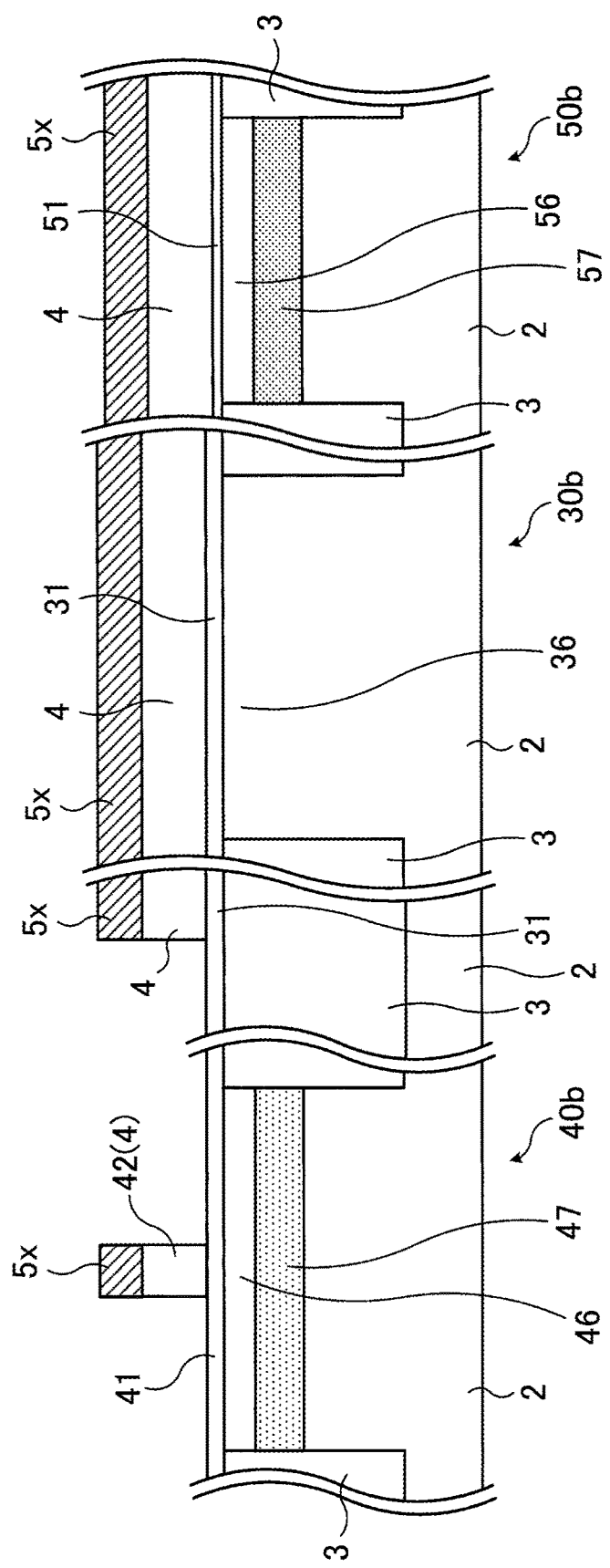
FIG. 67 is a view (part 2) illustrating another example of the method for manufacturing the nonvolatile memory.
Figure 68:
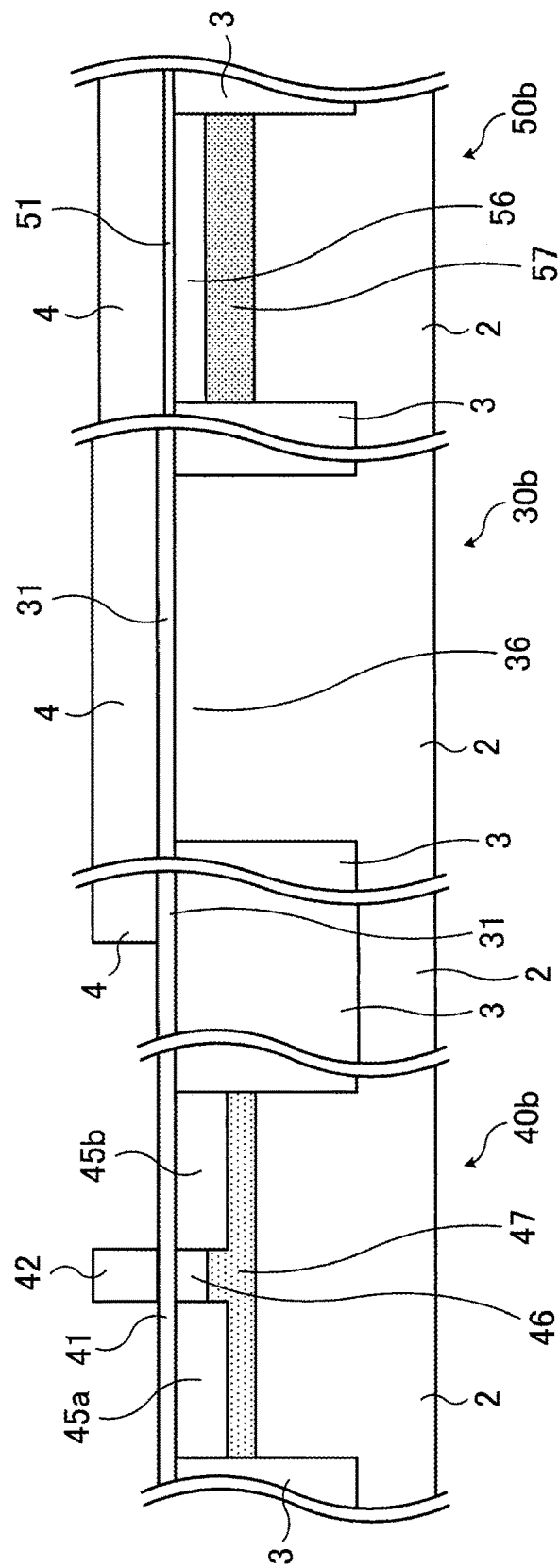
FIG. 68 is a view (part 3) illustrating another example of the method for manufacturing the nonvolatile memory.
Figure 69:
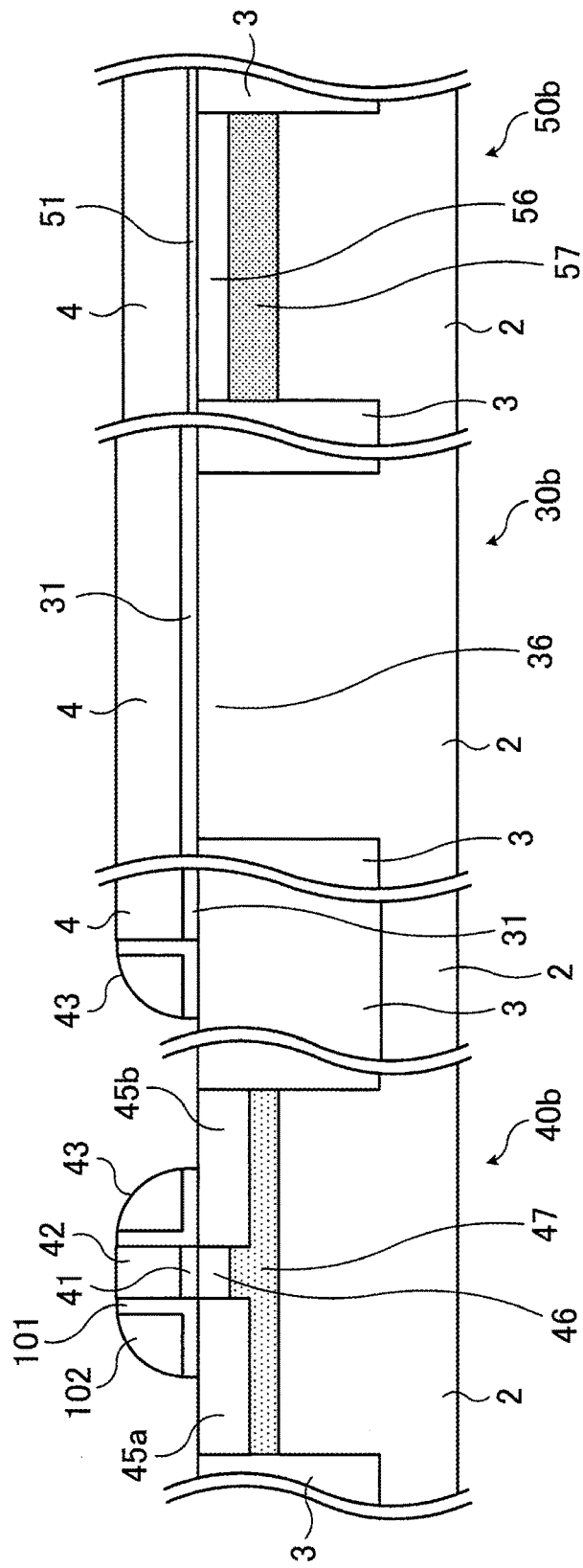
FIG. 69 is a view (part 4) illustrating another example of the method for manufacturing the nonvolatile memory.
Figure 70:
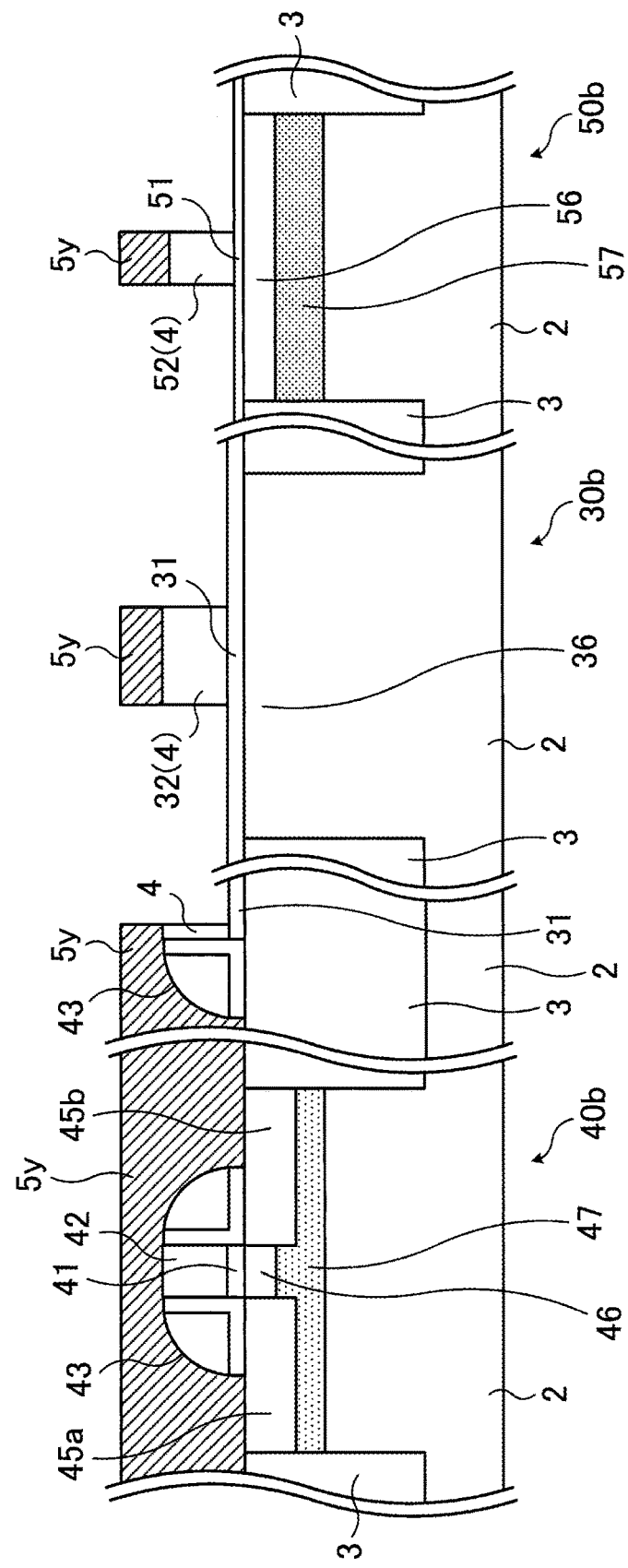
FIG. 70 is a view (part 5) illustrating another example of the method for manufacturing the nonvolatile memory.
Figure 71:
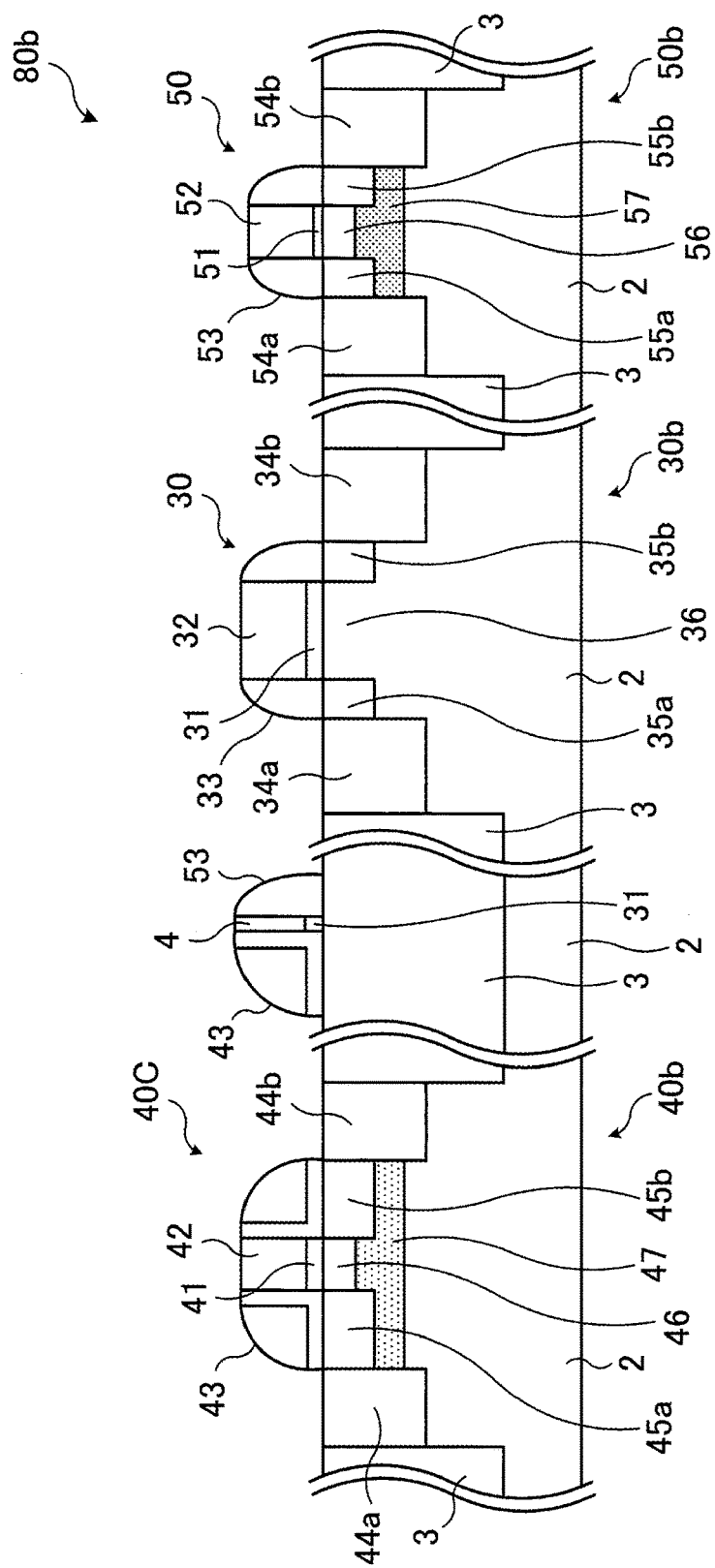
FIG. 71 is a view (part 6) illustrating another example of the method for manufacturing the nonvolatile memory.

FIGS. 66 to 71 illustrate another example of the method for manufacturing the nonvolatile memory. Here, FIG. 66 is an exemplary cross sectional schematic view of a main portion in the first manufacturing step, FIG. 67 is an exemplary cross sectional schematic view of the main portion in the second manufacturing step, FIG. 68 is an exemplary cross sectional schematic view of the main portion in the third manufacturing step, FIG. 69 is an exemplary cross sectional schematic view of the main portion in the fourth manufacturing step, FIG. 70 is an exemplary cross sectional schematic view of the main portion in the fifth manufacturing step, and FIG. 71 is an exemplary cross sectional schematic view of the main portion in the sixth manufacturing step. Hereinafter, an example of the steps of manufacturing the nonvolatile memory will be sequentially described with reference to FIGS. 66 to 71.

In this example, after the formation of the gate insulating film 31, gate insulating film 41, and gate insulating film 51 described in the steps of the above FIGS. 61 to 63 and the steps of the above FIG. 64, a polysilicon 4 is first formed as illustrated in FIG. 66.

Next, as illustrated in FIG. 67, a predetermined resist pattern 5x is formed on the polysilicon 4, and with the resist pattern 5x used as a mask, the polysilicon 4 is etched to form the gate electrode 42 of the memory transistor 40C.

Next, the resist pattern 5x is removed, and with the gate electrode 42 and polysilicon 4 remaining on the semiconductor substrate 2 used as a mask, a predetermined impurity implantation is performed on the semiconductor substrate 2 of the element region 40b to form the LDD regions 45a and 45b as illustrated in FIG. 68. For example, phosphorus is implanted from four directions under the conditions: the accelerating energy of 35 keV, the dose amount of $2.5 \times 10^{12}$ $cm^{-2}$, and the tilt angle of 28°, to form the LDD regions 45a and 45b. The channel region 46 of the memory transistor 40C is formed between the LDD regions 45a and 45b.

Next, by the formation and etchback of an insulating film, as illustrated in FIG. 69, the sidewall insulating film 43 is formed on the sidewall of the gate electrode 42. For example, an oxide film 101 of silicon oxide or the like having the film thickness of 5 nm and a nitride film 102 of silicon nitride or the like having the film thickness of 70 nm are sequentially formed and etched back, thereby forming the sidewall insulating film 43. Note that, the sidewall insulating film 43 is similarly formed also on the sidewall of the polysilicon 4 other than the gate electrode 42 and above the semiconductor substrate 2 (above the element isolating region 3).

Next, as illustrated in FIG. 70, a predetermined resist pattern 5y is formed, and with the resist pattern 5y used as a mask, the polysilicon 4 is etched to form the gate electrode 32 of the I/O transistor 30 and the gate electrode 52 of the logic transistor 50. Note that, FIG. 70 illustrates a form in which a part (edge) of the polysilicon 4 also remains on the element isolating region 3.

Next, by the impurity implantation under a predetermined condition, as illustrated in FIG. 71, the LDD regions 35a and 35b are formed in the element region 30b and the LDD regions 55a and 55b are formed in the element region 50b. The channel region 36 of the I/O transistor 30 is formed between the LDD regions 35a and 35b, and the channel region 56 of the logic transistor 50 is formed between the LDD regions 55a and 55b.

Next, by the formation and etchback of an insulating film, as illustrated in FIG. 71, the sidewall insulating film 33 and sidewall insulating film 53 are formed on each sidewall of the gate electrode 32 and gate electrode 52. The sidewall insulating film 33 and the sidewall insulating film 53 are formed so as to have a width that is smaller than the width of the sidewall insulating film 43 of the memory transistor 40C. Note that, the sidewall insulating film 53 (or 33) is similarly formed also on the sidewall of the polysilicon 4 remaining on the element isolating region 3. Next, by the impurity implantation under a predetermined condition, as illustrated in FIG. 71, the impurity regions 34a and 34b, impurity regions 44a and 44b, and impurity regions 54a and 54b each serving as the SD region of each of the I/O transistor 30, memory transistor 40C, and logic transistor 50 are formed.

With the above-described manufacturing steps, a nonvolatile memory 80b having the I/O transistor 30, memory transistor 40C, and logic transistor 50 mixedly mounted on the common semiconductor substrate 2 is obtained. Thereafter, the formation of an interlayer insulating film, the formation of a plug, and the formation of an upper wiring layer including the conductors, such as a wiring and a via, and the like are performed.

The width of the sidewall insulating film 43 of the memory transistor 40C is an important parameter which affects the transistor characteristics of the memory transistor 40C as described above. In the manufacturing method illustrated in FIGS. 66 to 71, the width of the sidewall insulating film 43 of the memory transistor 40C may be adjusted independently of the width of the sidewall insulating film 53 of the logic transistor 50.

Figure 72:
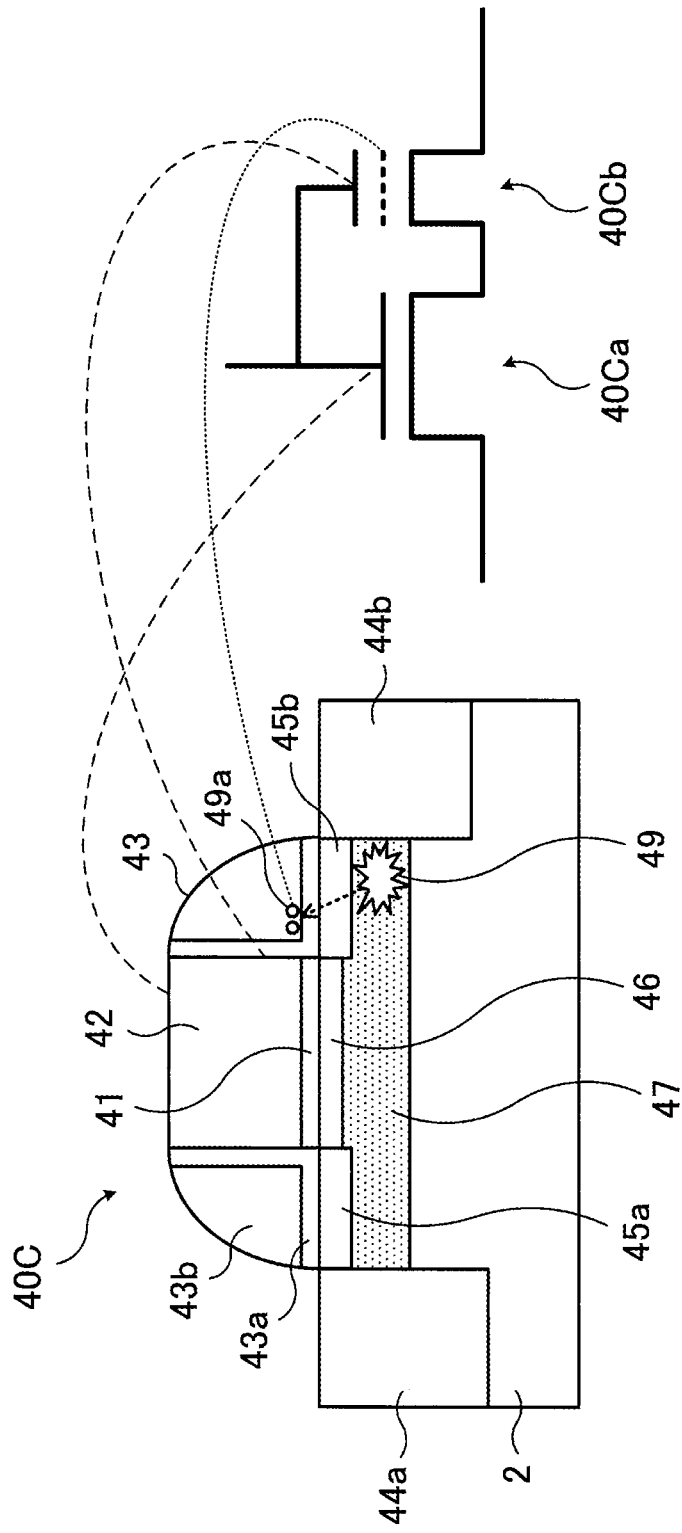
FIG. 72 is an explanatory view of the memory transistor with the SCR layer.

FIG. 72 is an explanatory view of the memory transistor with the SCR layer.

As described above, in the memory transistor 40C (90a or the like), the LDD regions 45a and 45b are formed by the impurity implantation into a non-doped layer or a very low concentration layer (semiconductor layer 8c to be epitaxially grown) below the sidewall insulating film 43. Therefore, the very low concentration LDD regions 45a and 45b are stably formed. For example, if the LDD regions 45a and 45b are formed so as to have a concentration equal to or less than $5\times10^{17}$ cm$^{-3}$, the LDD regions 45a and 45b hardly contribute to impact ionization. Therefore, for example, at an edge of the impurity region 44b (SD region) having a concentration higher than the LDD region 45b, the hot carriers 49 are generated and injected into the sidewall insulating film 43 above the impurity region 44b. If there is the electric charge 49a in the sidewall insulating film 43, the very low concentration LDD region 45b below the sidewall insulating film 43 is easily modulated and thus the threshold voltage of the memory transistor 40C will vary. Furthermore, because the conductivity type of the LDD regions 45a and 45b is determined, offsetting of the memory transistor 40C is also suppressed. Moreover, an improvement in the programming characteristics is achieved by adjusting the configuration (material, width, and the material, thickness, and the like of each layer of the stacked structure) of the sidewall insulating film 43.

The memory transistor 40C may have a configuration in which a transistor 40Cb with a SONGS (semiconductor substrate 2—oxide film 43a—nitride film 43b—oxide film 43a—gate electrode 42) structure is added to the side surface of a main body transistor 40Ca.

With the disclosed technique, a transistor exhibiting an excellent programming speed as a memory transistor and a semiconductor device including such a transistor may be realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A method for manufacturing a semiconductor device, comprising:
   forming a first impurity region in a first region of a semiconductor substrate;
   forming a second impurity region in a second region of the semiconductor substrate;
   forming a first channel region by an epitaxial growth above the first impurity region;
   forming an isolation film that separates the first region and the second region in the semiconductor substrate;
   forming a first gate insulating film above the first region;
   forming a second gate insulating film above the second region;
   forming a gate electrode film above the first gate insulating film and the second gate insulating film;
   forming a first gate electrode of the gate electrode film above the first region remaining the gate electrode film above the second region;
   forming a first sidewall insulating film on a sidewall of the first gate electrode and above the first region;
   forming a second gate electrode of the gate electrode film above the second region;
   forming a second sidewall insulating film on a sidewall of the second gate electrode and above the second region;
   forming a first source region and a first drain region on both sides of the first gate electrode above the first region; and
   forming a second source region and a second drain region on both sides of the second gate electrode above the second region,
   wherein:
   a first transistor includes the first impurity region, the first channel region, the first gate insulating film, the first gate electrode, the first sidewall insulating film, the first source region and the first drain region;
   a second transistor includes the second impurity region, the second gate insulating film, the second gate electrode, the second sidewall insulating film, the second source region and the second drain region;
   the first transistor stores information by accumulating charge in the first sidewall insulating film;
   the first impurity region includes a first impurity and a second impurity, the second impurity suppresses a diffusion of the first impurity, the first impurity includes at least Boron and the second impurity includes at least Germanium and Carbon; and
   a thickness of the first gate insulating film is larger than a thickness of the second gate insulating film.

2. The method according to claim 1, wherein an impurity concentration of the first impurity region is more than $1\times10^{18}$ cm$^{-3}$.

3. The method according to claim 1, further comprising:
   forming a third impurity region on an inner side of the first source region and the first drain region below the first sidewall insulating film,
   wherein:
   an impurity concentration of the third impurity region is lower than an impurity concentration of the first source region and the first drain region and is lower than an impurity concentration of the first impurity region.

4. The method according to claim 3, wherein:
   the first source region and the first drain region contain a third impurity of a first conductivity type;
   the third impurity region contains a fourth impurity of the first conductivity type; and
   the first impurity region contains a fifth impurity of a second conductivity type different from the first conductivity type.

5. The method according to claim 3, wherein the impurity concentration of the third impurity region is equal to or less than $5\times10^{17}$ cm$^{-3}$.

6. The method according to claim 3, wherein the impurity concentration of the first impurity region is more than $1 \times 10^{18}$ cm$^{-3}$.

7. The method according to claim 3, further comprising:
forming a fourth impurity region on an inner side of the second source region and the second drain region below the second sidewall insulating film,
wherein:
an impurity concentration of the fourth impurity region is lower than an impurity concentration of the second source region and the second drain region; and
the impurity concentration of the third impurity region is equal to or less than one tenth of the impurity concentration of the fourth impurity region.

8. The method according to claim 3, wherein the first impurity region contacts the third impurity region.

9. The method according to claim 1, further comprising:
forming a fifth impurity region below the first impurity region of the semiconductor substrate,
wherein an impurity concentration of the fifth impurity region is higher than an impurity concentration of the first channel region.

10. The method according to claim 1, wherein an impurity concentration of the first channel region is equal to or less than $1 \times 10^{17}$ cm$^{-3}$.

* * * * *